US012690441B2

(12) United States Patent (10) Patent No.: US 12,690,441 B2
Yanagigawa et al. (45) Date of Patent: Jul. 21, 2026

(54) SEMICONDUCTOR DEVICE AND METHOD OF MANUFACTURING THE SAME

(71) Applicant: Renesas Electronics Corporation, Tokyo (JP)

(72) Inventors: Hiroshi Yanagigawa, Tokyo (JP); Hideki Niwayama, Tokyo (JP); Hiroyoshi Kudou, Tokyo (JP); Kazuhisa Mori, Tokyo (JP); Kodai Wada, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 425 days.

(21) Appl. No.: 18/509,874

(22) Filed: Nov. 15, 2023

(65) Prior Publication Data

US 2024/0162143 A1    May 16, 2024

(30) Foreign Application Priority Data

Nov. 15, 2022    (JP) ................................. 2022-182556

(51) Int. Cl.
   H10W 20/42        (2026.01)
   H10D 30/01        (2025.01)
         (Continued)
(52) U.S. Cl.
   CPC ........ H10W 20/42 (2026.01); H10D 30/0297 (2025.01); H10D 30/668 (2025.01);
         (Continued)
(58) Field of Classification Search
   CPC . H10W 20/42; H10W 20/056; H10W 20/063; H10W 20/081; H10W 20/098;
         (Continued)

(56) References Cited

U.S. PATENT DOCUMENTS 6,319,812 B1    11/2001  Anma et al.
8,426,912 B2 *   4/2013  Izumi ................... H10D 62/114
                                                        257/334
(Continued)

FOREIGN PATENT DOCUMENTS

JP        2001-144286 A      5/2001
JP        2007-281195 A     10/2007
              (Continued)

OTHER PUBLICATIONS

Office Action dated Nov. 18, 2025, issued in corresponding Japanese Patent Application No. 2022-182556.

*Primary Examiner* — Theresa T Doan
(74) *Attorney, Agent, or Firm* — Rimon P.C.

(57)                    ABSTRACT

In a semiconductor substrate SUB, a trench TR is formed. A gate-electrode GE1 is formed inside the trench TR via a gate insulating film GI1. A body region PB, a well region PW1 and a well region NW1 are formed. A source-region NS is formed in the body-region PB. In the well region PW1, an n-type source region and an n-type drain region are formed. In the well region NW1, a p-type source region and a p-type drain region are formed. An interlayer insulating film IL1 is formed on the upper surface of semiconductor substrate SUB. In the interlayer insulating film IL1, a hole CH1 is formed in the source region NS and in the body region PB. Holes CH3 are formed in the interlayer insulating film IL1 so as to reach the n-type source region, the n-type drain region, the p-type source region and the p-type drain region.

20 Claims, 76 Drawing Sheets

(51) Int. Cl.
| | |
|---|---|
| *H10D 30/66* | (2025.01) |
| *H10D 84/83* | (2025.01) |
| *H10W 20/00* | (2026.01) |

(52) U.S. Cl.
CPC .......... *H10D 84/83* (2025.01); *H10W 20/056* (2026.01); *H10W 20/063* (2026.01); *H10W 20/081* (2026.01); *H10W 20/098* (2026.01)

(58) Field of Classification Search
CPC .............. H10W 72/59; H10W 20/435; H10D 30/0297; H10D 30/668; H10D 84/83; H10D 84/839
USPC ........................................................ 257/330
See application file for complete search history.

(56) References Cited

U.S. PATENT DOCUMENTS

| | | | |
|---|---|---|---|
| 8,723,295 | B2 | 5/2014 | Fukui et al. |
| 11,164,797 | B2 | 11/2021 | Toyoda |
| 2009/0102059 | A1 | 4/2009 | Ishii |
| 2009/0273027 | A1 | 11/2009 | Adan et al. |
| 2016/0013142 | A1 | 1/2016 | Maeda et al. |
| 2017/0288021 | A1* | 10/2017 | Kubo .................. H10D 62/393 |

FOREIGN PATENT DOCUMENTS

| | | | |
|---|---|---|---|
| JP | 2009-105160 | A | 5/2009 |
| JP | 2010-87133 | A | 4/2010 |
| JP | 2015-207787 | A | 11/2015 |
| JP | 2016-028410 | A | 2/2016 |
| JP | 2019-145537 | A | 8/2019 |

* cited by examiner

<FIRST EMBODIMENT>

*FIG. 55*

<EXAMINED EXAMPLE 1>

<EXAMINED EXAMPLE 1>

<FIRST EMBODIMENT>

*FIG. 59*

<EXAMINED EXAMPLE 1>

*FIG. 61*

<EXAMINED EXAMPLE 1>

<EXAMINED EXAMPLE 1>

FIG. 64

<EXAMINED EXAMPLE 2>

FIG. 65

<EXAMINED EXAMPLE 3>
1A

| | SLIT | HYDROGEN ALLOY TREATMENT |
|---|---|---|
| ☐ | NO | NO |
| △ | YES | NO |
| ○ | YES | YES |

*FIG. 71*

<SECOND EMBODIMENT>
1A

*FIG. 72*

<EXAMINED EXAMPLE 4>

SEMICONDUCTOR DEVICE AND METHOD OF MANUFACTURING THE SAME

CROSS-REFERENCE TO RELATED APPLICATIONS

The disclosure of Japanese Patent Application No. 2022-182556 filed on Nov. 15, 2022, including the specification, drawings and abstract is incorporated herein by reference in its entirety.

BACKGROUND

The present disclosure relates to a semiconductor device and method of manufacturing the same, and more particularly, to a semiconductor device and method of manufacturing the same having a trench gate-type MOSFET.

In a semiconductor device in which high withstand voltage is required, a semiconductor device such as a trench gate type MOSFET (Metal Oxide Semiconductor Field Effect Transistor) in which a gate electrode is buried in a trench is used. In addition, a semiconductor device has been developed in which a trench gate type MOSFET is used as an output circuit, and a planar type MOSFET is used as a control circuit for controlling a gate potential of the output circuit. Such a semiconductor device is called IPD (Intelligent Power Device).

As a form of semiconductor device constituting IPD, there is a semiconductor module in which a semiconductor chip for an outputting circuit and a semiconductor chip for controlling a control circuit are mounted as a single package. In another embodiment, MOSFET constituting the output circuit and the control circuit are formed in the same semiconductor substrate and are mixed in one semiconductor chip.

There are disclosed techniques listed below.

[Patent Document 1] Japanese Unexamined Patent Application Publication No. 2010-87133

[Patent Document 2] Japanese Unexamined Patent Application Publication No. 2019-145537

[Patent Document 3] Japanese Unexamined Patent Application Publication No. 2015-207787

For example, Patent Documents 1 to 3 disclose, as IPD, a semiconductor device in which MOSFET constituting an output circuit and a control circuit are formed in the same semiconductor substrate. Further, in IPD of Patent Document 1, a technique of forming a gate electrode of a trench gate type MOSFET and a gate electrode of a planar type MOSFET in separate manufacturing steps is disclosed.

SUMMARY

Forming MOSFET constituting the output circuit and the control circuit in the same semiconductor substrate is advantageous in terms of reduction in mounting cost and miniaturization of semiconductor device. However, in the trench gate type MOSFET for the output circuit and the planar type MOSFET for the control circuit, the device configuration is different, and the required properties are also different, so that the manufacturing process is easily complicated. Therefore, in the manufacturing process of the trench gate type MOSFET and the manufacturing process of the planar type MOSFET, there is a case where a defect that has not occurred separately occurs, and there is a problem that the reliability of semiconductor device is lowered and there is a problem that the yield is lowered.

A main object of the present disclosure is to provide a technique capable of improving the reliability of semiconductor device and suppressing a decrease in yield when a trench gate type MOSFET and a planar type MOSFET are formed in the same semiconductor substrate. Other objects and novel features will become apparent from the description of this specification and the accompanying drawings.

The typical ones of the embodiments disclosed in the present disclosure will be briefly described as follows.

A method of manufacturing a semiconductor device according to one embodiment is a method of manufacturing a semiconductor device having a first region in which a first MOSFET is formed and a second region in which a second MOSFET and a third MOSFET are formed. The method of manufacturing a semiconductor device comprises (a) preparing a semiconductor substrate of a first conductivity type having an upper surface, (b) in the first region, forming a trench having a depth on the upper surface of the semiconductor substrate, (c) forming a first gate insulating film inside the trench, (d) forming a first gate electrode so as to fill the inside of the trench via the first gate insulating film, (e) in the first region, forming a body region of a second conductivity type opposite to the first conductivity type in the semiconductor substrate close to the upper surface so as to be shallower than the depth of the trench, (f) in the second region, forming a second well region of the second conductivity type in the semiconductor substrate close to the upper surface, (g) in the second region, forming a third well region of the first conductivity type in the semiconductor substrate close to the upper surface, (h) forming a second gate insulating film on the second well region and forming a third gate insulating film on the third well region, (i) forming a second gate electrode on the second gate insulating film and forming a third gate electrode on the third gate insulating film, (j) in the body region, forming a first source region of the first conductivity type, (k) in the second well region, forming a second source region of the first conductivity type and a second drain region of the first conductivity type, (l) in the third well region, forming a third source region of the second conductivity type and a third drain region of the second conductivity type, (m) after the steps of (j), (k) and (l), forming an interlayer insulating film on the upper surface of the semiconductor substrate of the first region and the second region so as to cover the first gate electrode, the second gate electrode and the third gate electrode, (n) after the step (m), forming a first hole in the interlayer insulating film, in the first source region and in the body region so that a bottom portion of the first hole is located inside the body region, (o) after the step of (m), forming a plurality of third holes in the interlayer insulating film so as to reach the second source region, the second drain region, the third source region and the third drain region, and (p) after the steps of (n) and (o), forming plugs inside of each of the first hole and the plurality of third holes. The first MOSFET includes the first gate insulating film, the first gate electrode, the body region and the first source region. The second MOSFET includes the second gate insulating film, the second gate electrode, the second source region and the second drain region. The third MOSFET includes the third gate insulating film, the third gate electrode, the third source region and the third drain region. The steps of (n) and (o) are performed separately.

A semiconductor device according to one embodiment comprises a semiconductor substrate of a first conductivity type, having an upper surface, a first interlayer insulating film formed on the upper surface of the semiconductor substrate, a plurality of first plugs formed in the first interlayer insulating film, the plurality of first plugs being connected to a part of the semiconductor substrate, a first wiring formed on the first interlayer insulating film, the first wiring being connected to the plurality of first plugs, a second interlayer insulating film formed on the first inter- layer insulating film so as to cover the first wiring, a plurality of first vias formed in the second interlayer insulating film, the plurality of first vias being connected to the first wiring, a second wiring formed on the second interlayer insulating film, the second wiring being connected to the plurality of first vias, a third interlayer insulating film formed on the second interlayer insulating film so as to cover the second wiring, a plurality of second vias formed in the third interlayer insulating film, the plurality of second vias being connected to the second wiring, a third wiring formed on the third interlayer insulating film, the third wiring being con- nected to the plurality of second vias, a protective film formed on the third interlayer insulating film so as to cover the third wiring, and a first opening formed in the protective film on the third wiring so as to expose a part of the third wiring. A part of the third wiring exposed in the first opening composes a first pad for connecting to a first external connection member. At a position overlapping with the first pad in plan view, a plurality of first slits going through the first wiring is provided in the first wiring. At a position overlapping with the first pad in plan view, a plurality of second slits going through the second wiring is provided in the second wiring.

A method of manufacturing a semiconductor device according to one embodiment comprises (a) preparing a semiconductor substrate of a first conductivity type, having an upper surface, (b) forming a first interlayer insulating film on the upper surface of the semiconductor substrate, (c) forming a plurality of first plugs in the first interlayer insulating film so as to connect to a part of the semicon- ductor substrate, (d) forming a first wiring on the first interlayer insulating film so as to connect to the plurality of first plugs, (e) forming a second interlayer insulating film on the first interlayer insulating film so as to cover the first wiring, (f) forming a plurality of first vias in the second interlayer insulating film so as to connect to the first wiring, (g) forming a second wiring on the second interlayer insu- lating film so as to connect to the plurality of first vias, (h) forming a third interlayer insulating film on the second interlayer insulating film so as to cover the second wiring, (i) forming a plurality of second vias in the third interlayer insulating film so as to connect to the second wiring, (j) forming a third wiring on the third interlayer insulating film so as to connect to the plurality of second vias, (k) forming a protective film on the third interlayer insulating film so as to cover the third wiring, and (l) forming a first opening in the protective film on the third wiring so as to expose a part of the third wiring. A part of the third wiring exposed in the first opening composes a first pad for connecting to a first external connection member. At a position overlapping with the first pad in plan view, a plurality of first slits going through the first wiring is provided in the first wiring. At a position overlapping with the first pad in plan view, a plurality of second slits going through the second wiring is provided in the second wiring.

According to one embodiment, the reliability of semicon- ductor device can be improved, and a decrease in yield can be suppressed.

BRIEF DESCRIPTION OF THE DRAWINGS

FIG. 1 is a plan view showing a semiconductor device in first embodiment.

FIG. 8 is a cross-sectional view showing the manufactur- ing process of a semiconductor device in first embodiment.

FIG. 10 is a cross-sectional view showing the manufac- turing process of a semiconductor device following FIG. 8.

FIG. 11 is a cross-sectional view showing the manufac- turing process of a semiconductor device following FIG. 9.

FIG. 12 is a cross-sectional view showing the manufac- turing process of a semiconductor device following FIG. 10.

FIG. 13 is a cross-sectional view showing the manufac- turing process of a semiconductor device following FIG. 11.

FIG. 14 is a cross-sectional view showing the manufac- turing process of a semiconductor device following FIG. 12.

FIG. 15 is a cross-sectional view showing the manufac- turing process of a semiconductor device following FIG. 13.

FIG. 16 is a cross-sectional view showing the manufac- turing process of a semiconductor device following FIG. 14.

FIG. 17 is a cross-sectional view showing the manufac- turing process of a semiconductor device following FIG. 15.

FIG. 22 is a cross-sectional view showing the manufac- turing process of a semiconductor device following FIG. 20.

FIG. 23 is a cross-sectional view showing the manufac- turing process of a semiconductor device following FIG. 21.

FIG. 24 is a cross-sectional view showing the manufac- turing process of a semiconductor device following FIG. 22.

FIG. 25 is a cross-sectional view showing the manufac- turing process of a semiconductor device following FIG. 23.

FIG. 27 is a cross-sectional view showing the manufac- turing process of a semiconductor device following FIG. 25.

FIG. 29 is a cross-sectional view showing the manufac- turing process of a semiconductor device following FIG. 27.

FIG. 31 is a cross-sectional view showing the manufac- turing process of a semiconductor device following FIG. 29.

FIG. 32 is a cross-sectional view showing the manufac- turing process of a semiconductor device following FIG. 30.

FIG. 33 is a cross-sectional view showing the manufac- turing process of a semiconductor device following FIG. 31.

FIG. 35 is a cross-sectional view showing the manufacturing process of a semiconductor device following FIG. 33.

FIG. 36 is a cross-sectional view showing the manufacturing process of a semiconductor device following FIG. 34.

FIG. 38 is a cross-sectional view showing the manufacturing process of a semiconductor device following FIG. 36.

FIG. 40 is a cross-sectional view showing the manufacturing process of a semiconductor device following FIG. 38.

FIG. 41 is a cross-sectional view showing the manufacturing process of a semiconductor device following FIG. 39.

FIG. 42 is a cross-sectional view showing the manufacturing process of a semiconductor device following FIG. 40.

FIG. 43 is a cross-sectional view showing the manufacturing process of a semiconductor device following FIG. 41.

FIG. 44 is a cross-sectional view showing the manufacturing process of a semiconductor device following FIG. 42.

FIG. 45 is a cross-sectional view showing the manufacturing process of a semiconductor device following FIG. 43.

FIG. 46 is a cross-sectional view showing the manufacturing process of a semiconductor device following FIG. 44.

FIG. 47 is a cross-sectional view showing the manufacturing process of a semiconductor device following FIG. 45.

FIG. 49 is a cross-sectional view showing the manufacturing process of a semiconductor device following FIG. 47.

FIG. 51 is a cross-sectional view showing the manufacturing process of a semiconductor device following FIG. 49.

FIG. 52 is a cross-sectional view showing the manufacturing process of a semiconductor device following FIG. 50.

FIG. 54 is a main portion cross-sectional view showing the manufacturing process of a semiconductor device in first embodiment.

FIG. 55 is a main portion cross-sectional view showing the manufacturing process of a semiconductor device in examined example 1.

FIG. 59 is a main portion cross-sectional view showing a manufacturing process of a semiconductor device following FIG. 57.

FIG. 61 is a main portion cross-sectional view showing a manufacturing process of a semiconductor device following FIG. 59.

FIG. 62 is a main portion cross-sectional view showing a manufacturing process of a semiconductor device following FIG. 60.

FIG. 63 is a main portion cross-sectional view showing a manufacturing process of a semiconductor device following FIG. 61.

FIG. 64 is a main portion cross-sectional view showing the manufacturing process of a semiconductor device in examined example 2.

FIG. 65 is a main portion cross-sectional view showing the manufacturing process of a semiconductor device in examined example 3.

FIG. 71 is a main portion cross-sectional view showing the manufacturing process of a semiconductor device in second embodiment.

FIG. 72 is a main portion cross-sectional view showing the manufacturing process of a semiconductor device in examined example 4.

FIG. 74 is a main portion cross-sectional view showing a manufacturing process of a semiconductor device following FIG. 73.

FIG. 75 is a main portion cross-sectional view showing a manufacturing process of a semiconductor device following FIG. 74.

FIG. 76 is a main portion cross-sectional view showing a manufacturing process of a semiconductor device following FIG. 75.

DETAILED DESCRIPTION

Figure 2:
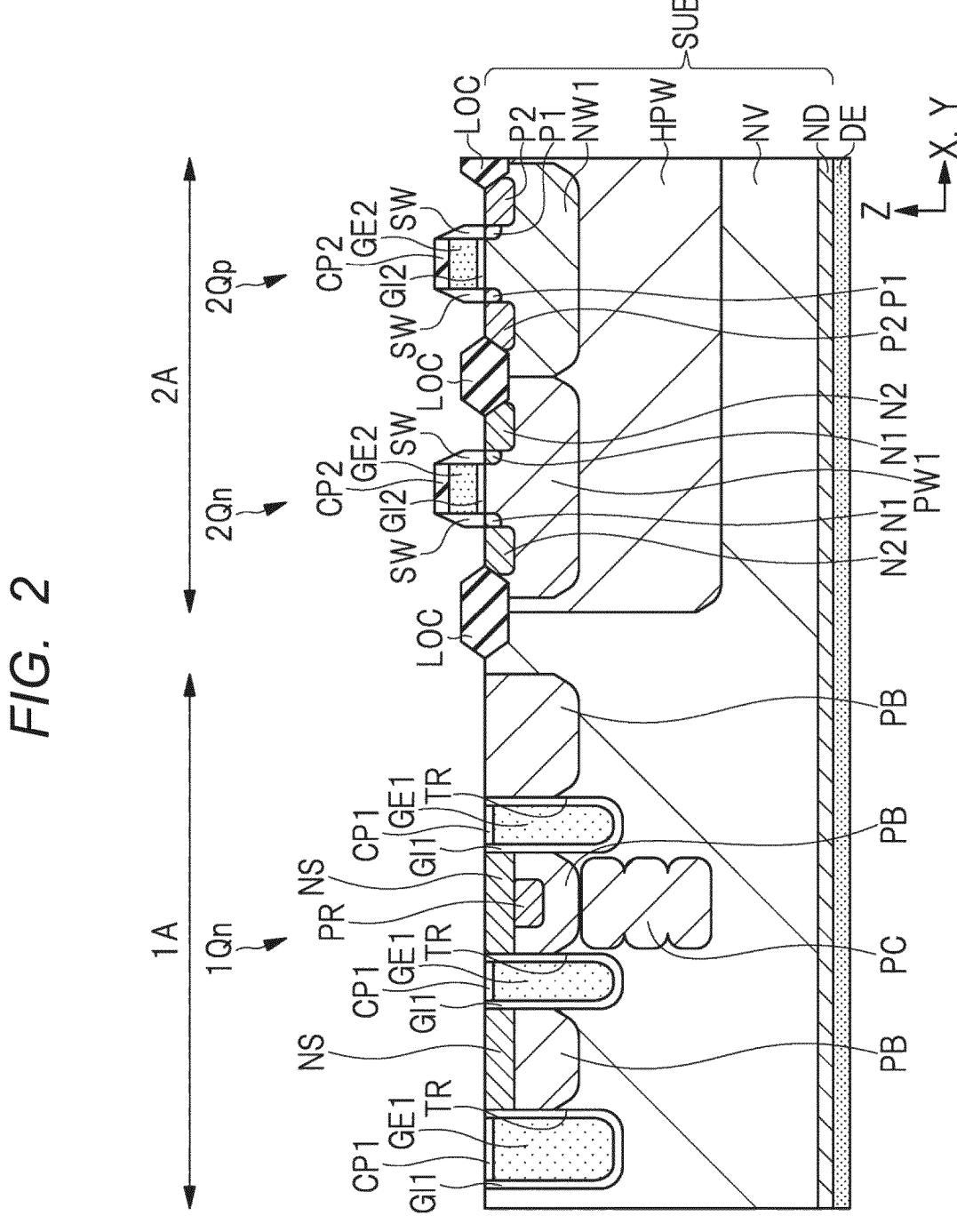
FIG. 2 is a cross-sectional view showing a semiconductor device in first embodiment.

In the following, embodiments will be explained in detail based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present disclosure intersect each other and are orthogonal to each other. In the present disclosure, the Z direction is described as an upper/lower direction, a height direction, or a thickness direction of a certain structure. In addition, the expression "plan view" used in the present disclosure means that the plane formed by the X direction and the Y direction is a "plane" and the "plane" is viewed from the Z direction.

First Embodiment

<Structure of Semiconductor Device>

Figure 1:
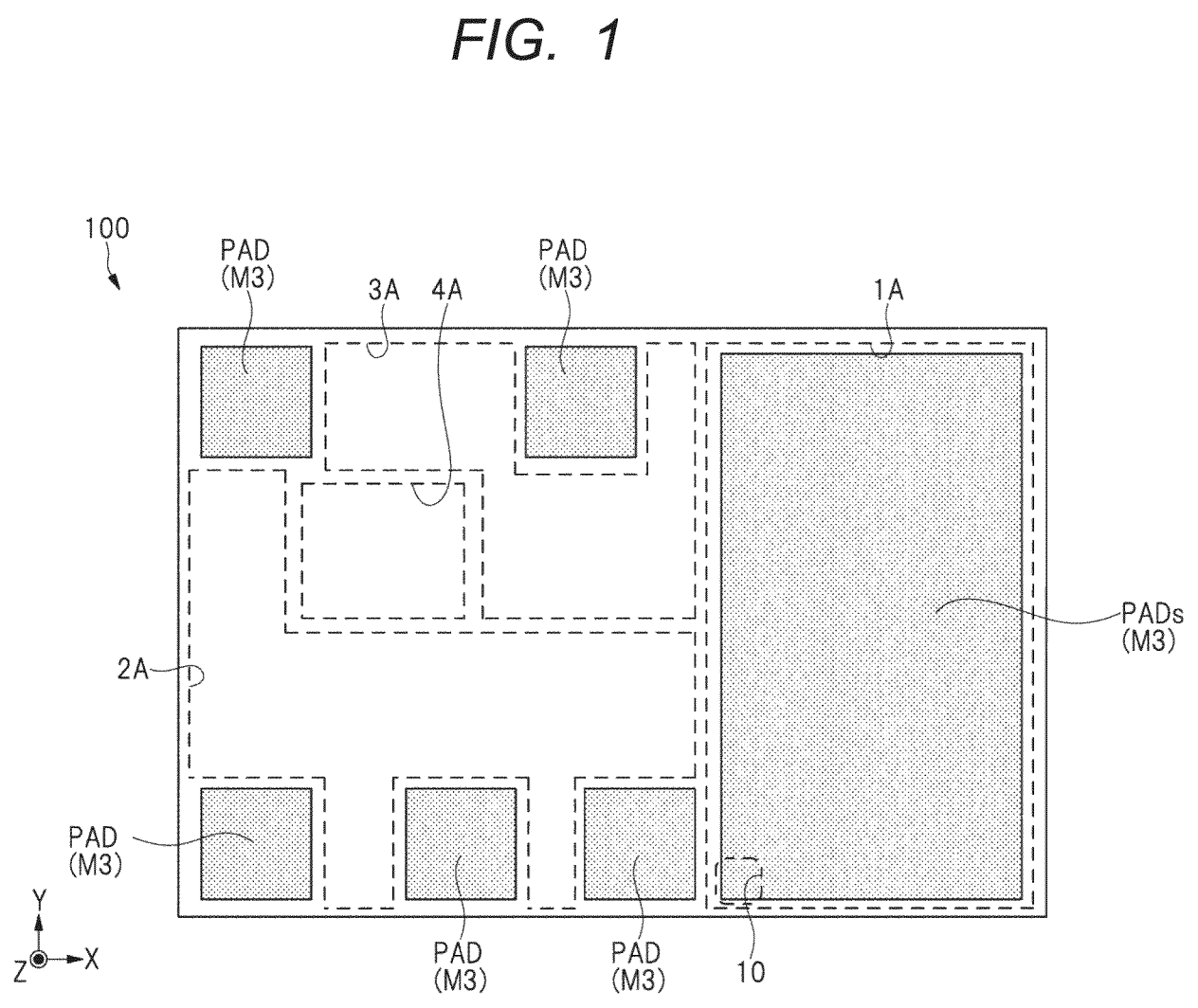

A semiconductor device 100 in first embodiment will be described below with reference to FIG. 1 to FIG. 7. A semiconductor device 100 is a semiconductor chip, IPD in which an output circuit for driving loads outside semiconductor device 100 and a control circuit for controlling the gate-potential of the output circuit are formed in the same semiconductor substrate SUB. The load is, for example, various electronic components mounted on a vehicle.

FIG. 1 is a plan view of a semiconductor-chip semiconductor device 100. As illustrated in FIG. 1, semiconductor device 100 includes a region 1A in which a MOSFET for an outputting circuit is formed, and regions 2A to 4A in which a semiconductor elements such as a MOSFET for a control circuit and a resistive element are formed. The layout of the area 2A to 4A is not limited to the example in FIG. 1, and can be freely designed as appropriate.

Also shown in FIG. 1 are a plurality of pads PAD and a source pad PADs that are part of the uppermost layer wiring M3. The source pad PADs is provided above the region 1A and serves as an output terminal of the output circuitry. The plurality of padding PAD are provided around the area 2A to 4A. Various types of signals and grounding potentials from the outside of semiconductor device 100 are transmitted to the control circuitry via a plurality of pads PAD.

Figure 4:
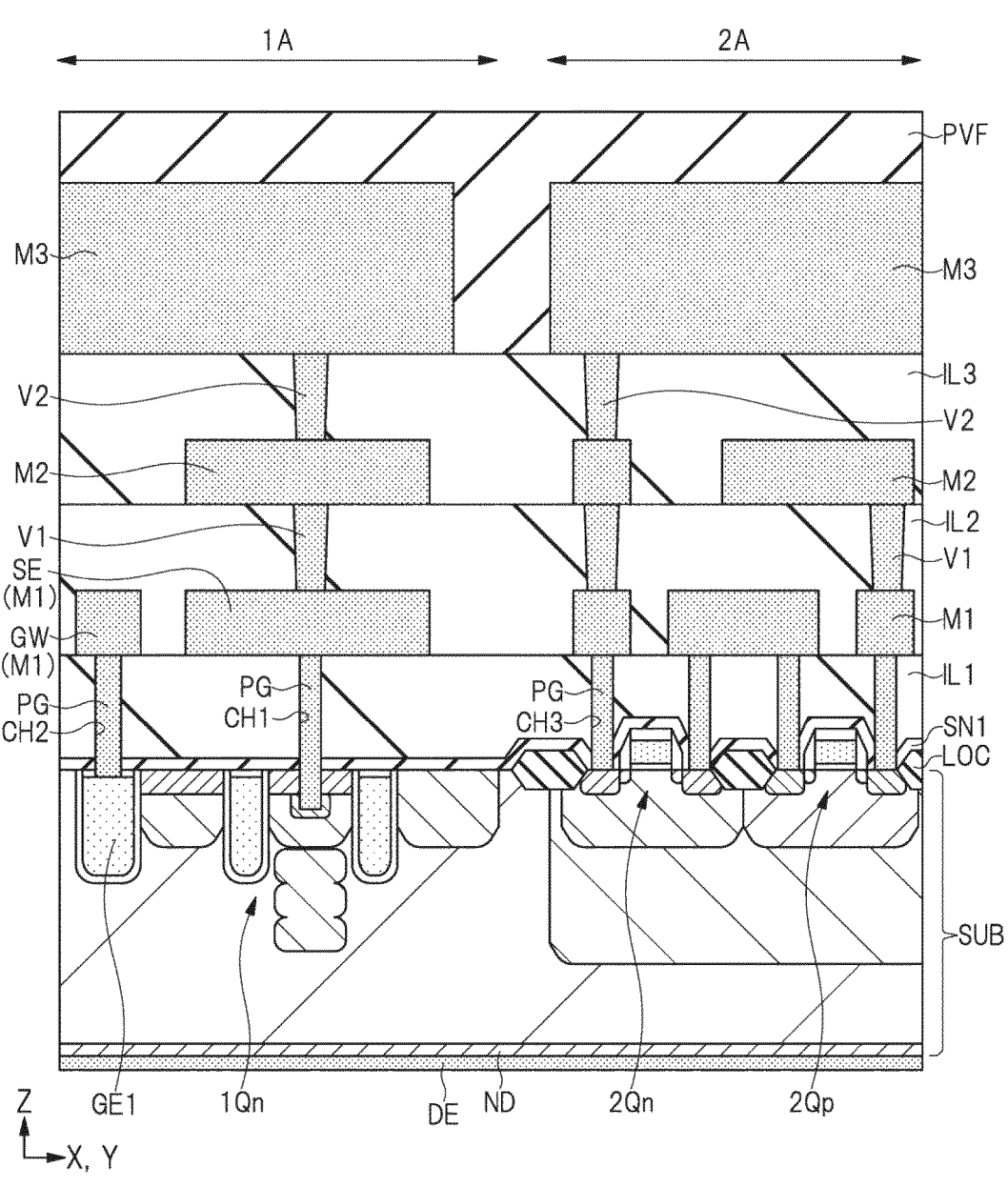
FIG. 4 is a cross-sectional view showing a semiconductor device in first embodiment.

FIG. 2 shows an n-type (n type) MOSFET1Qn formed in the region 1A and an n-type MOSFET2Qn and a p-type (p type) MOSFET2Qp formed in the region 2A. MOSFET1Qn is a trench gate type MOSFET, and MOSFET2Qn, 2Qp are planar type MOSFETs. FIG. 4 shows a wiring configuration formed above MOSFET1Qn, 2Qn, 2Qp.

Figure 3:
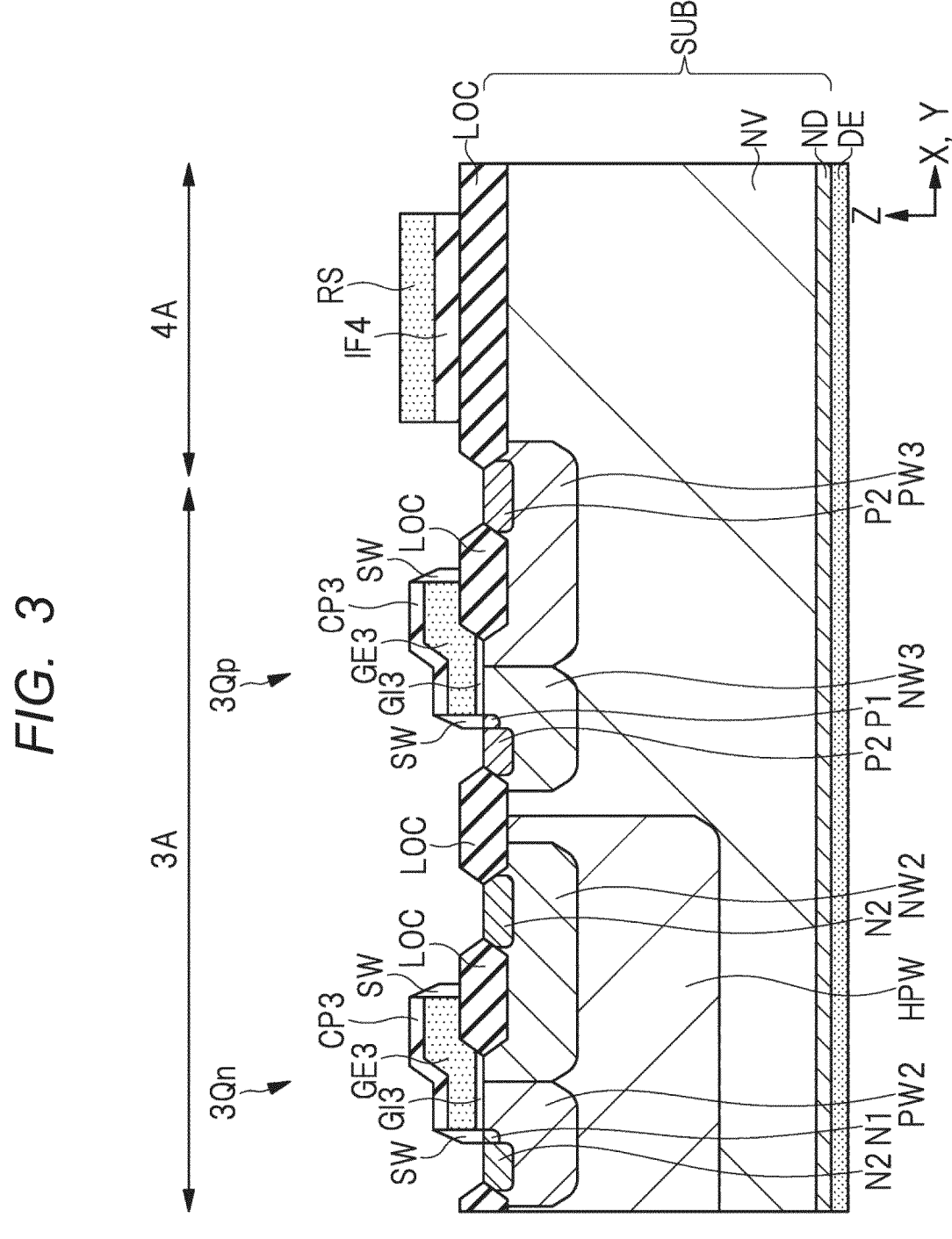
FIG. 3 is a cross-sectional view showing a semiconductor device in first embodiment.
Figure 5:
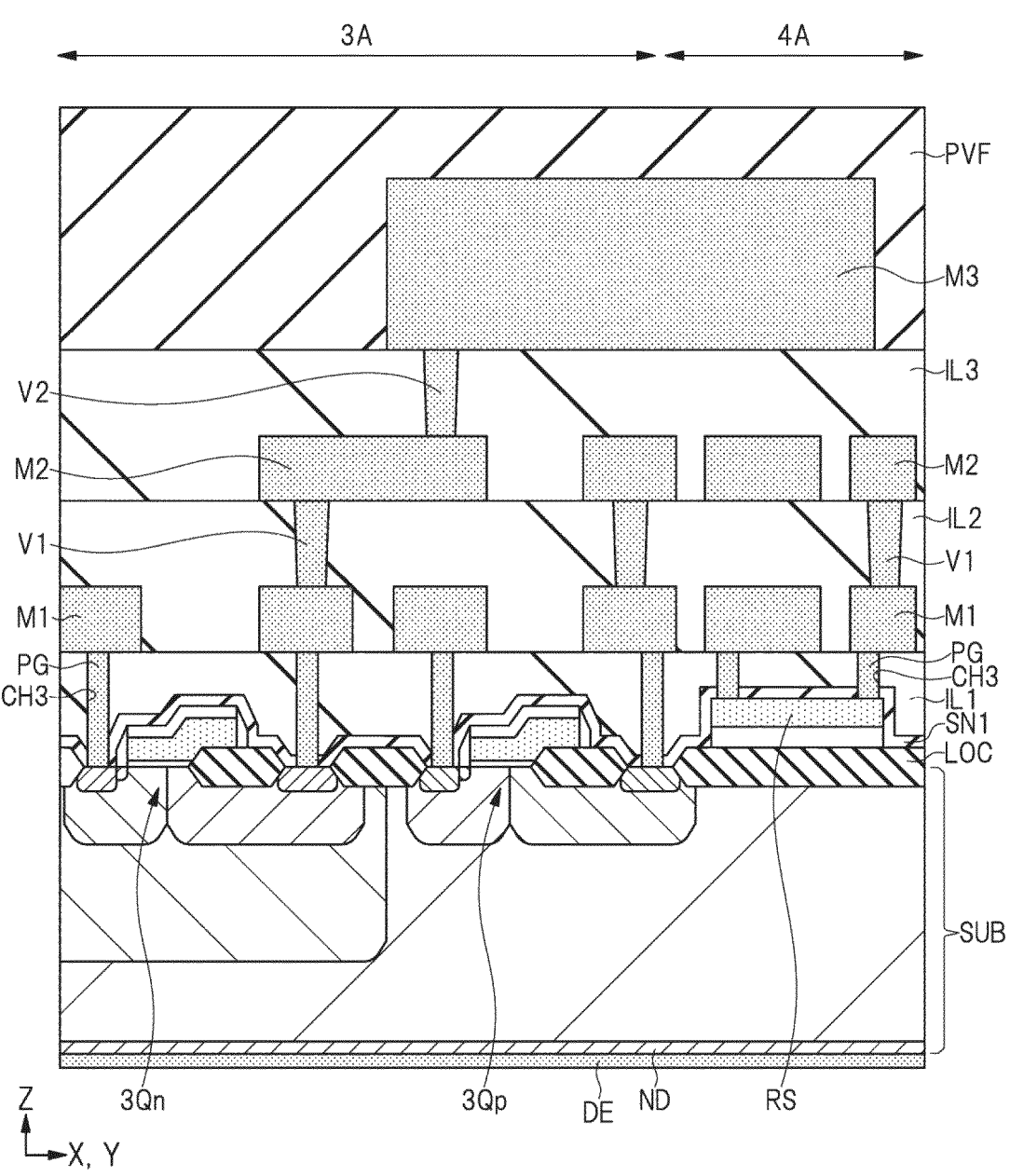
FIG. 5 is a cross-sectional view showing a semiconductor device in first embodiment.

FIG. 3 shows an n-type MOSFET3Qn and a p-type MOSFET3Qp formed in the region 3A and a resistor RS formed in the region 4A. MOSFET3Qn, 3Qp are planar MOSFETs. FIG. 5 shows a wiring configuration formed above MOSFET3Qn, 30$p$ and the resistor RS.

Figure 6:
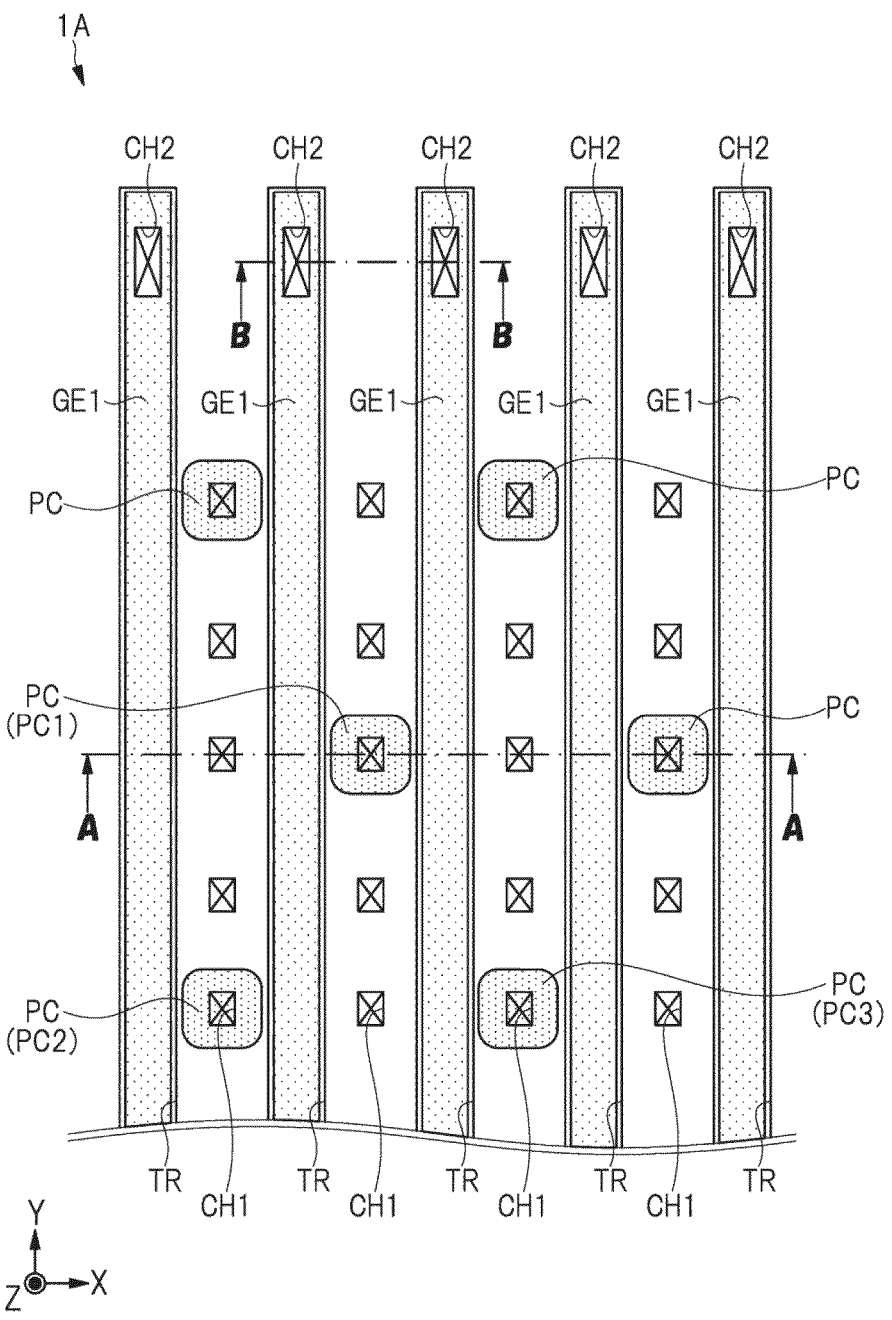
FIG. 6 is a plan view that enlarges a part of semiconductor device in first embodiment.
Figure 7:
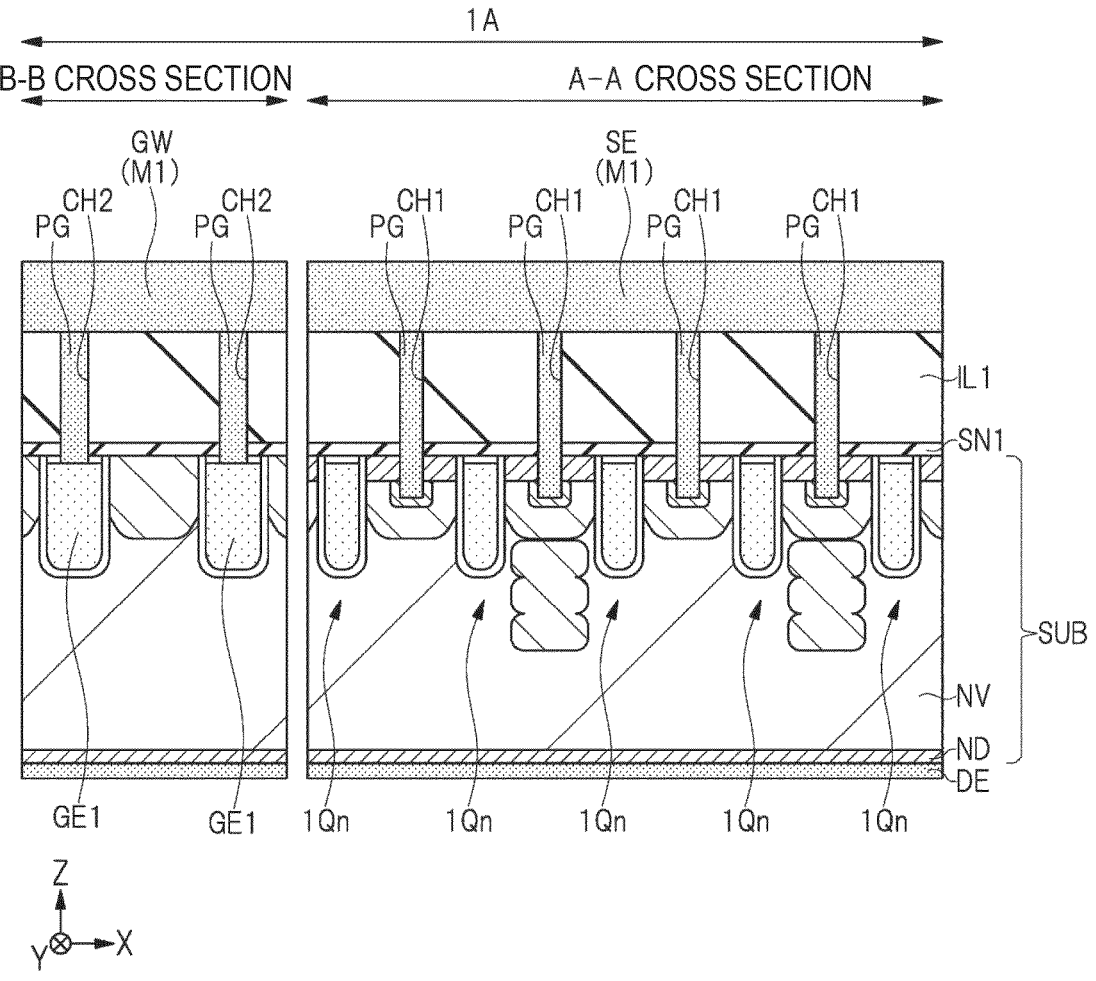
FIG. 7 is a cross-sectional view showing a semiconductor device in first embodiment.

FIG. 2 shows only a part of the structure of the region 1A representatively, and specific structures of the region 1A are shown in FIGS. 6 and 7. FIG. 6 is a plan view illustrating a plurality of MOSFET1Qn. FIG. 7 is a cross-sectional view along A-A and B-B lines shown in FIG. 6.

<MOSFET1Qn in Region 1A>

First, the configuration of the MOSFET1Qn in the region 1A will be described with reference to FIGS. 2, 6, and 7.

As described below, MOSFET1Qn includes a gate insulating film GI1, a gate-electrode GE1, a body-region PB, a source-region NS, a high concentration diffusing region PR, a column-region PC, and a capping-film CP1. MOSFET1Qn includes a drain region ND and a drift region NV (semiconductor substrate SUB of the region 1A) as the drain.

As shown in FIG. 6, a plurality of trenches TR are formed in the semiconductor substrate SUB. The plurality of trenches TR are formed in a stripe-like shape, extend in the Y direction, respectively, and adjoin each other in the X direction. A gate-electrode GE1 is formed inside the trench TR. The plurality of holes CH1 are spaced apart from each other along the direction of extension of the trench TR. The source electrode SE, the source region NS, and the body region PB are electrically connected via the hole CH1. The hole CH2 is disposed on the gate-electrode GE1 in the vicinity the end of the trench TR. The gate wiring GW and the gate electrode GE1 are electrically connected via the hole CH2.

As shown in FIGS. 2 and 7, semiconductor device 100 comprises an n-type semiconductor substrate SUB having an upper surface and a lower surface. Semiconductor substrate SUB is made of silicone. The semiconductor substrate SUB has a low concentration n-type drift region NV. Here, the n-type semiconductor substrate SUB itself constitutes the drift region NV. Note that the drift region NV may be an n-type semiconductor layer grown on an n-type silicon substrate while introducing phosphorus (P) by an epitaxial growth method. In the present disclosure, a laminated body formed of such n-type silicon substrate and n-type semiconductor layer is also described as being the semiconductor substrate SUB.

In semiconductor substrate SUB at the upper surface side, a trench TR that reaches a predetermined depth from the upper surface of semiconductor substrate SUB is formed. The depth of the trench TR is, for example, 0.5 micrometers or more and 2 micrometers or less. A gate insulating film GI1 is formed inside the trench TR (a side surface and a bottom surface of the trench TR). The gate insulating film GI1 is, for example, a silicon oxide film, and has a thickness of, for example, 10 nm or more and 20 nm or less.

A gate-electrode GE1 is formed inside the trench TR so as to fill the inside of the trench TR through the gate insulating film GI1. The gate electrode GE1 is, for example, a polycrystalline silicon film in which n-type impurities are implanted. A capping film CP1 is formed on the upper surface of the gate electrode GE1 so as to cover the upper surface of the gate electrode GE1. The capping film CP1 is an insulating film, and is a silicon oxide film formed by thermally oxidizing the upper surface of the gate-electrode GE1 (polycrystalline silicon film). The thickness of the capping film CP1 is greater than the thicknesses of each of gate insulating film GI1 and gate insulating films GI2, GI3 to be described later, and is, for example, greater than or equal to 40 nm and less than or equal to 60 nm.

In semiconductor substrate SUB at the upper surface side of semiconductor substrate SUB, a p-type body area PB is formed so as to be shallower than the depth of the trench TR. In the body region PB, an n-type source region NS is formed. The source region NS has a higher impurity concentration than the drift region NV.

A p-type column region PC is formed in the semiconductor substrate SUB located below the body region PB. As illustrated in FIG. 6, in the extending direction (Y direction) of the trench TR, the plurality of column regions PC is provided at equal intervals. Further, the plurality of column regions PC is arranged in a staggered manner. By two-dimensionally arranging the p-type column regions PC in the n-type drift region NV, it is possible to deplete the periphery of the column region PC and improve (increase) the breakdown voltage. In addition, as in the column regions PC1 to PC3, an equilateral triangle is formed by lines connecting the respective centers of the plurality of column regions PC. As a result, the depletion layers extending from the respective column regions PC are easily made uniform, and the depletion is easily sufficiently formed between respective column regions PC.

On the lower surface side of the semiconductor substrate SUB, an n-type drain-region ND is formed in the semiconductor substrate SUB. The drain region ND has a higher impurity concentration than the drift region NV. A drain-electrode DE is formed under the lower surface of the semiconductor substrate SUB. The drain electrode DE consists of, for example, a single layer of metallic film, such as an aluminum membrane, a titanium membrane, a nickel membrane, a gold membrane or a silver membrane, or a laminated membrane with these metallic membranes laminated accordingly. The drain region ND and the drain electrode DE are formed over the regions 1A to 4A.

The drain region ND and the semiconductor substrate SUB (drift-region NV) constitute the drain of MOSFET1Qn. The drain region ND and the semiconductor substrate SUB are supplied with a power supply potential as a drain potential from the outside of the semiconductor device 100 via the drain electrode DE.

When the semiconductor substrate SUB is a stack of an n-type silicon substrate and an n-type semiconductor layer, an n-type silicon substrate may function as a drain-region ND. In such cases, the drain-region ND does not have to be formed. That is, it is not necessary to form the drain-region ND.

A silicon nitride film SN1 and an interlayer insulating film IL1 are formed on the upper surface of the semiconductor substrate SUB so as to cover the gate-electrode GE1. The interlayer insulating film IL1 is formed on the silicon nitride film SN1. The thickness of the silicon nitride film SN1 is, for example, 10 nm or more and 20 nm or less. The thickness of the interlayer insulating film IL1 is, for example, 700 nm or more and 900 nm or less. The interlayer insulating film IL1 is, for example, a laminated film of a thin silicon oxide film and a thick silicon oxide film (BPSG: Boro-Phospho Silicate Glass film) containing boron and phosphorus.

In the interlayer insulating film IL1, a hole CH1 is formed in the silicon nitride film SN1, in the source region NS, and in the body region PB. The bottom of the hole CH1 is located inside the body region PB. In the vicinity of the bottom of the hole CH1, a high-concentration diffusion region PR is formed in the body region PB. The high-concentration diffusion region PR has a higher impurity concentration than the body region PB. In addition, holes CH2 are formed in the interlayer insulating film IL1 and in the silicon nitride film SN1 so as to penetrate the capping film CP1 and reach the gate-electrode GE1.

A plug PG is formed inside each of the hole CH1 and the hole CH2. A plurality of wirings M1 is formed on the interlayer insulating film IL1. In the region 1A, a part of the plurality of wirings M1 functions as the source-electrode SE and the gate wiring GW. The source electrode SE is electrically connected to the source region NS, the body region PB, and the high-concentration diffusion region PR through a plug PG inside the hole CH1. The gate wiring GW is electrically connected to the gate electrode GE1 via a plug PG inside the hole CH2.

The gate wiring GW is electrically connected to the semiconductor elements such as MOSFET2Qn, 20$p$, 3Qn, 30$p$ and the resistance element RS via other wirings such as the wiring M1 of the regions 2A to 4A. Therefore, the potential supplied to the gate-electrode GE1 is controlled by the control circuitries of the regions 2A to 4A including the semiconductor element.

The plugging PG is formed of a stacked film of a barrier metal film and a conductive film formed on the barrier metal film. The barrier metal film is, for example, a laminated film of a titanium film and a titanium nitride film. The conductive film is, for example, a tungsten film.

Wiring M1 is composed with a stacked film of a first barrier metal film, a conductive film formed on the first barrier metal film, and a second barrier metal film formed on the conductive film. The first barrier metal film is, for example, a laminated film of a titanium film and a titanium nitride film.

The conductive film is, for example, an aluminum film or an aluminum alloy film to which copper or silicon is added. The second barrier metal film is, for example, a laminated film of a titanium film and a titanium nitride film.

<MOSFET2Qn, 2Qp in Region 2A>

The structure of MOSFET2Qn, 2Qp in the region 2A will be described below with reference to FIG. 2.

As described below, the MOSFET2Qn includes a gate insulating film GI2, a gate-electrode GE2, a cap-film CP2, a sidewall spacer SW, and a well-region PW1. In addition, the source region and the drain region of MOSFET2Qn are constituted by the impurity region N1 and the impurity region N2.

The MOSFET2Qp includes a gate insulating film GI2, a gate-electrode GE2, a cap-film CP2, a sidewall spacer SW, and a well region NW1. In addition, the source region and the drain region of MOSFET2Qp are constituted by the impurity region P1 and the impurity region P2.

A p-type well region HPW is formed in the semiconductor substrate SUB of the region 2A and the region 3A. The well region HPW is mainly provided to separate the well region NW1 of the region 2A and the well region NW2 of the region 3A from the n-type semiconductor substrate SUB.

In the well region HPW of the region 2A, a p-type well region PW1 and an n-type well region NW1 are formed. A gate insulating film GI2 is formed on the well region PW1 and the well region NW1, respectively. The gate insulating film GI2 is, for example, a silicon oxide film, and has a thickness of, for example, 10 nm or more and 20 nm or less. A gate-electrode GE2 is formed on gate insulating film GI2.

MOSFET2Qn, 2Qp of the region 2A are provided for the purpose of driving at a high speed, and are driven at an operating voltage lower than MOSFET1Qn of the region 1A. Therefore, the material contained in the gate electrode GE2 is different from the material contained in the gate electrode GE1, and has a sheet resistance lower than the sheet resistance of the material contained in the gate electrode GE1. The gate electrode GE2 is formed in a manufacturing process that differs from the gate electrode GE1. The gate-electrode GE2 is composed of, for example, a stacked film of a polycrystalline silicon film in which n-type impurities are introduced and a tungsten silicide film formed on the polycrystalline silicon film.

The thickness of the polysilicon film is not less than 60 nm and not more than 100 nm, and the thickness of the tungsten silicide film is not less than 80 nm and not more than 120 nm. The impurity concentration of the polycrystalline silicon film included in the gate electrode GE2 is the same as or higher than the impurity concentration of the polycrystalline silicon film included in the gate electrode GE1.

A capping film CP2 is formed on the upper surface of the gate electrode GE2. The capping film CP2 is an insulating film, for example, such as a silicon-oxide film. The thickness of the capping film CP2 is, for example, not less than 100 nm and not more than 150 nm. A sidewall spacer SW is formed on a side surface of the gate-electrode GE2. The sidewall spacer SW is, for example, a silicone oxide film.

In the well region PW1, an n-type impurity region N1 and an n-type impurity region N2 are formed. The well region PW1 sandwiched between a pair of impurity regions N1 and located below the gate-electrode GE2 becomes a channel region of MOSFET2Qn. The impurity region N2 is formed to a position deeper than the impurity region N1, and has an impurity concentration higher than that of the impurity region N1.

In the well region NW1, a p-type impurity region P1 and a p-type impurity region P2 are formed. The well region NW1 sandwiched between a pair of impurity regions P1 and located below the gate-electrode GE2 becomes a channel region of MOSFET2Qp. The impurity region P2 is formed to a position deeper than the impurity region P1, and has an impurity concentration higher than that of the impurity region P1.

The regions 1A to 4A are partitioned by the element isolations LOC formed in the semiconductor substrate SUB, respectively. The element isolation LOC is, for example, a silicon oxide film, and has a thickness of, for example, 300 nm or more and 600 nm or less. The element isolation LOC is formed also at a boundary between MOSFET2Qn and MOSFET2Qp in the region 2A, a boundary between MOSFET3Qn and MOSFET3Qp in the region 3A, and the like.

<MOSFET3Qn, 3Qp in Region 3A>

The structure of MOSFET3Qn, 3Qp in the Region 3A will be described below with reference to FIG. 3.

As described below, MOSFET3Qn includes a gate insulating film GI3, a gate-electrode GE3, a cap-film CP3, a sidewall spacer SW, a well-region PW2, and an element isolation LOC. The source region of MOSFET3Qn is composed with an impurity region N1 and an impurity region N2. The drain region of MOSFET3Qn is composed with a well region NW2 and an impurity region N2.

MOSFET3Qp includes a gate insulating film GI3, a gate-electrode GE3, a cap-film CP3, a sidewall spacer SW, a well-region NW3, and an element isolation LOC. The source region of MOSFET3Qp is composed with an impurity region P1 and an impurity region P2. The drain region of MOSFET3Qp is composed with a well region PW3 and the impurity region P2.

In the well region HPW of the region 3A, a p-type well region PW2 and an n-type well region NW2 are formed. A gate insulating film GI3 is formed on the well region PW2 and on the well region NW2. A gate-electrode GE3 is formed on the gate insulating film GI3. A capping film CP3 is formed on the upper surface of the gate-electrode GE3. A sidewall spacer SW is formed on a side surface of the gate-electrode GE3.

In addition, an element isolation LOC is formed in a part of the well area NW2. A portion of the gate electrode GE3 is formed on the element isolation LOC, and an end portion of the gate electrode GE3 on the drain-region-side is located on the element isolation LOC.

MOSFET3Qn, 3Qp of the region 3A are driven at an operating voltage higher than MOSFET2Qn, 2Qp of the region 2A. For example, a potential of a degree of 5V is applied to the drain region on MOSFET2Qn of the region 2A, and a potential of a 10V or more is applied to the drain region on MOSFET3Qn of the region 3A. Therefore, in order to alleviate the electric field concentration in the drain region, in MOSFET3Qn, the element isolation LOC is provided below the gate-electrode GE3 on the drain region side.

In the well region PW2, an n-type impurity region N1 and an n-type impurity region N2 are formed. In the well region NW2, an n-type impurity region N2 is formed. The well region PW2 sandwiched between the impurity region N1 and the well region NW2 in the well region PW2 and positioned below the gate-electrode GE3 becomes a channel region of MOSFET3Qn.

In the semiconductor substrate SUB of the region 3A, an n-type well region NW3 and a p-type well region PW3 are formed. A gate insulating film GI3 is formed on the well region NW3 and on the well region PW3. A gate-electrode GE3 is formed on the gate insulating film GI3. A capping film CP3 is formed on the upper surface of the gate-electrode GE3. A sidewall spacer SW is formed on a side surface of the gate-electrode GE3.

In addition, in MOSFET3Qp as well, an element isolation LOC is formed in a part of the well region NW3 in order to reduce the electric field concentration in the drain region. A portion of the gate electrode GE3 is formed on the element isolation LOC, and an end portion of the gate electrode GE3 on the drain-region-side is located on the element isolation LOC.

In the well region NW3, a p-type impurity region P1 and a p-type impurity region P2 are formed. A p-type impurity region P2 is formed in the well region PW3. The well region NW3 sandwiched between the impurity region P1 and the well region PW3 in the well region NW3 and positioned below the gate-electrode GE3 becomes a channel region of MOSFET3Qp.

The gate insulating film GI3, the gate electrode GE3, the cap film CP3, and the sidewall spacer SW in the region 3A are formed in the same manufacturing process as the gate insulating film GI2, the gate electrode GE2, the cap film CP2, and the sidewall spacer SW in the region 2A, respectively. Accordingly, these materials and thicknesses are similar to/same as those described in MOSFET2Qn, 2Qp of the region 2A.

<Resistive Element RS of the Region 4A>

The structure of the resistive element RS of the region 4A will be described with reference to FIG. 3 below.

An element isolation LOC is formed in the semiconductor substrate SUB of the region 4A. An insulating film IF4 is formed on the element isolation LOC. The insulating film IF4 is, for example, a silicon oxide film, and has a thickness of, for example, 50 nm or more and 70 nm or less.

A resistive element RS is formed on the insulating film IF4. The resistive element RS needs to be designed such that a higher resistivity is obtained. Therefore, the material contained in the resistive element RS has a sheet resistance higher than the sheet resistance of the material contained in the gate-electrodes GE1 to GE3. In addition, the resistive element RS is formed in a manufacturing process that differs from the gate-electrodes GE1 to GE3. The resistive element RS is, for example, a p-type doped polycrystalline silicon film to which p-type impurities are added, and has a thickness of, for example, 120 nm or more and 180 nm or less.

<Wiring Structure>

Hereinafter, wiring structures formed above MOSFET1Qn, 2Qn, 2Qp, 3Qn, 3Qp and the resistive element RS will be described with reference to FIGS. 4 and 5.

In the regions 2A to 4A, a silicon nitride film SN1 and an interlayer insulating film IL1 are formed on the upper surface of the semiconductor substrate SUB so as to cover the gate-electrodes GE2, GE3 and the resistor RS. Materials contained in the interlayer insulating film IL1 are similar to/same as those described in the region 1A.

Here, in MOSFET2Qp, 3Qp, positive charges may be trapped in the gate insulating films GI2, GI3, and thus NBTI may deteriorate. Since MOSFET2Qp, 3Qp are covered with the silicon nitride film SN1, the entry of positive charges into the gate insulating film GI2, GI3 can be suppressed, and the reliability of the semiconductor device 100 can be improved.

In the regions 2A to 4A, a plurality of holes CH3 are formed in the interlayer insulating film IL1 and the silicon nitride film SN1. A plug PG is formed inside each of the plurality of hole CH3. A plurality of wirings M1 are formed on the interlayer insulating film IL1. The materials contained in the plug PG and the wiring M1 are same as/similar to those described in the region 1A.

The impurity regions N2, P2 and the resistive element RS are electrically connected to a plurality of wirings M1 via a plug PG inside the hole CH3. Although not shown, the gate-electrodes GE2, GE3 are also electrically connected to the wiring M1 via the plug PG inside the hole CH3.

In the regions 1A to 4A, an interlayer insulating film IL2 is formed on the interlayer insulating film IL1 so as to cover the plurality of wirings M1. The interlayer insulating film IL2 is, for example, a silicon oxide film. The thickness of the interlayer insulating film IL2 is, for example, 650 nm or more and 850 nm or less.

In the interlayer insulating film IL2, a plurality of vias V1 connected to a plurality of wirings M1 is formed. The via V1 is formed by embedding a stacked film of a barrier metal film and a conductive film in a contact hole formed in the interlayer insulating film IL2. The barrier metal film is, for example, a titanium nitride film. The conductive film is, for example, a tungsten film.

A plurality of wirings M2 connected to a plurality of vias V1 is formed on the interlayer insulating film IL2. A material contained in the wiring M2 is same as that of the wiring M1. An interlayer insulating film IL3 is formed on the interlayer insulating film IL2 so as to cover the plurality of wirings M2.

A material contained in the interlayer insulating film IL3 is same as that of the interlayer insulating film IL2. The thickness of the interlayer insulating film IL3 is, for example, 650 nm or more and 850 nm or less. In the interlayer insulating film IL3, a plurality of vias V2 connected to a plurality of wirings M2 is formed. The configuration of the via V2 is the same as that of the via V1.

A plurality of wirings M3 connected to a plurality of vias V2 are formed on the interlayer insulating film IL3. Wiring M3 is composed of a stacked film of a barrier metal film and a conductive film formed on the barrier metal film. The barrier metal film is, for example, a titanium tungsten film. The conductive film is, for example, an aluminum film or an aluminum alloy film to which copper or silicon is added. The thickness of wiring M1, M2 is, for example, greater than or equal to 300 nm and less than or equal to 600 nm, but the thickness of wiring M3 is sufficiently greater than the thickness of wiring M1, M2, for example, greater than or equal to 3 micrometers and less than or equal to 5 micrometers.

A protective film PVF is formed on the interlayer insulating film IL3 so as to cover the plurality of wirings M3. The protective film PVF is, for example, a polyimide film. The thickness of the protective film PVF is, for example, 4 micrometers or more and 7 micrometers or less.

Figure 67:
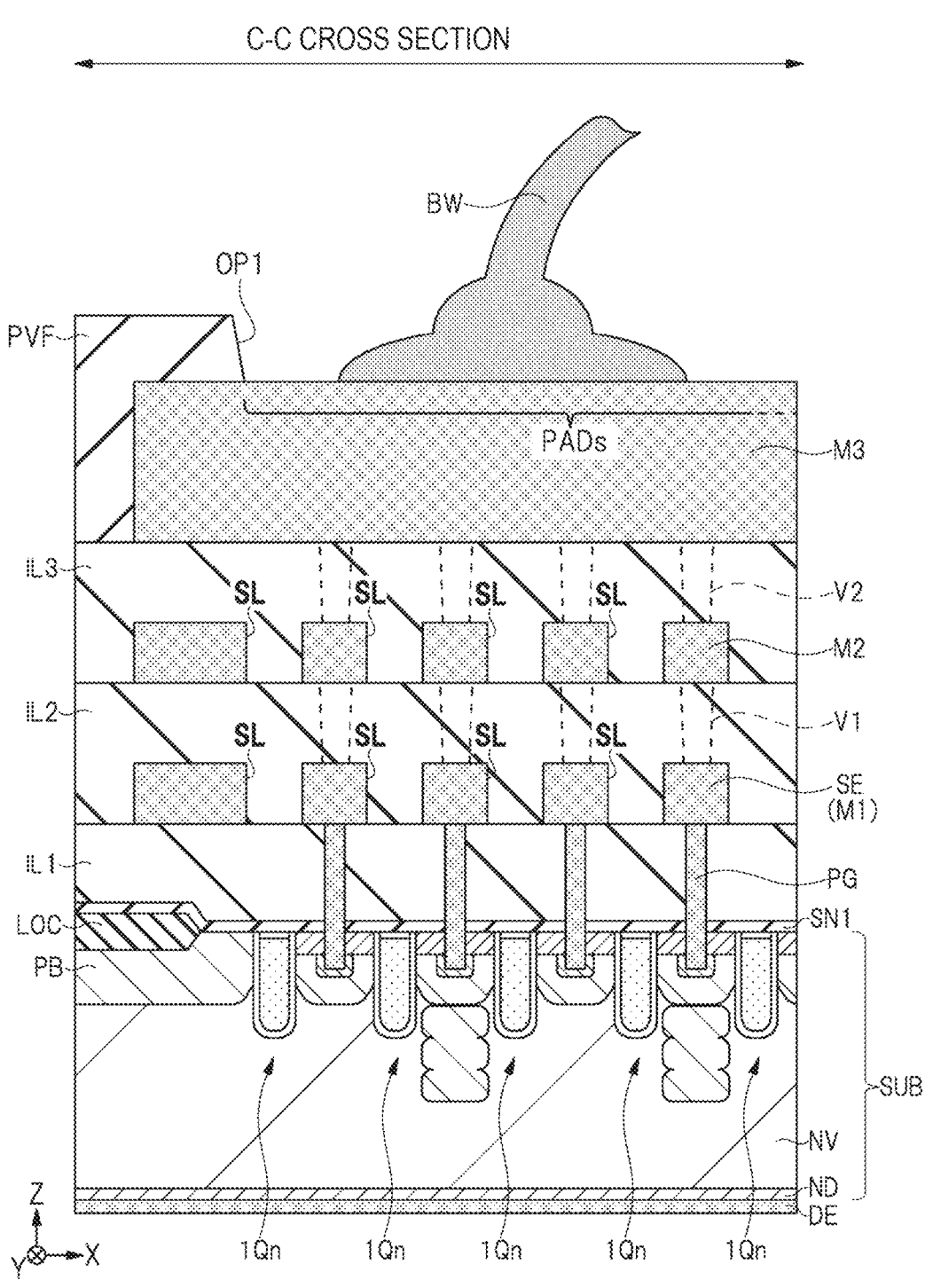
FIG. 67 is a cross-sectional view showing semiconductor device in first embodiment.
Figure 70:
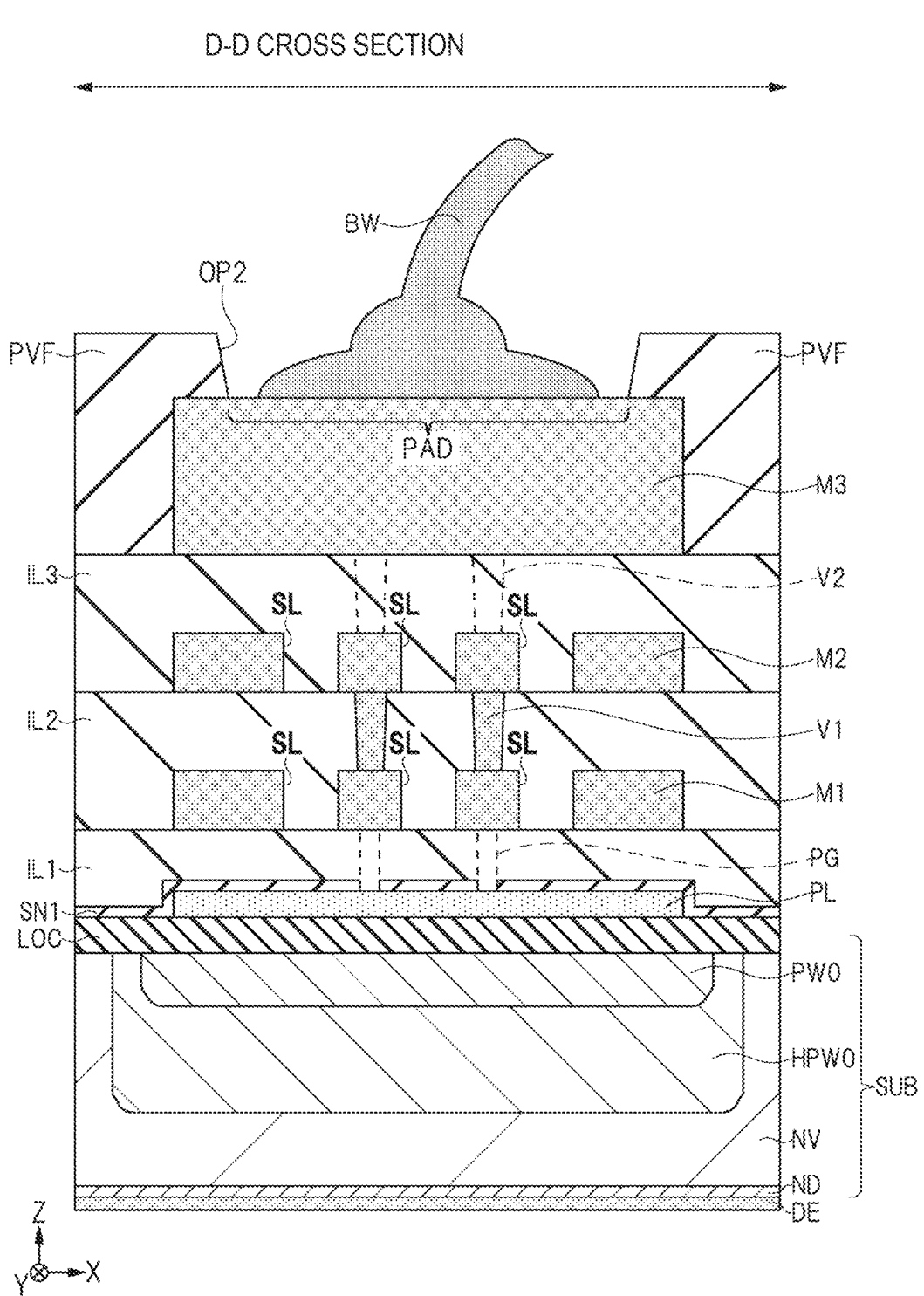
FIG. 70 is a cross-sectional view showing semiconductor device in first embodiment.

An opening OP1 and a plurality of openings OP2 are formed in the protective film PVF on the wiring M3 so as to expose a part of the plurality of wirings M3 (see FIGS. 67 and 70). A portion of the wiring M3 exposed in the opening OP1 constitutes a source pad PADs for connecting to the external connection member BW. In addition, a part of the wiring M3 exposed in the plurality of openings OP2 constitutes a plurality of pads PAD for connecting to the external connection member BW.

The external connection member BW is, for example, a bonding wire made of gold or copper, or a clip made of a copper plate. The external connection member BW is connected to the source pad PADs and the plurality of pads PAD, so that the semiconductor device 100 is electrically connected to another semiconductor chip, a wiring substrate, or the like.

<Manufacturing Method of Semiconductor Device>

The respective manufacturing steps included in the manufacturing method of the semiconductor device 100 will be described below mainly with reference to FIG. 8 to FIG. 53.

Figure 8:
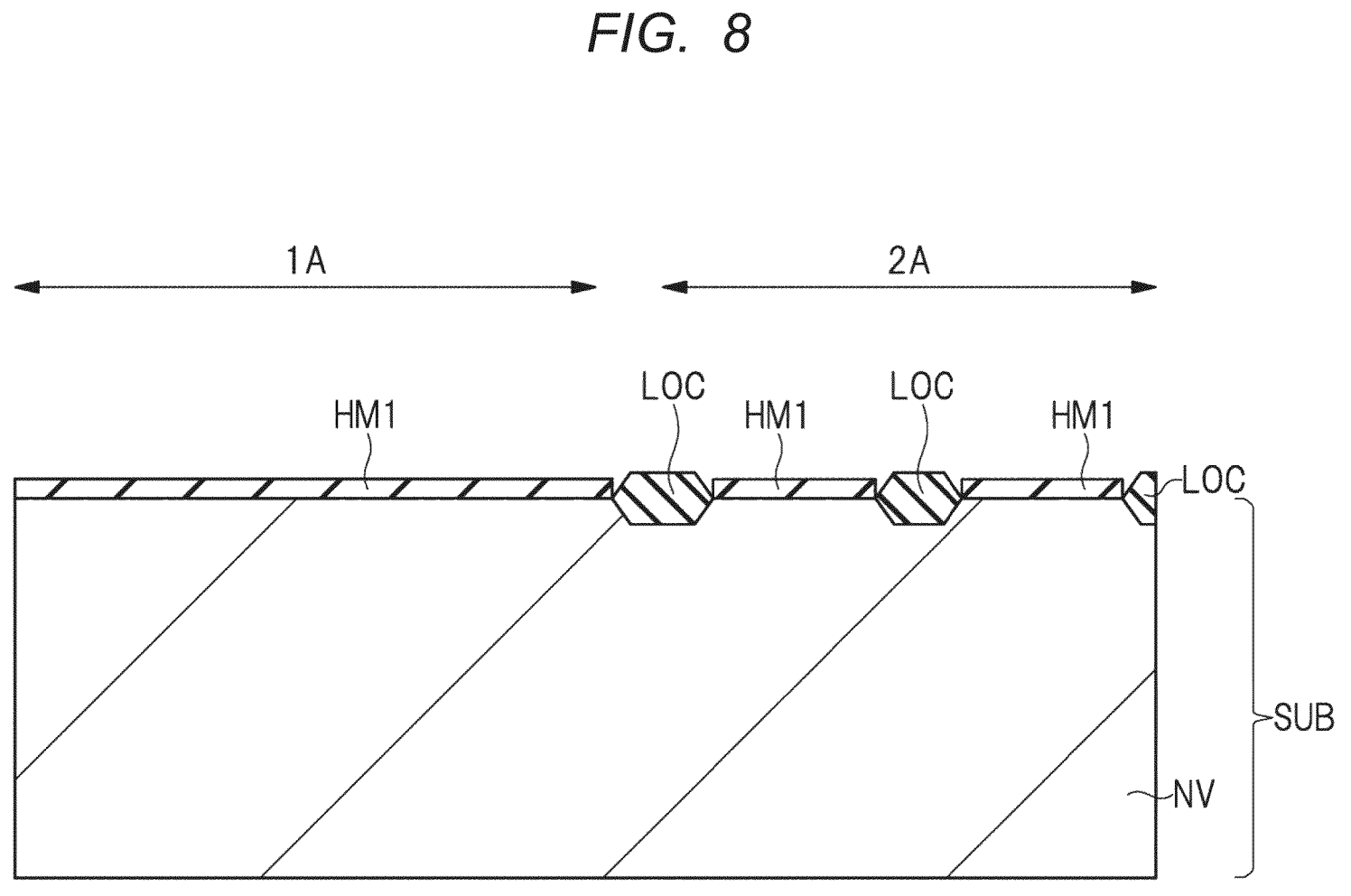
Figure 9:
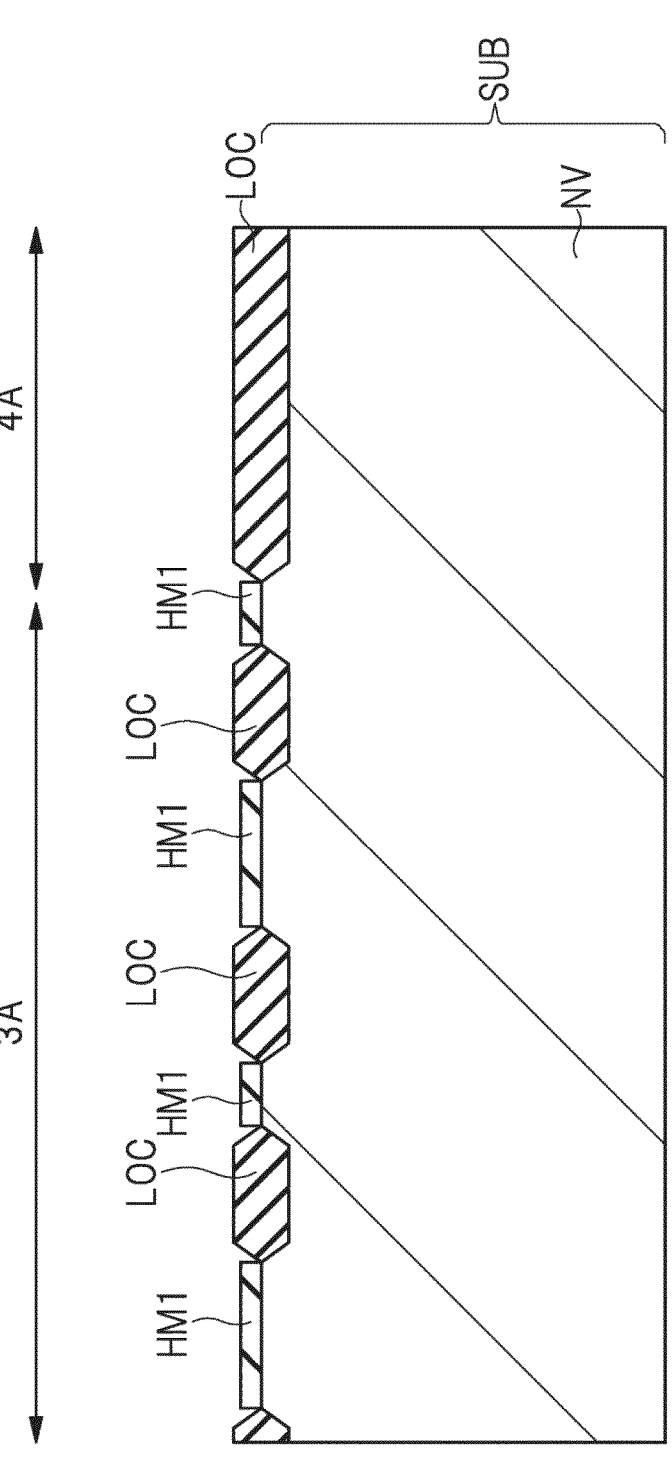
FIG. 9 is a cross-sectional view showing the manufactur- ing process of a semiconductor device in first embodiment.

As shown in FIGS. 8 and 9, first, an n-type semiconductor substrate SUB having an upper surface and a lower surface is prepared. As described above, the n-type semiconductor substrate SUB itself constitutes the drift region NV, but the drift region NV may be an n-type semiconductor layer grown on the n-type silicon substrate while introducing phosphorus (P) by epitaxial growth method.

Next, a silicon-oxide film is formed on the upper surface of the semiconductor substrate SUB by, for example, thermal oxidation treatment. Next, a silicon nitride film is formed on the silicon oxide film by, e.g., CVD (Chemical Vapor Deposition). Next, the silicon oxide film and the silicon nitride film are patterned to form a hard mask HM1 that selectively covers the upper surface of the semiconductor substrate SUB. Next, a thermal oxidation treatment is performed on the semiconductor substrate SUB to form an element isolation LOC made of a silicon oxide film on the semiconductor substrate SUB exposed from the hard mask HM1. The hard mask HM1 is then removed by an isotropic etching process.

Figure 10:
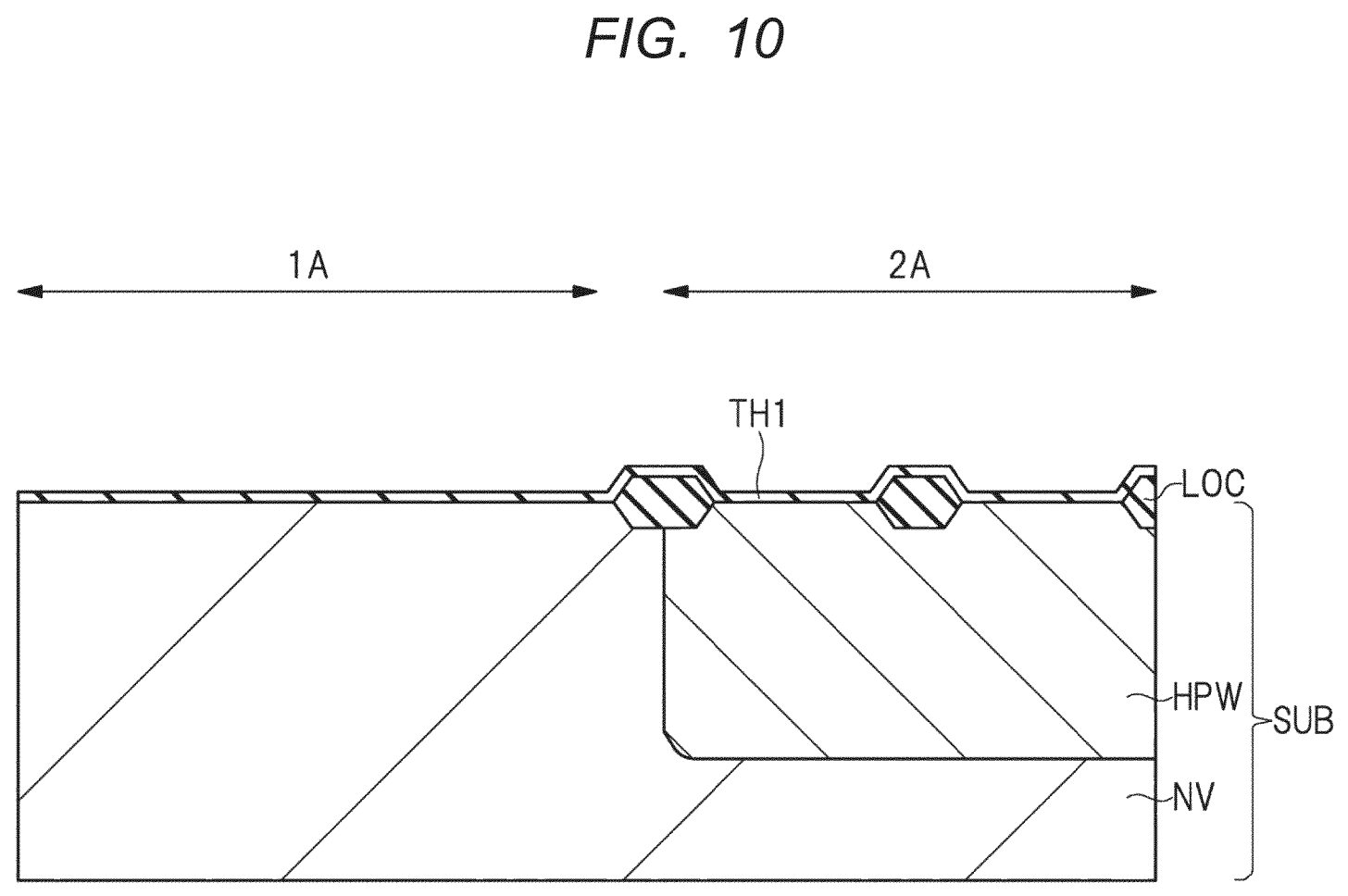
Figure 11:
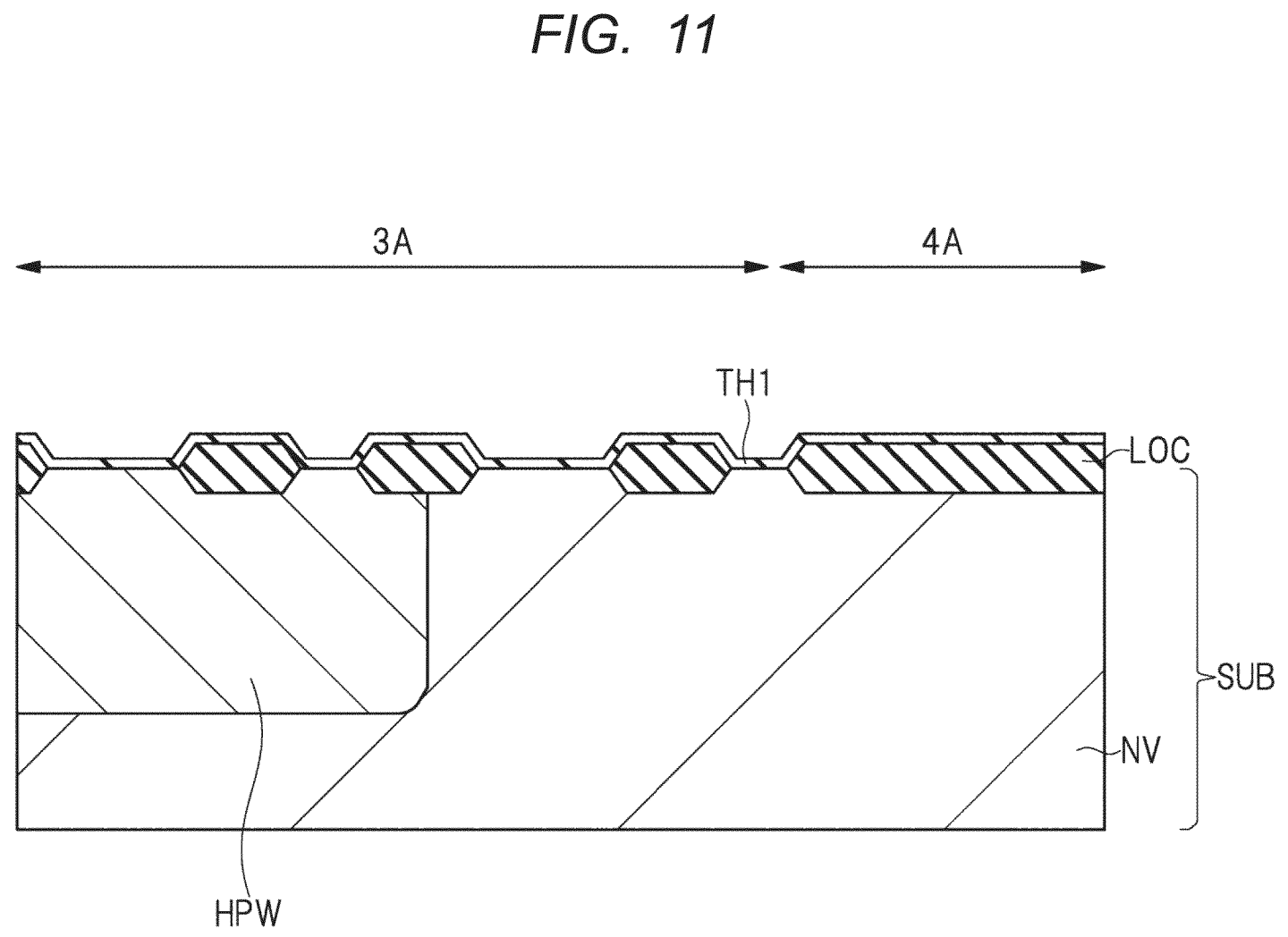

As shown in FIGS. 10 and 11, first, a through film TH1 made of a silicon oxide film is formed on the upper surface of the semiconductor substrate SUB by thermal oxidation treatment. Next, ion-implantation is selectively performed from the upper surface side of the semiconductor substrate SUB so as to pass through the through-film TH1 to form a p-type well region HPW in the semiconductor substrate SUB of the region 2A and the region 3A. In this ion-implantation, for example, boron (B) is used as an impurity.

Next, the well region HPW is subjected to a heat treatment. The heat treatment is carried out in a nitrogen atmosphere, for example, under the condition of 1150 degrees Celsius, 90 minutes. By this heat treatment, the impurities contained in the well regions HPW diffuse into the semiconductor substrate SUB and are activated.

Since the heat treatment is performed for a relatively long time, when the heat treatment is performed after the gate insulating film GI1 is formed, a stress is generated from the gate insulating film GI1 into the semiconductor substrate SUB, and this stress may cause crystalline defects in the semiconductor substrate SUB. Further, although the hard mask HM1 and the hard mask HM2 to be described later include a silicon nitride film, there is a possibility that crystalline defects may be generated in the semiconductor substrate SUB due to stresses of the silicon nitride film also when the heat treatment is performed while the silicon nitride film is formed on the upper surface of the semiconductor substrate SUB.

That is, the heat treatment is preferably performed before the trench TR is formed and before the gate insulating film GI1 is formed, and is preferably performed while the silicon nitride film is not formed on the upper surface of the semiconductor substrate SUB.

Figure 12:
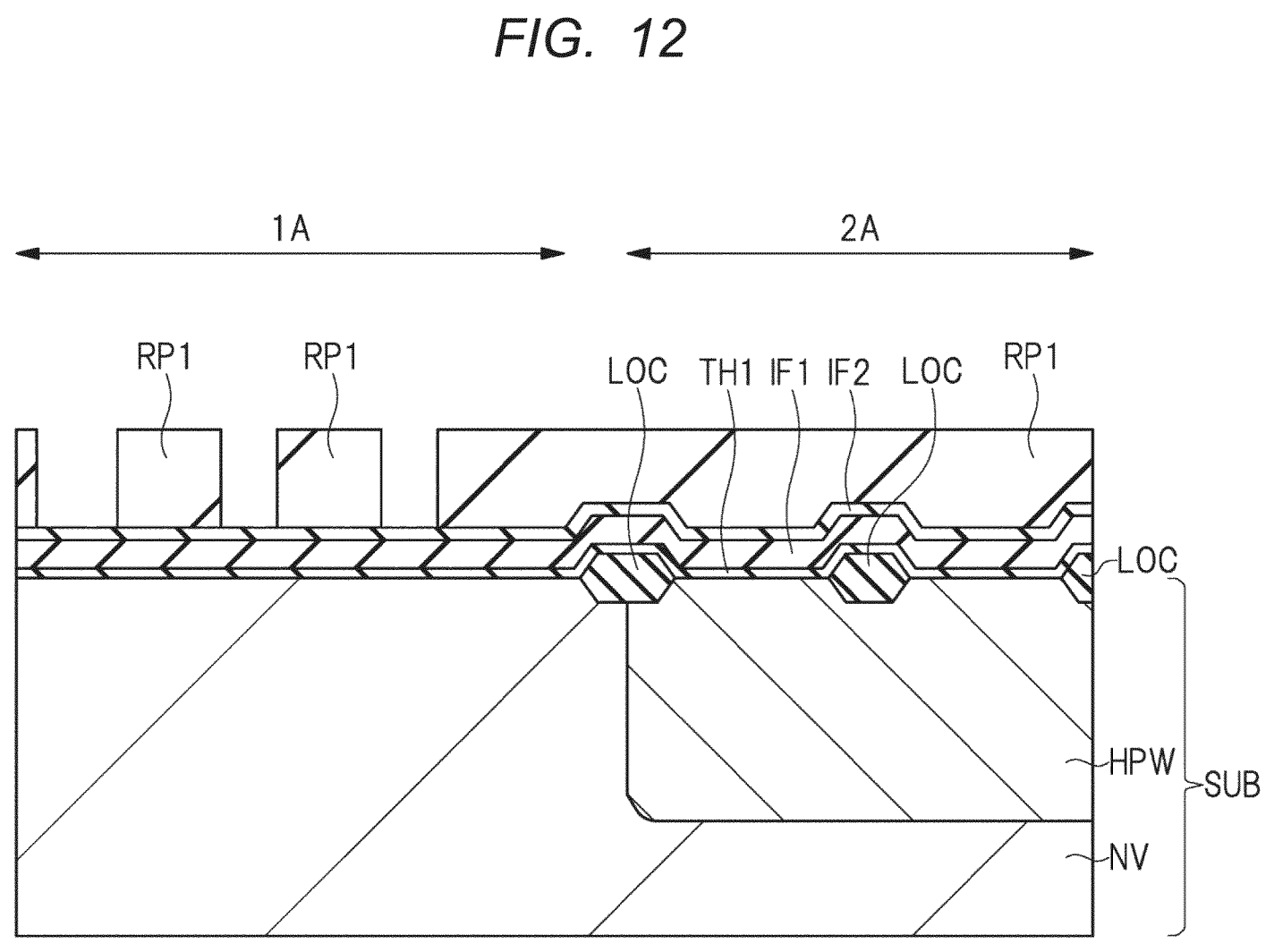
Figure 13:
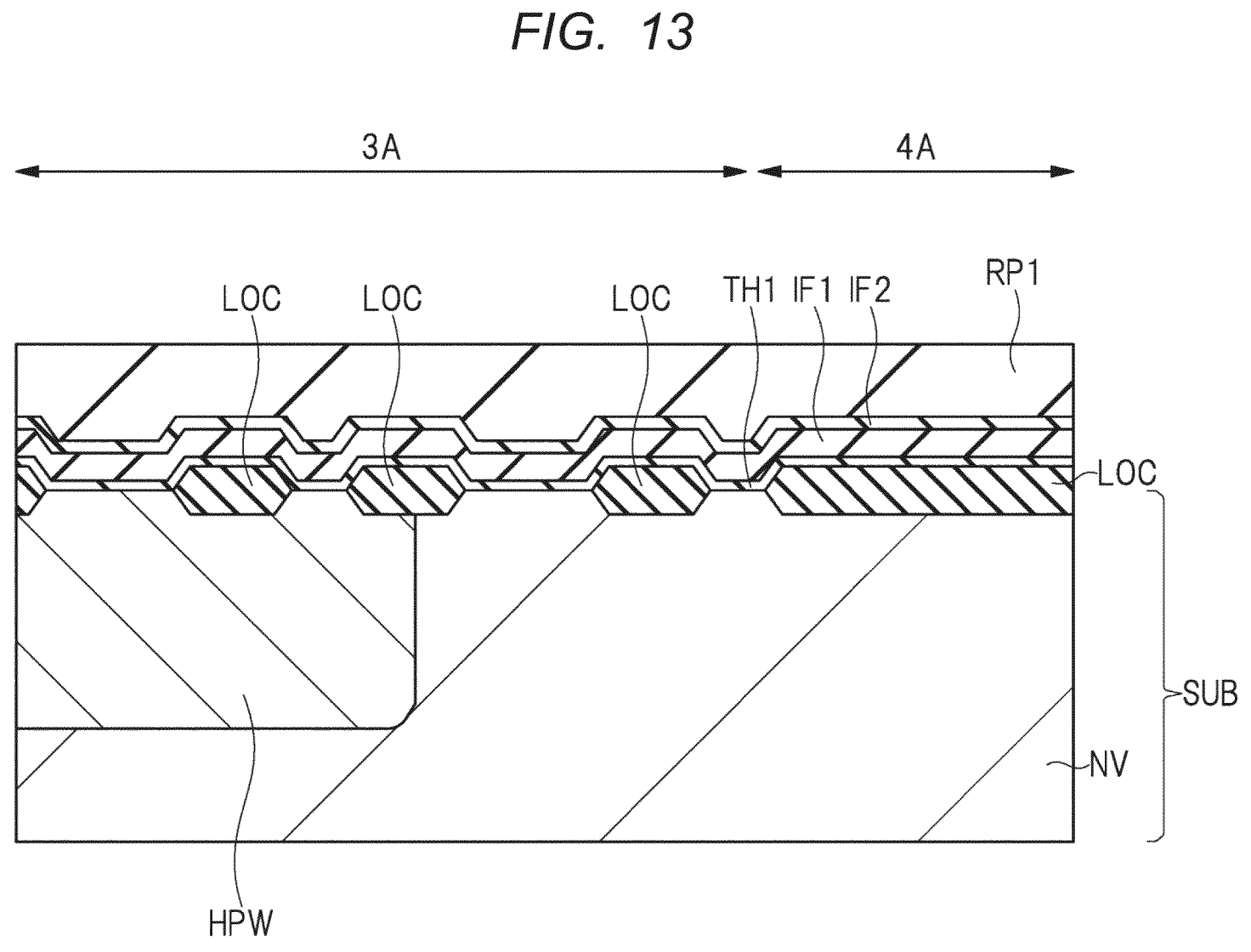

As shown in FIGS. 12 and 13, first, an insulating film IF1 made of a silicon nitride film is formed on the through film TH1 by, for example, a CVD method. Next, an insulating film IF2 made of a silicon oxide film is formed on the insulating film IF1 by, for example, a CVD method. Next, a resist pattern RP1 is formed on the insulating film IF2 so as to selectively open a part of the region 1A and cover the regions 2A to 4A.

Figure 14:
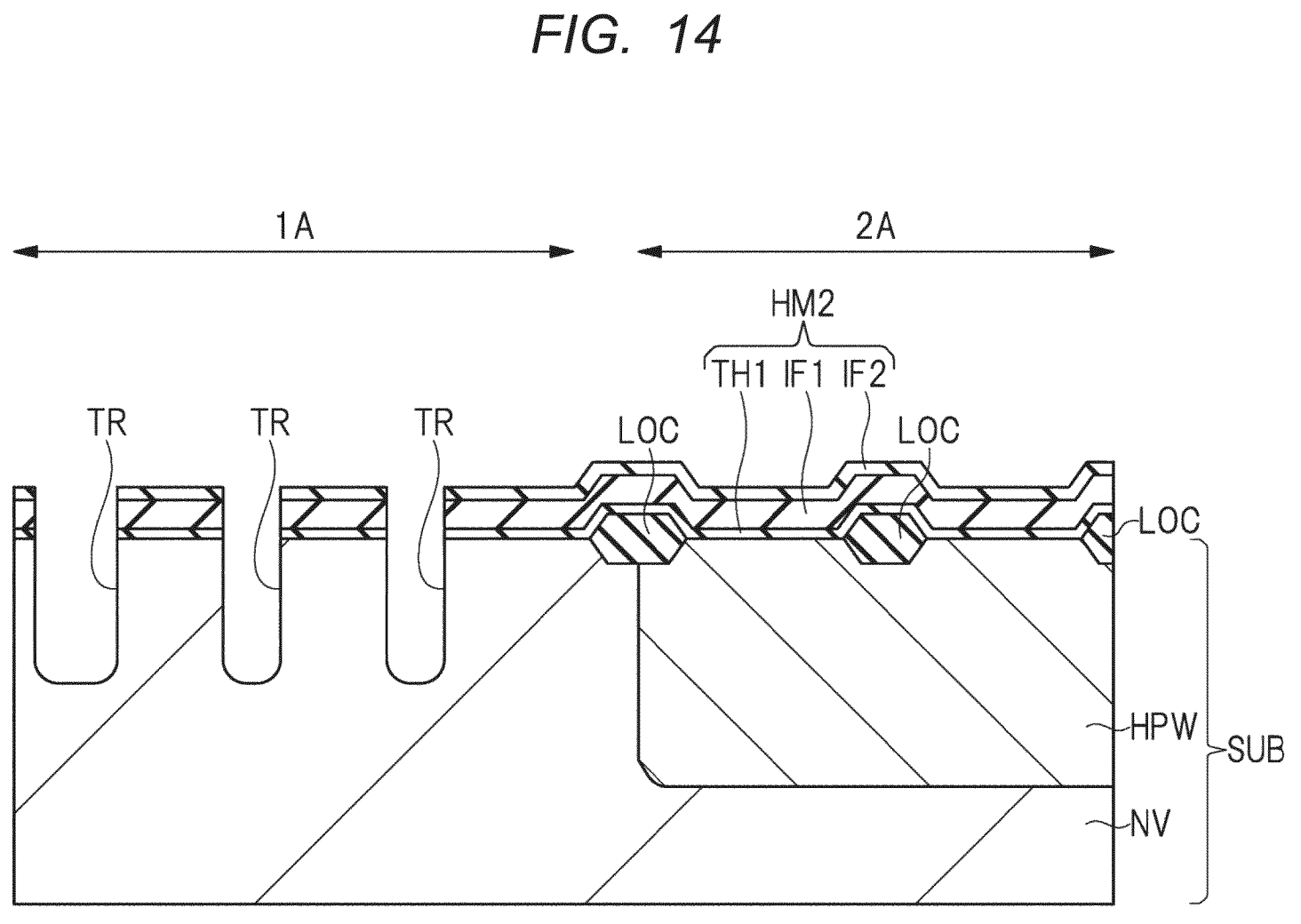
Figure 15:
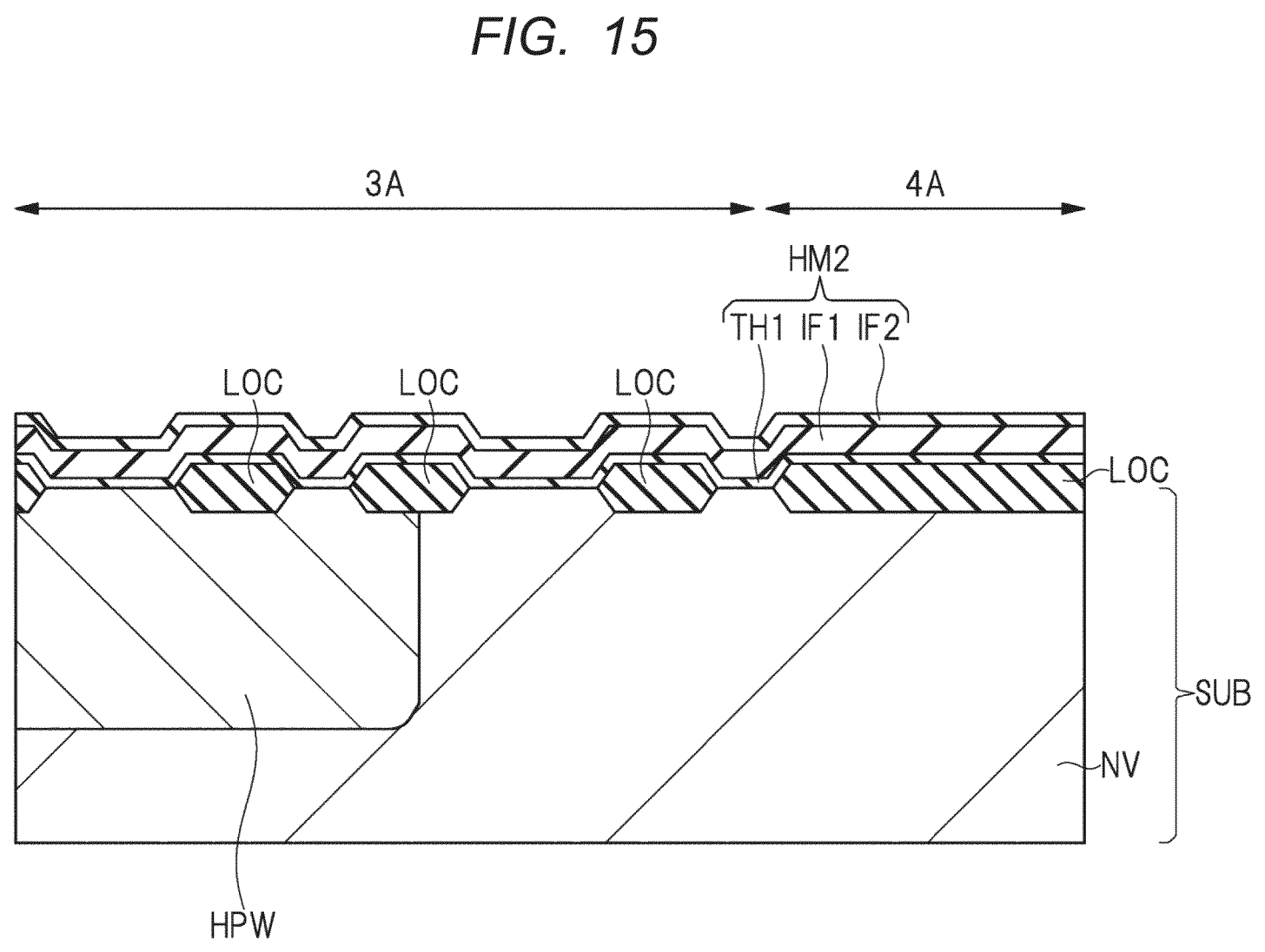

As shown in FIGS. 14 and 15, first, the through film TH1, the insulating film IF1, and the insulating film IF2 are patterned by performing an anisotropic etch process using the resist pattern RP1 as a mask. Thus, a hard mask HM2 is formed. Next, the resist pattern RP1 is removed by ashing. Next, an anisotropic etch process is performed using the hard mask HM2 as a mask to form a trench TR in the semiconductor substrate SUB exposed from the hard mask HM2. Thereafter, the semiconductor substrate SUB is washed. At this time, the insulating film IF2 is removed, but the through film TH1 and the insulating film IF1 are left as the hard mask HM2.

Figure 16:
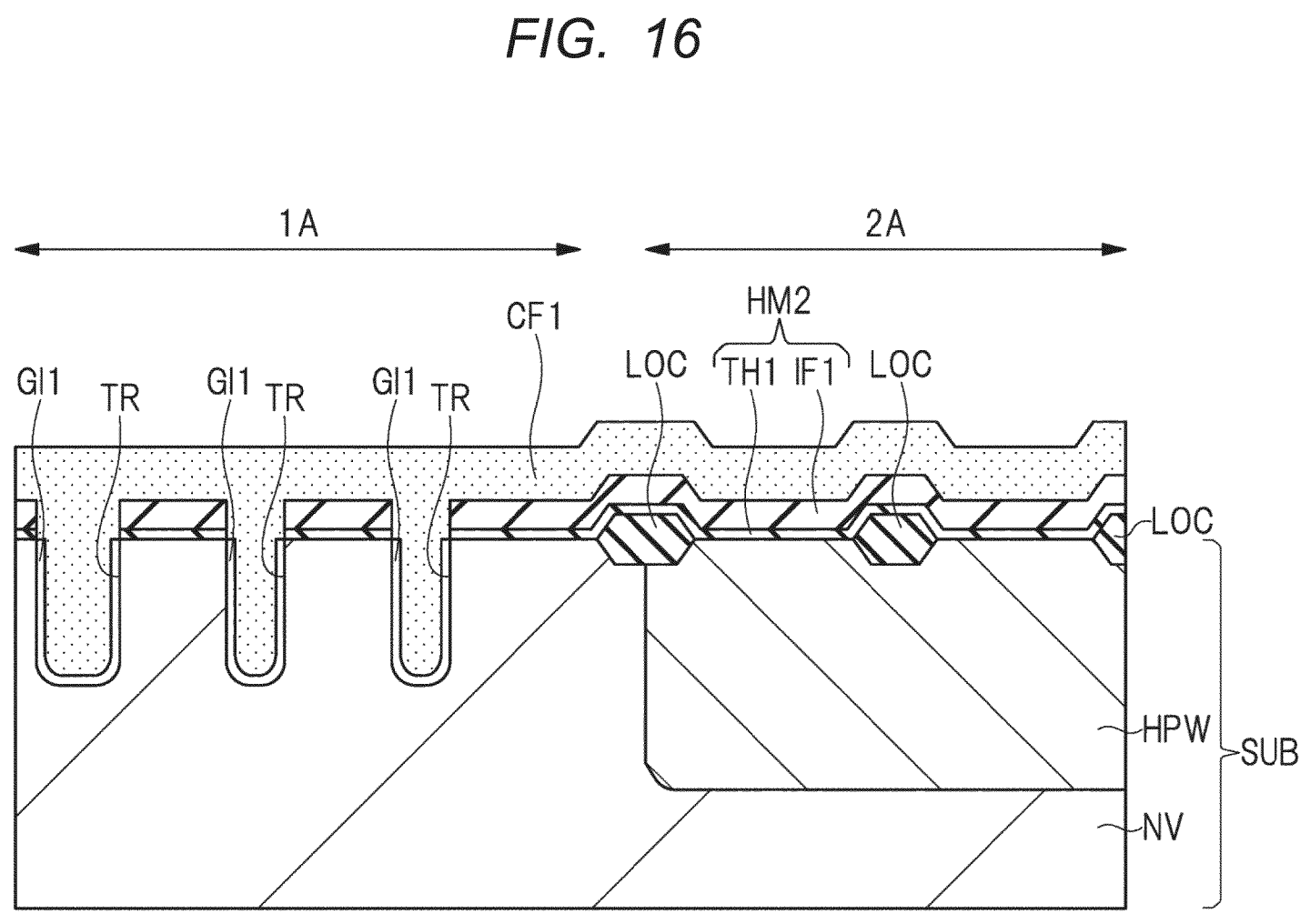
Figure 17:
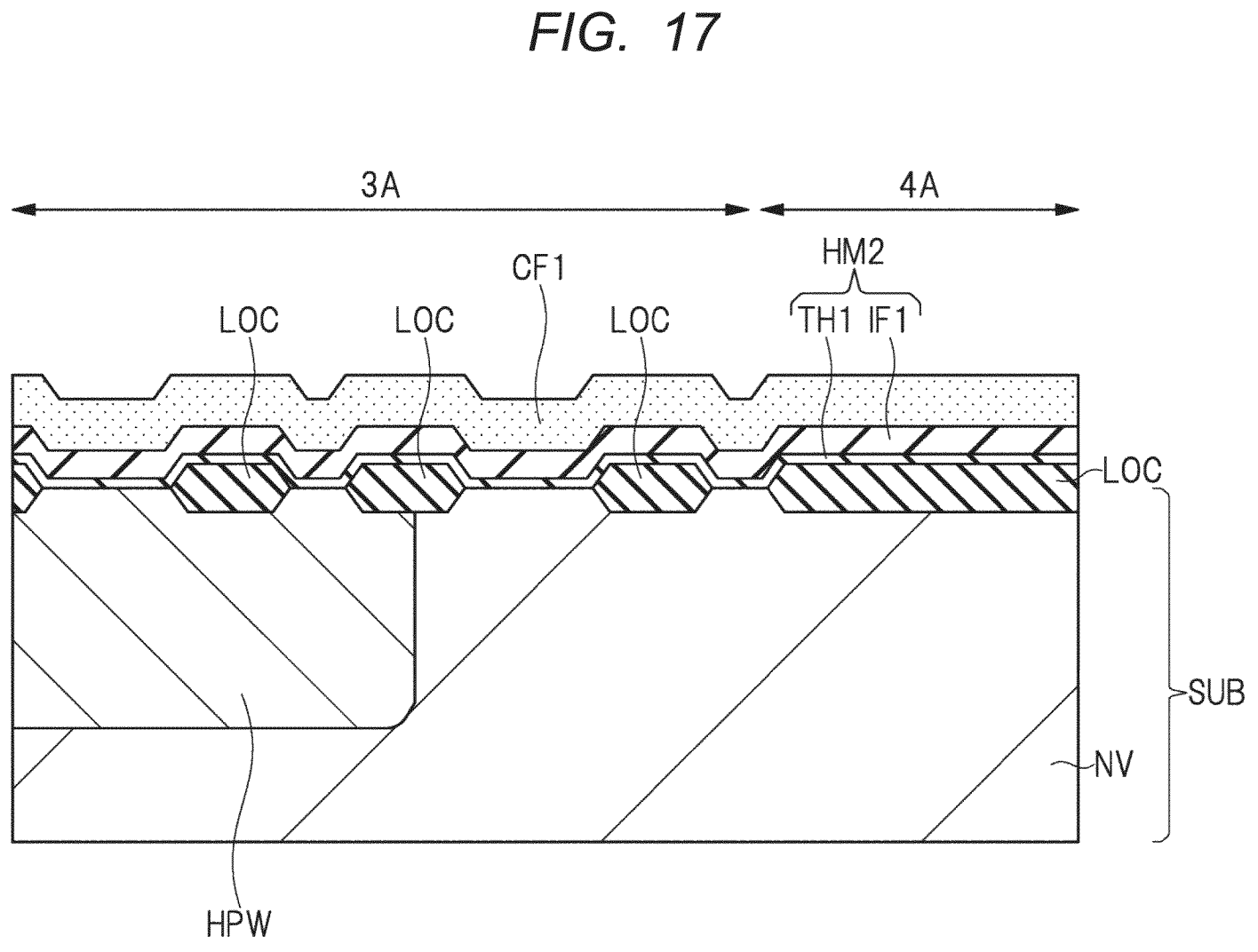

As shown in FIGS. 16 and 17, first, a gate insulating film GI1 is formed inside the trench TR by a thermal oxidizing treatment. Next, a conductive film CF1 is formed on the gate insulating film GI1 and the hard mask HM2 by, for example, a CVD method. The conductive film CF1 is a polycrystalline silicon film. Next, an impurity such as phosphorus (P) is ion-implanted into the conductive film CF1, thereby forming the conductive film CF1 into an n-type polycrystalline silicon film.

Figure 18:
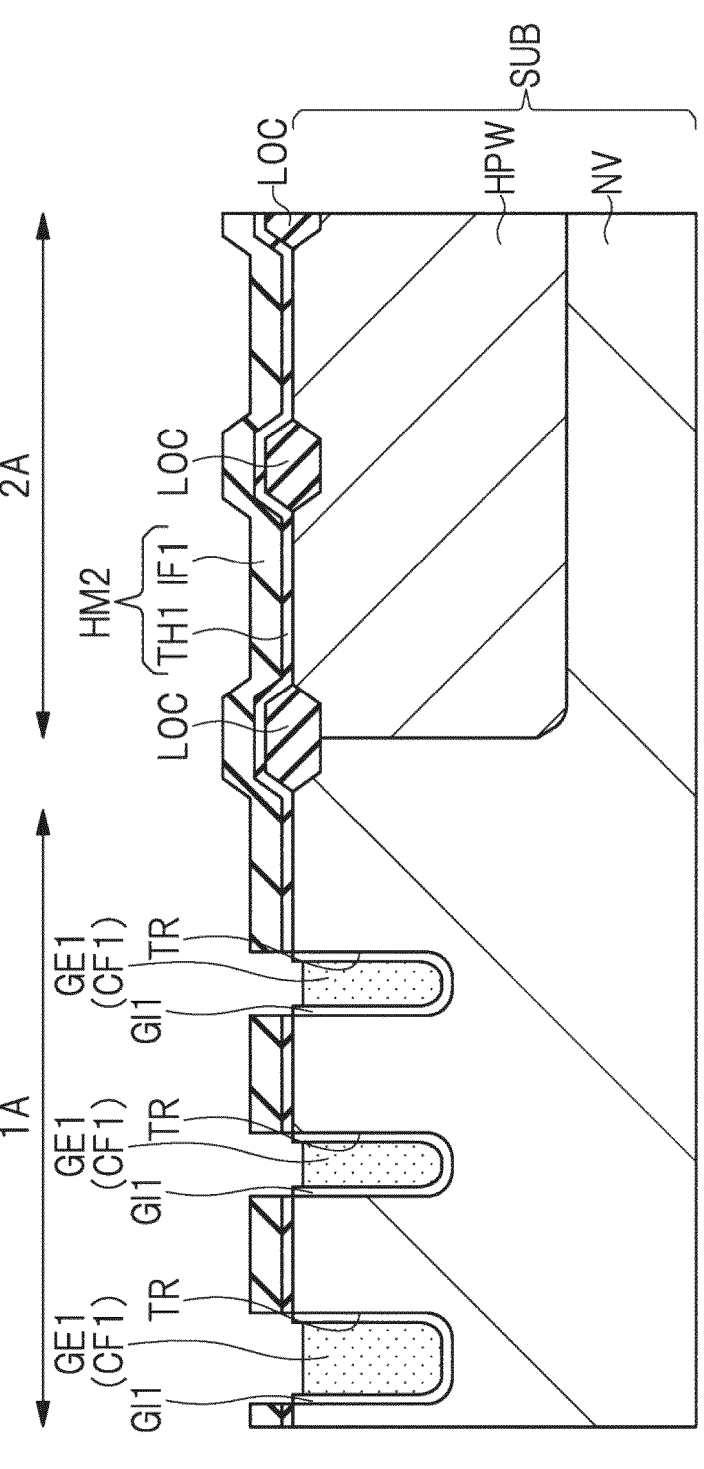
FIG. 18 is a cross-sectional view showing the manufac- turing process of a semiconductor device following FIG. 16.
Figure 19:
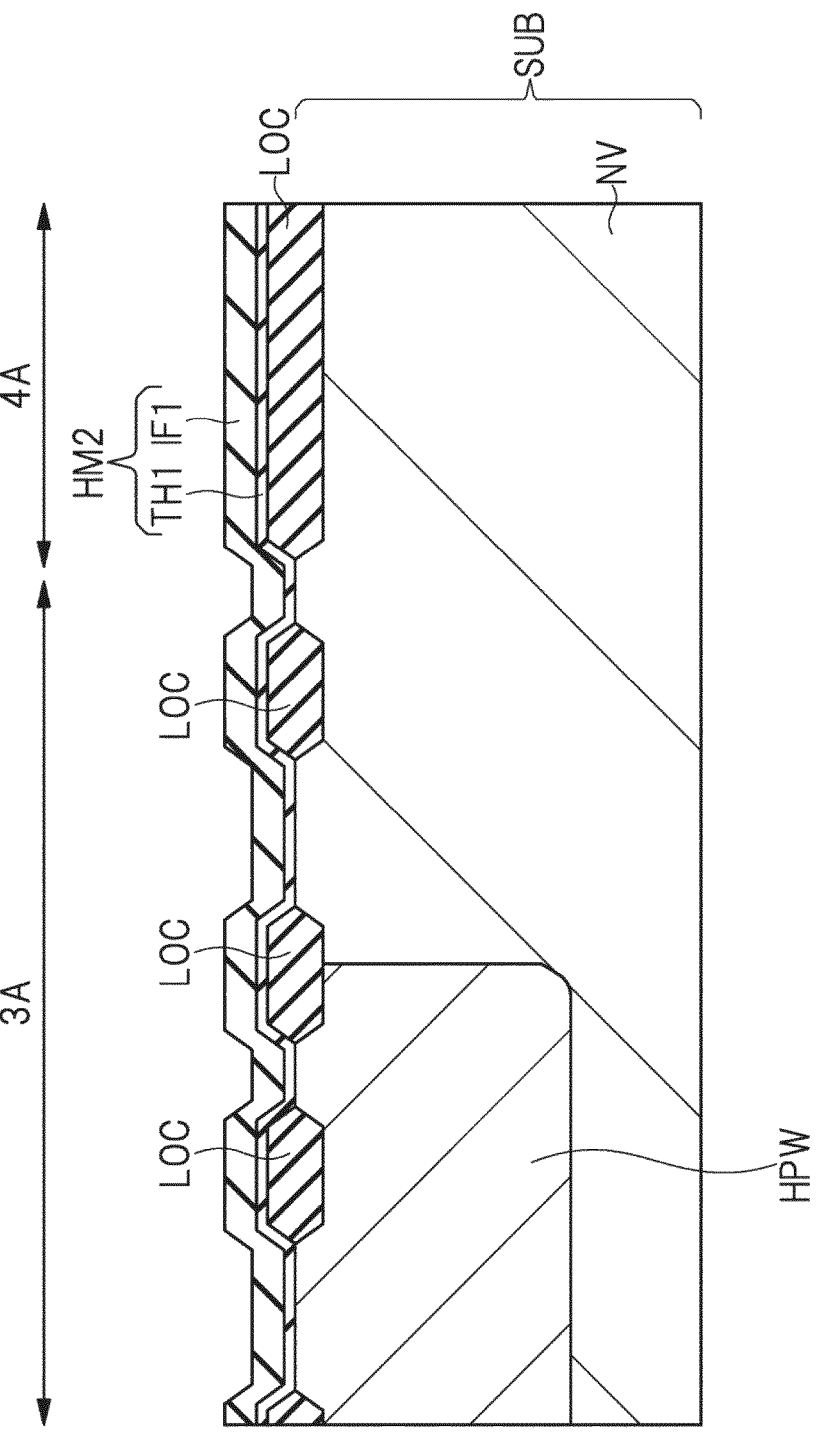
FIG. 19 is a cross-sectional view showing the manufac- turing process of a semiconductor device following FIG. 17.

As shown in FIGS. 18 and 19, the conductive film CF1 is subjected to an anisotropic etch process. As a result, the conductive film CF1 on the hard mask HM2 is removed, and the gate-electrode GE1 is formed inside the trench TR so as to fill the inside of the trench TR via the gate insulating film GI1.

Figure 20:
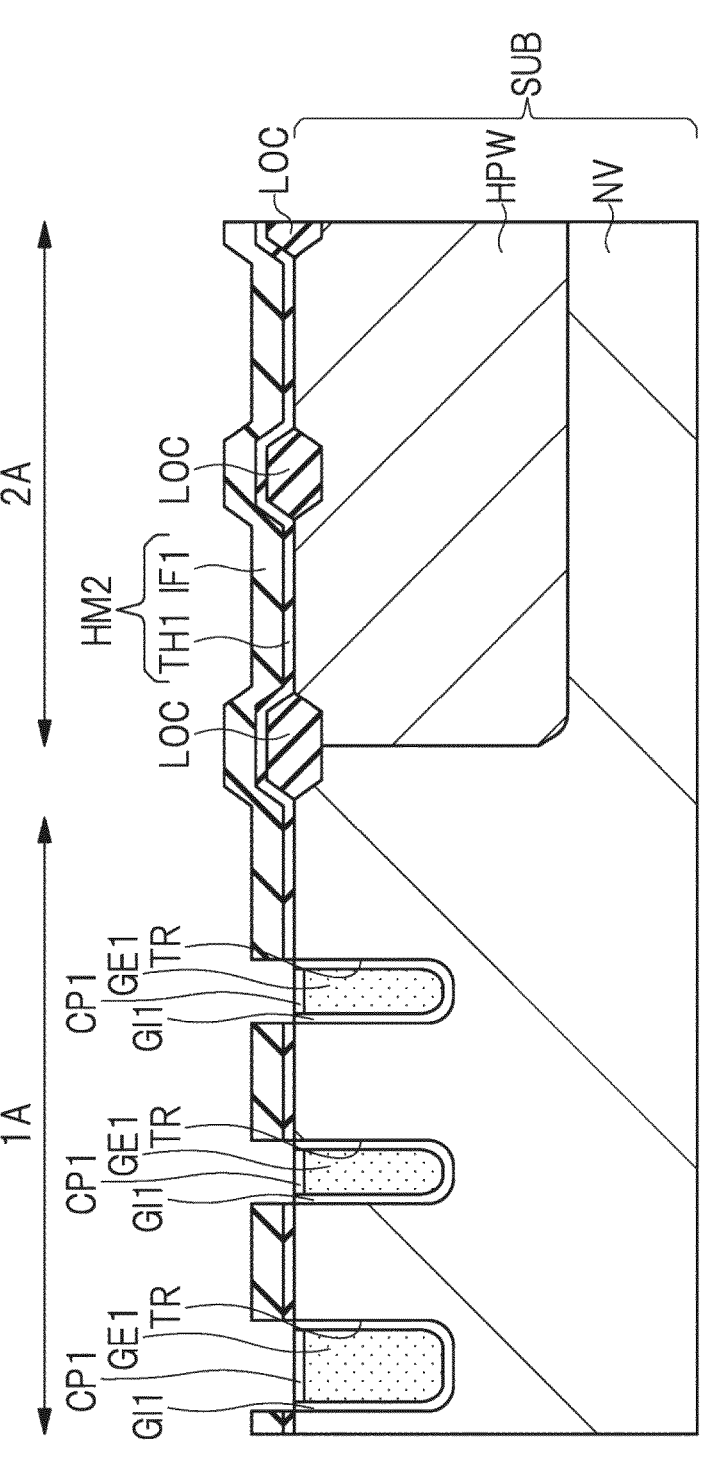
FIG. 20 is a cross-sectional view showing the manufac- turing process of a semiconductor device following FIG. 18.
Figure 21:
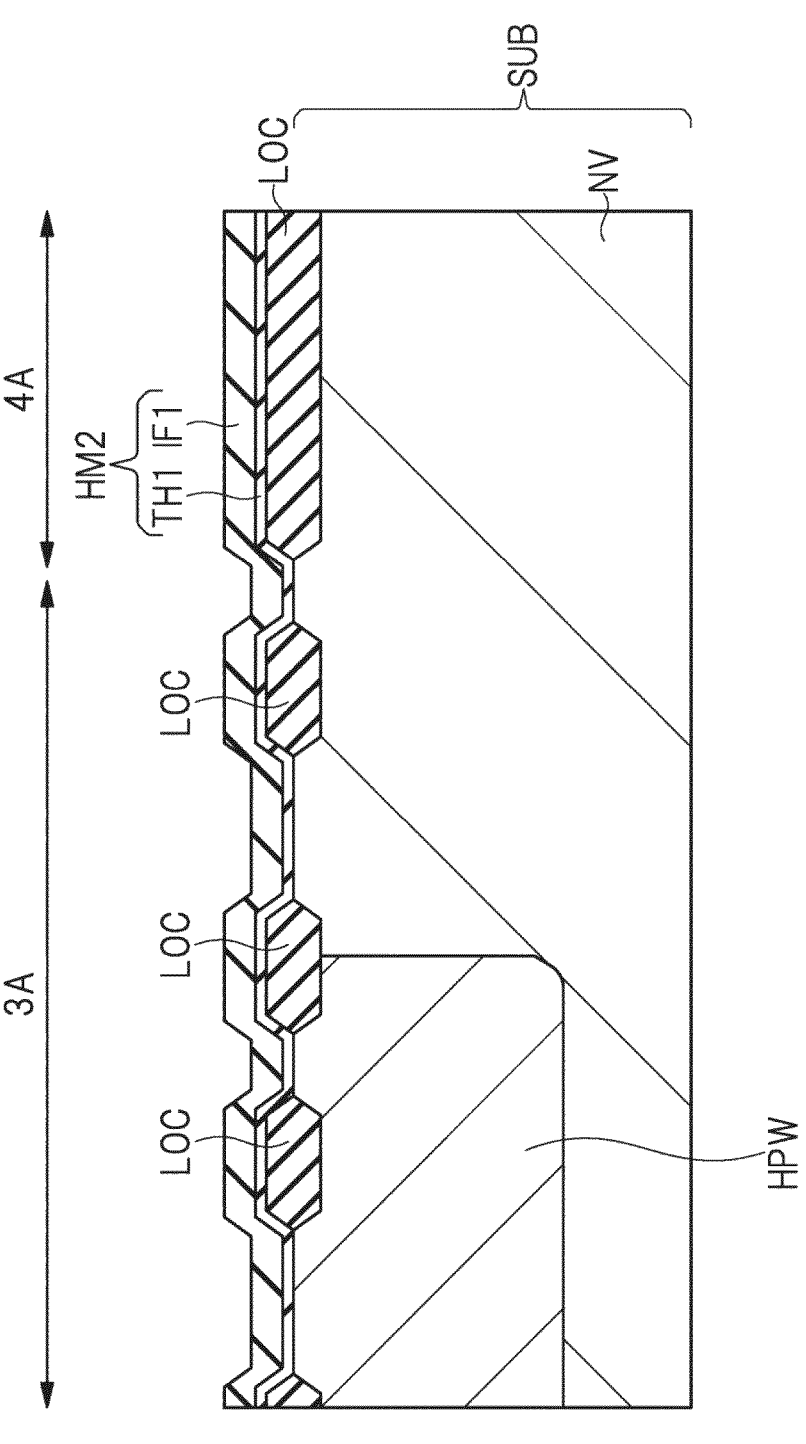
FIG. 21 is a cross-sectional view showing the manufac- turing process of a semiconductor device following FIG. 19.

As shown in FIGS. 20 and 21, a part of the gate-electrode GE1 is oxidized by a thermal oxidation treatment. As a result, a capping film CP1 made of an insulating film is formed on the upper surface of the gate-electrode GE1. That is, the capping film CP1 is a silicon oxide film formed by thermally oxidizing the upper surface of the polycrystalline silicon film.

Figure 22:
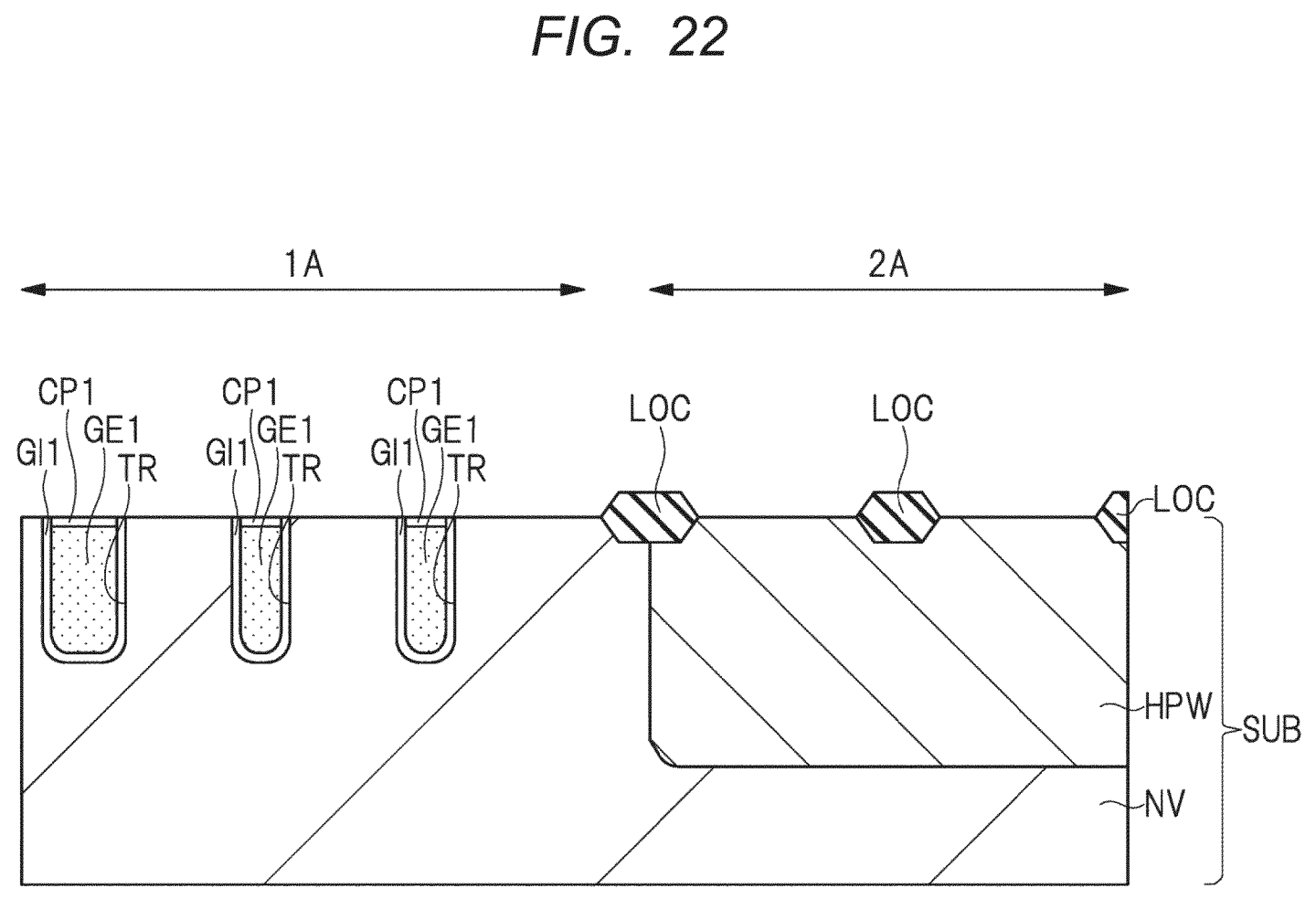
Figure 23:
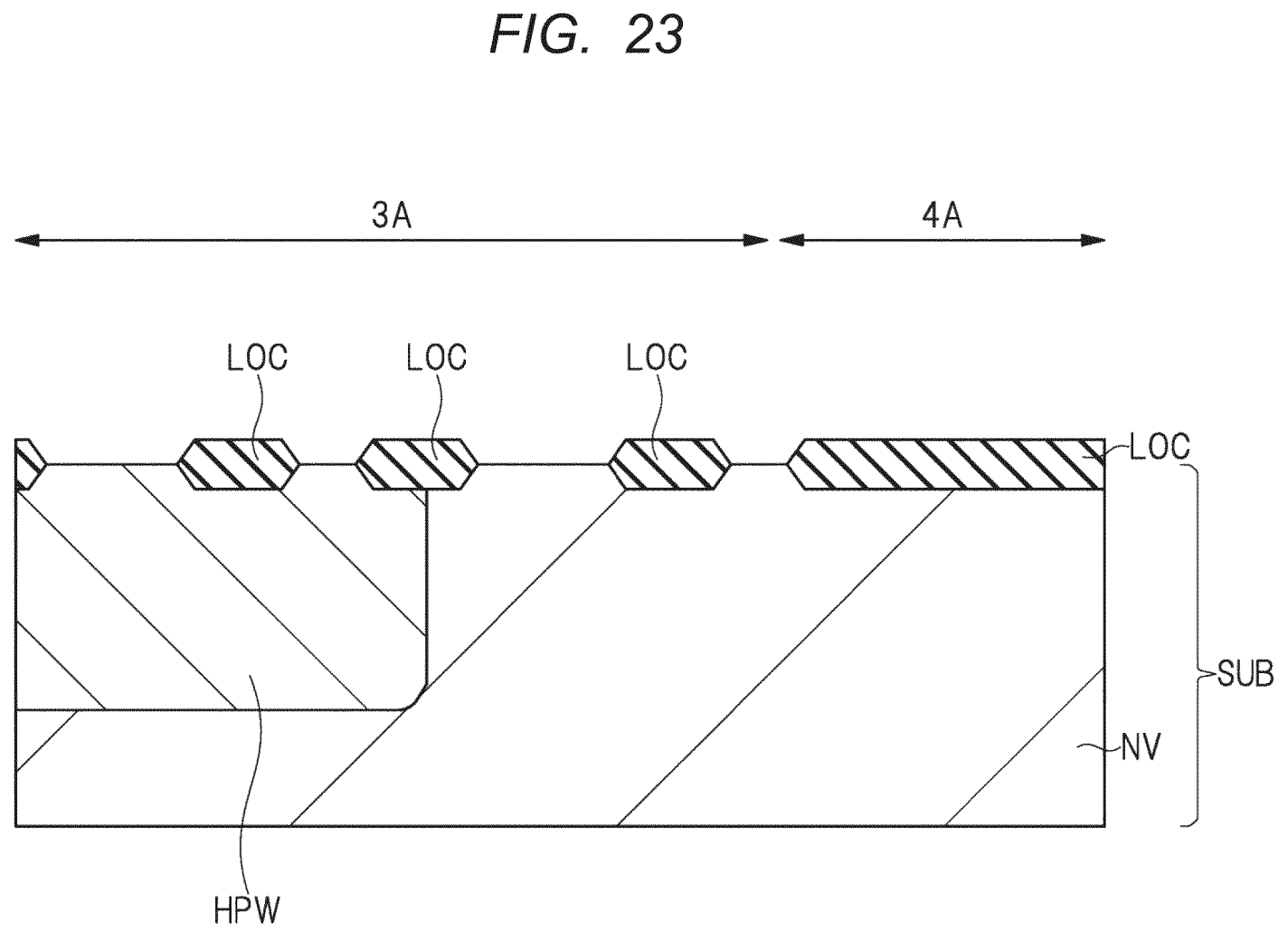

As shown in FIGS. 22 and 23, the hard mask HM2 is removed. First, the insulating film IF1 is removed by an isotropic etch process using an aqueous solution containing phosphoric acid. Next, the through-film TH1 is removed by performing a cleaning step using an aqueous solution containing hydrofluoric acid.

Figure 24:
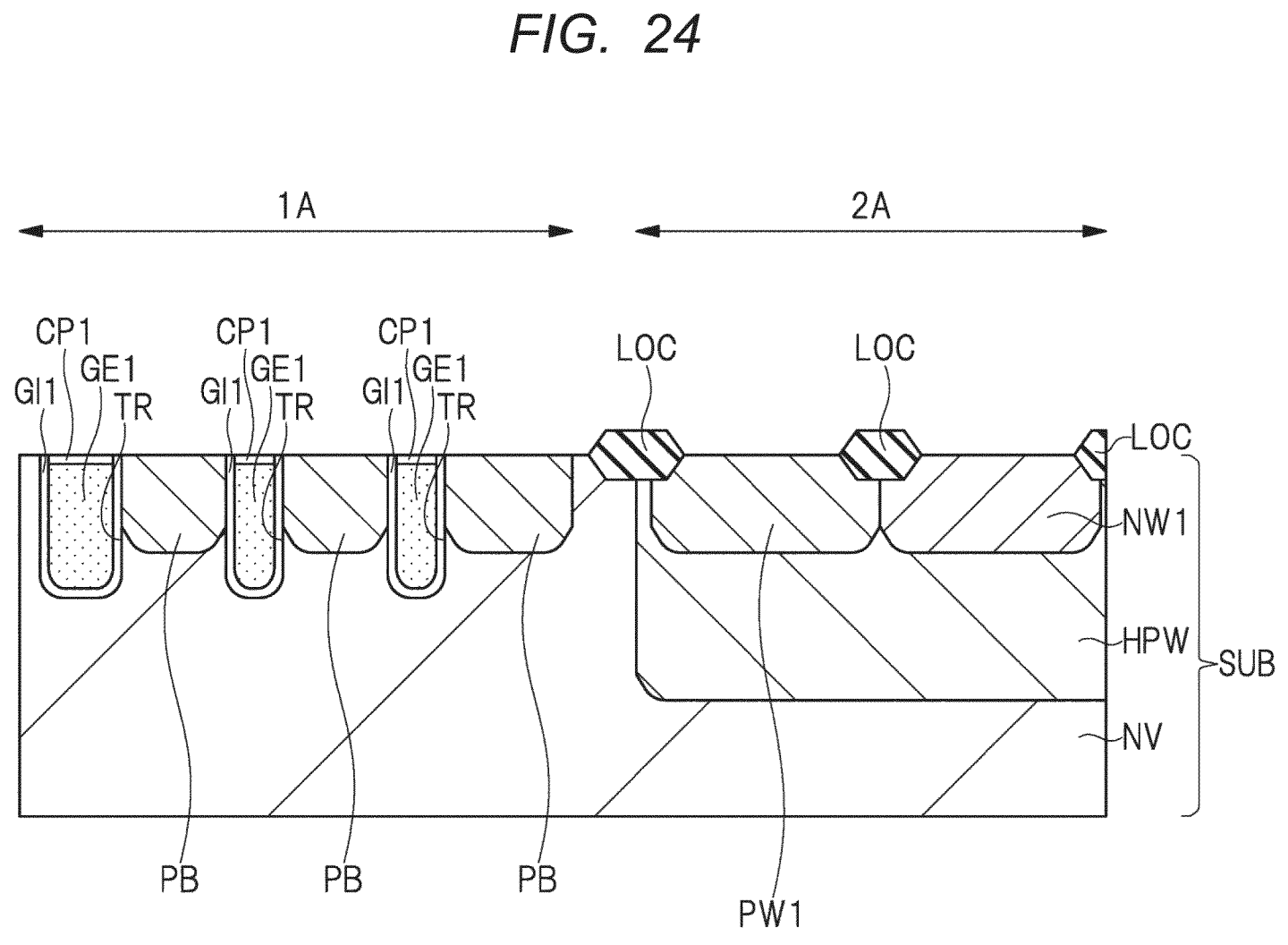
Figure 25:
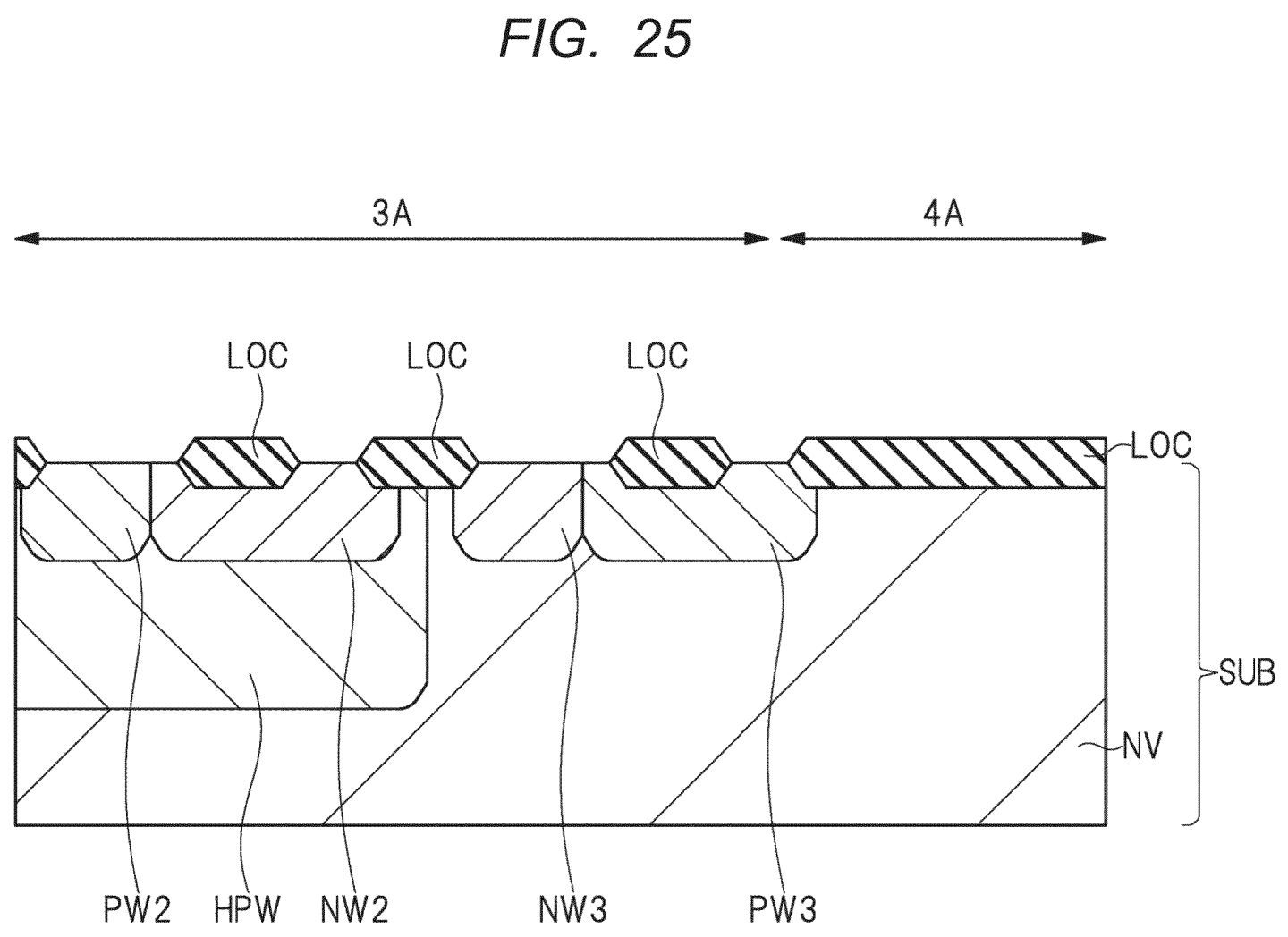

As shown in FIGS. 24 and 25, the respective impurity regions are selectively formed on the upper surface side of the semiconductor substrate SUB in the semiconductor substrate SUB of the regions 1A to 3A by using the photolithography technique and the ion-implantation method.

In the region 1A, a p-type body region PB is formed in the semiconductor substrate SUB so as to be shallower than the depth of the trench TR. In the region 2A, a p-type well region PW1 and an n-type well region NW1 are formed in the semiconductor substrate SUB. The well region PW1 and the well region NW1 are formed in the well region HPW. In the region 3A, a p-type well region PW2, an n-type well region NW2, a p-type well region PW3, and an n-type well region NW3 are formed in the semiconductor substrate SUB. The well region PW2 and the well region NW2 are formed in the well region HPW.

Although not illustrated here, a through film made of a silicon-oxide film is formed on the upper surface of the semiconductor substrate SUB prior to the ion-implantation. After the ion implantation, the through film is removed by a washing step using an aqueous solution containing hydrofluoric acid.

Figure 26:
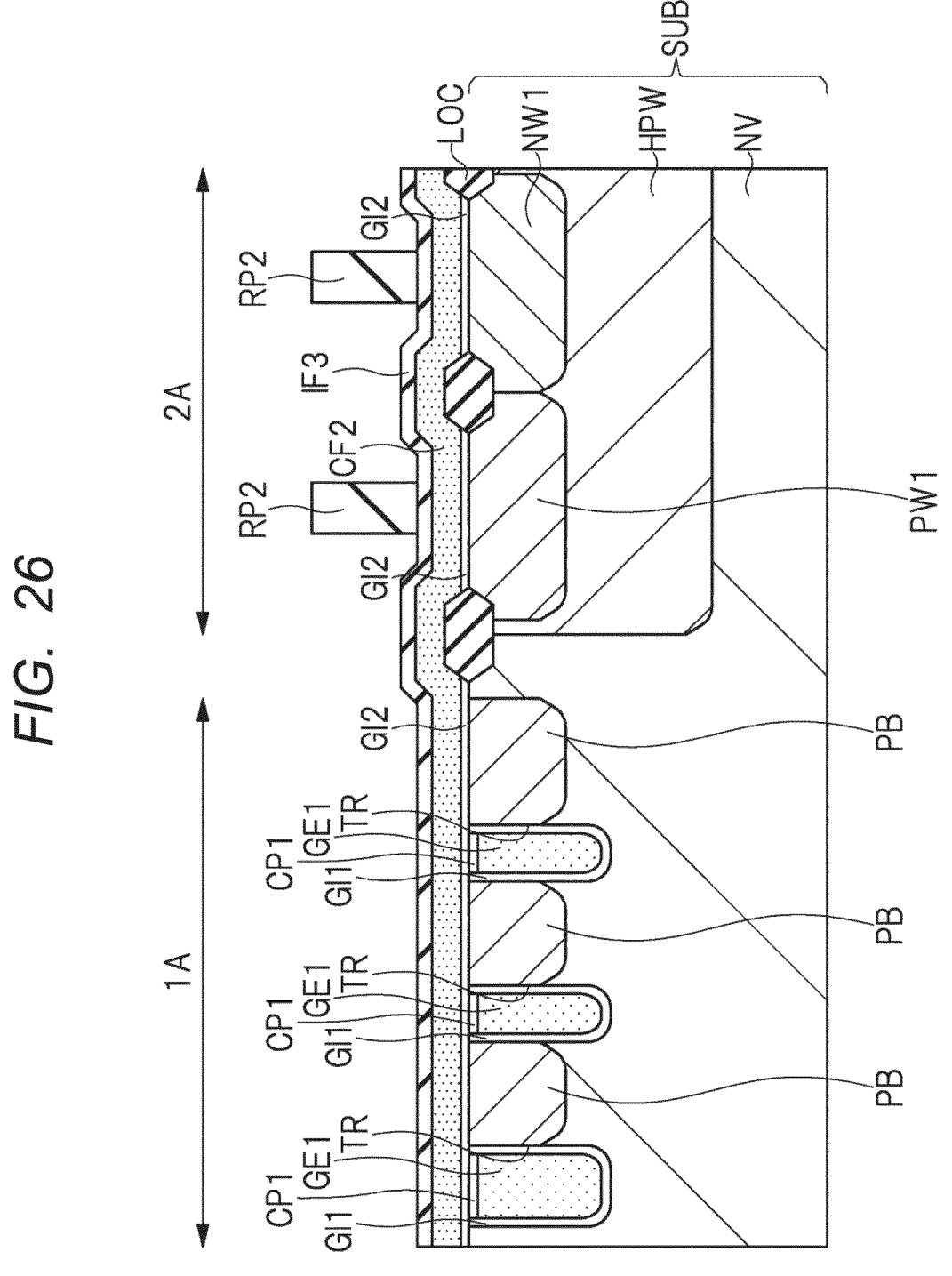
FIG. 26 is a cross-sectional view showing the manufac- turing process of a semiconductor device following FIG. 24.
Figure 27:
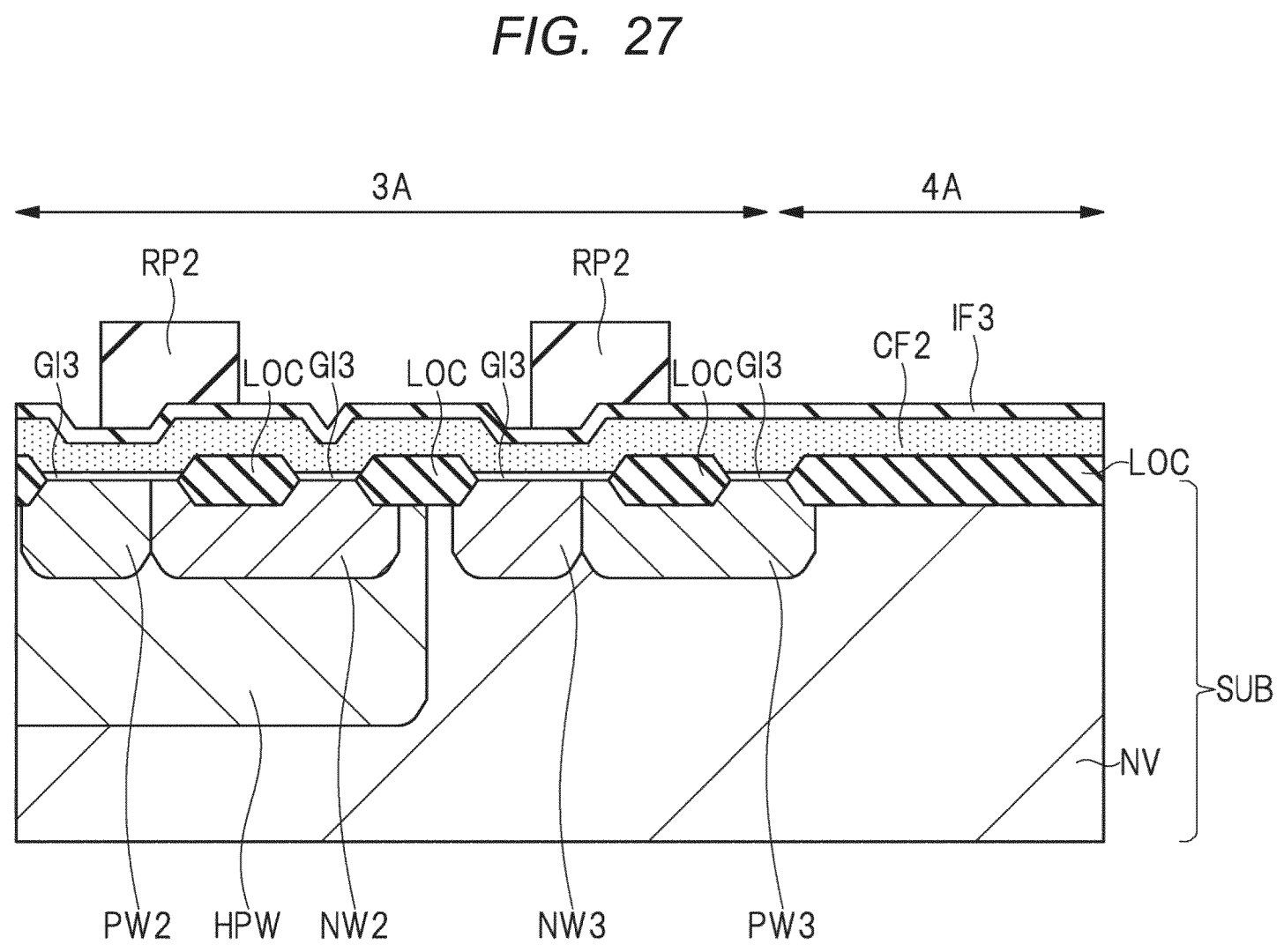

As shown in FIGS. 26 and 27, first, a gate insulating film made of a silicon-oxide film is formed on the upper surface of the semiconductor substrate SUB by thermal oxidation treatment. Here, the gate insulating film formed on the well region PW1 and the well region NW1 of the region 2A is shown as the gate insulating film GI2. In addition, a gate insulating film formed on the well region PW2 in the area 3A, on the well region NW2, on the well region PW3 and on the well region NW3 is shown as the gate insulating film GI3.

Next, a conductive film CF2 is formed on the gate insulating film GI2, the gate insulating film GI3, and the capping film CP1. The material contained in the conductive film CF2 has a sheet resistance higher than the sheet resistance of the material contained in the conductive film CF1 (gate-electrode GE1). The conductive film CF2 is, for example, a laminated film of an n-type polycrystalline silicon film formed by a CVD method and a tungsten silicide film formed by a CVD method.

Next, an insulating film IF3 made of a silicon oxide film is formed on the conductive film CF2 by, for example, a CVD method. Next, a resist pattern RP2 is formed on the insulating film IF3 so as to selectively cover a part of the region 2A and a part of the region 3A.

Figure 28:
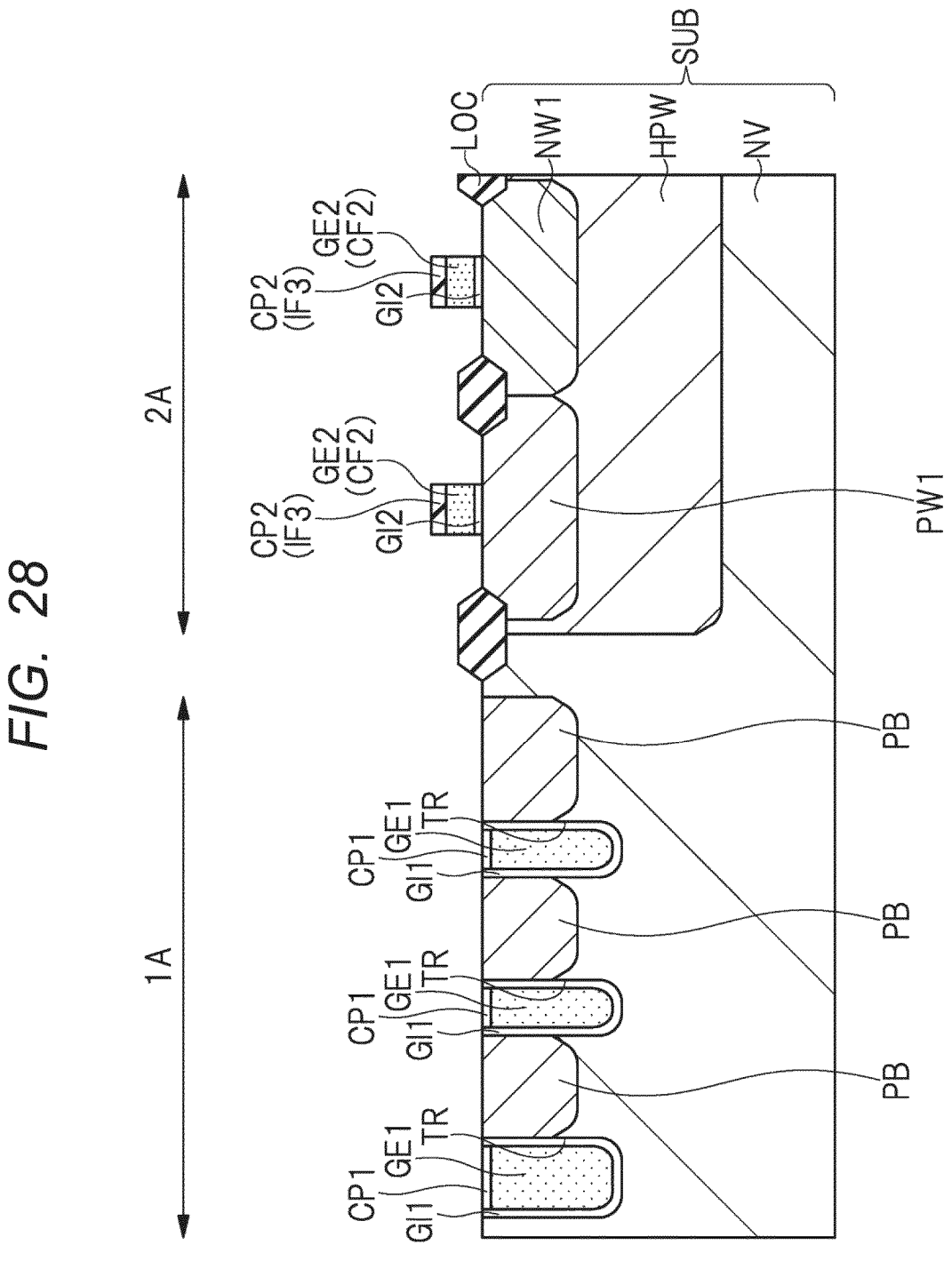
FIG. 28 is a cross-sectional view showing the manufac- turing process of a semiconductor device following FIG. 26.
Figure 29:
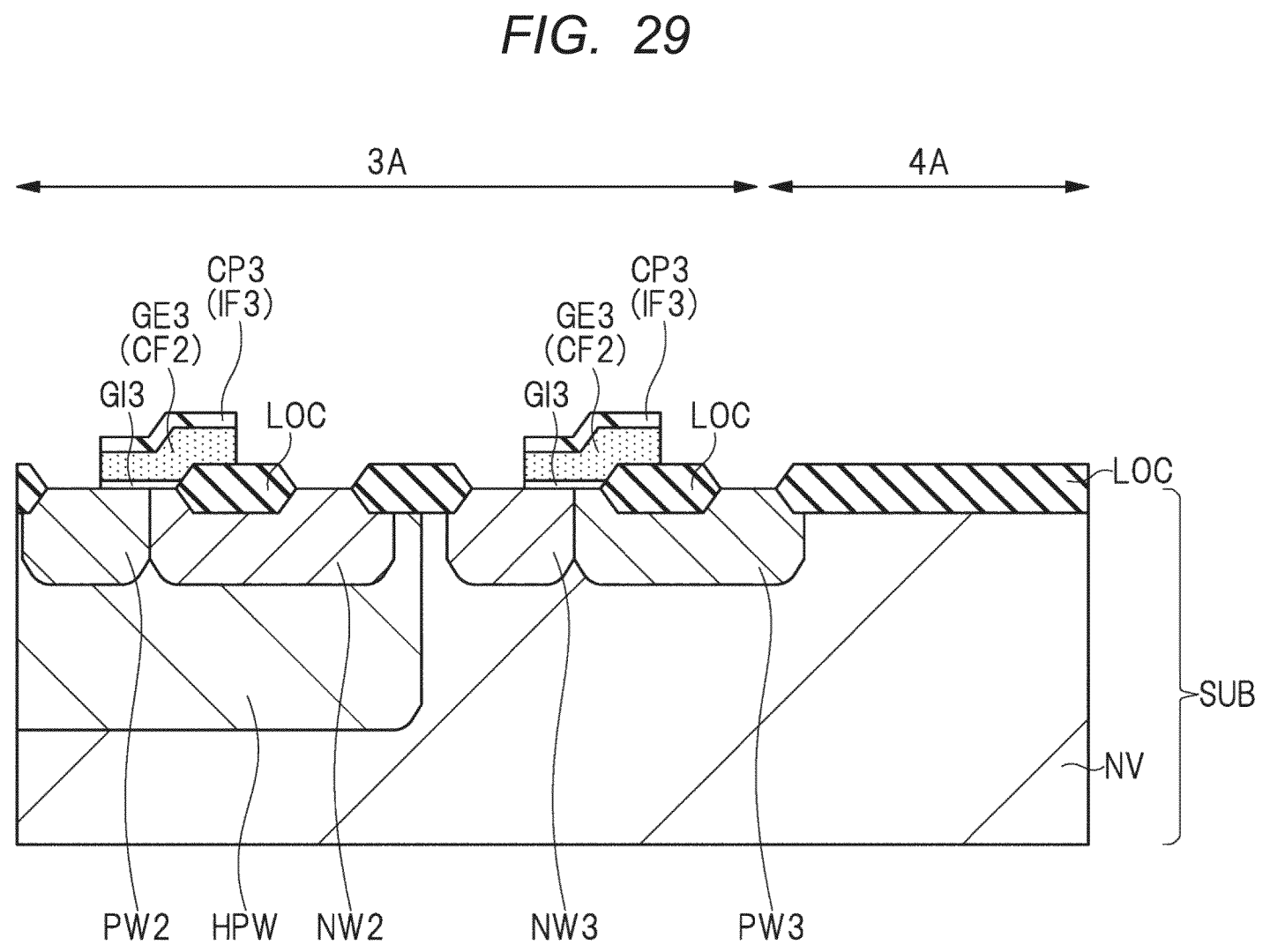

As shown in FIGS. 28 and 29, the insulating film IF3 and the conductive film CF2 are patterned by performing an anisotropic etch process using the resist pattern RP2 as a mask. As a result, the insulating film IF3 and the conductive film CF2 not covered with the resist pattern RP2 are removed. Then, the gate-electrode GE2 and the cap-film CP2 are formed on the upper surface of the semiconductor substrate SUB of the region 2A via the gate insulating film GI2. A gate-electrode GE3 and a cap-film CP3 are formed on the upper surface of the semiconductor substrate SUB of the region 3A via the gate insulating film GI3. Next, the resist pattern RP2 is removed by ashing.

Thereafter, the exposed gate insulating films GI2, GI3 are removed from the gate-electrodes GE2, GE3 by a cleaning step using an aqueous solution containing hydrofluoric acid.

Here, the features of the first embodiment in the manufacturing steps from FIGS. 16 and 17 to 28 and 29 will be described. Those features will be described by comparing with examined examples 1 to 3 with reference to FIGS. 54 to 65. Note that examined examples 1 to 3 are not conventional techniques, but are new findings obtained by the inventors of the present disclosure through studies.

Figure 54:
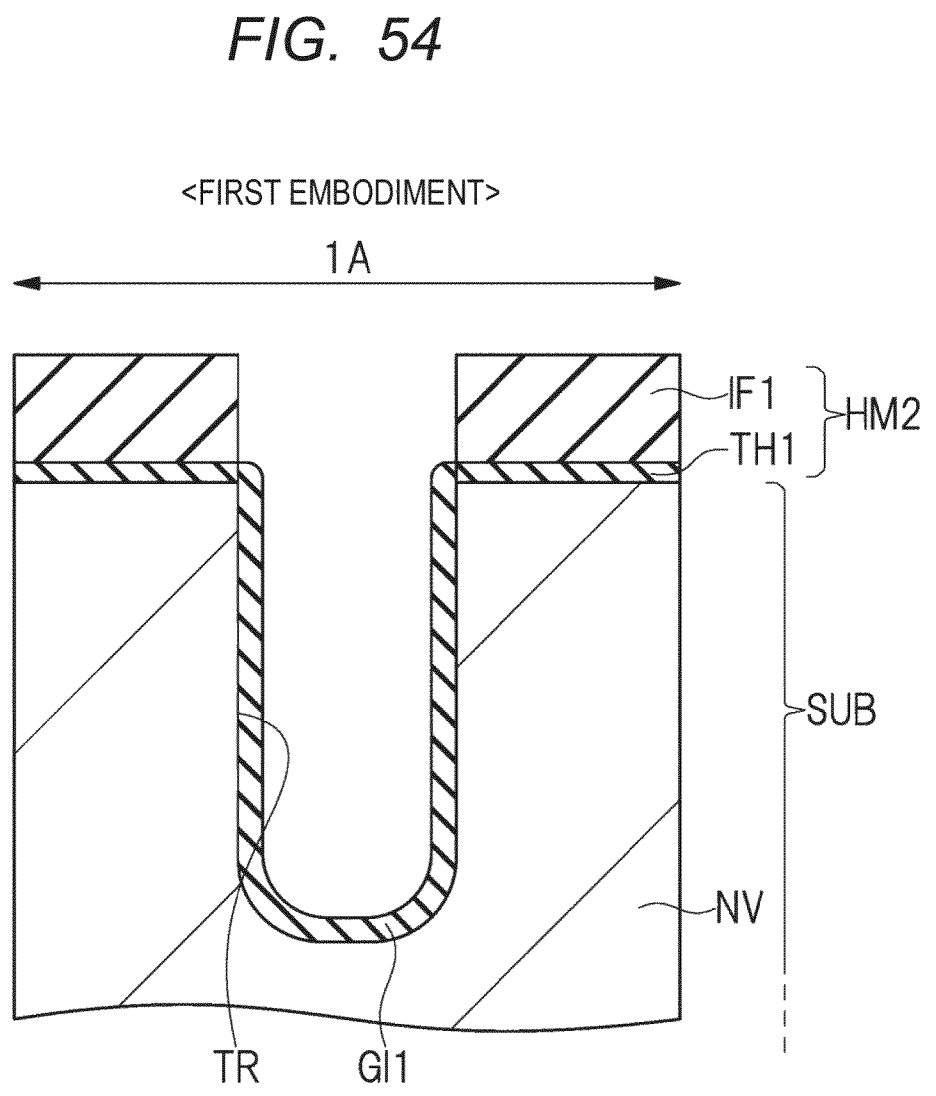
Figure 55:
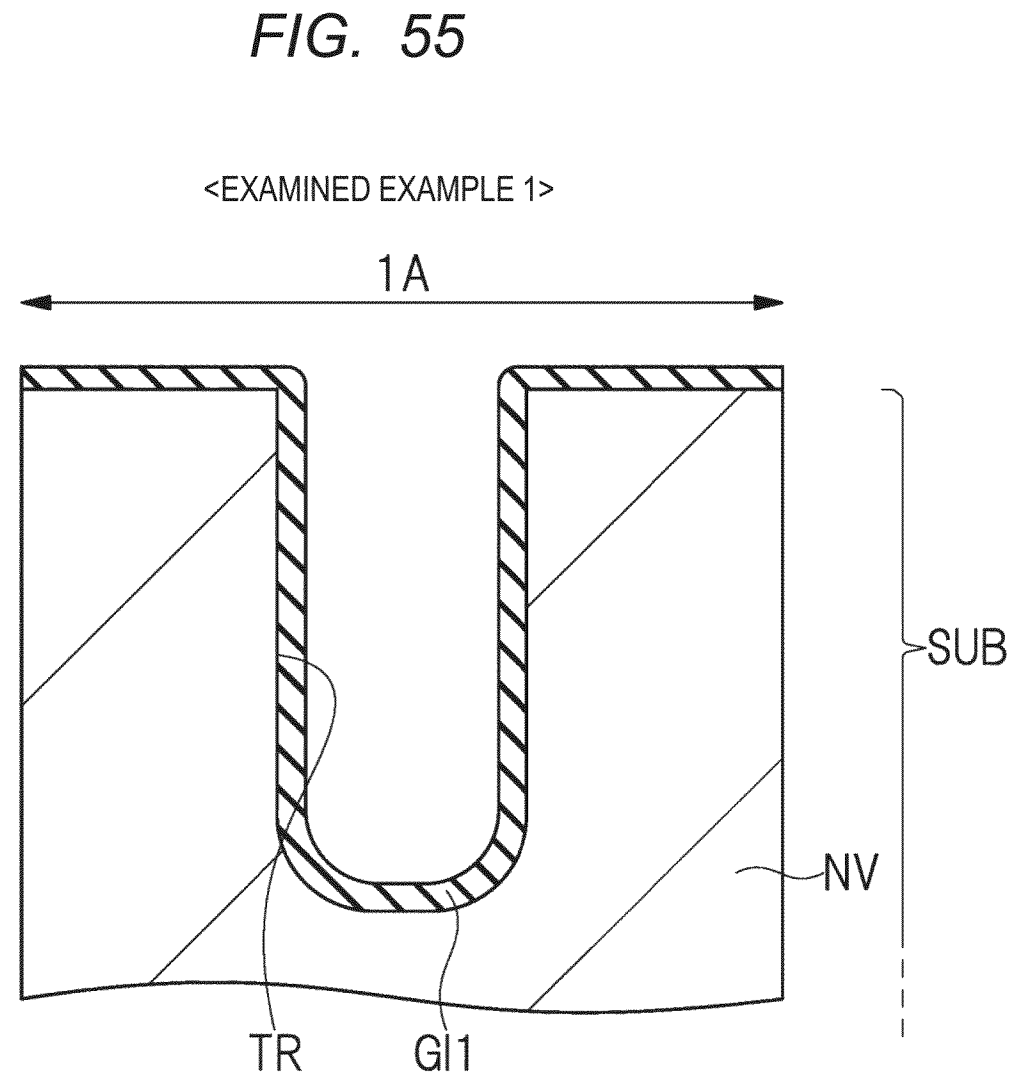

FIG. 54 and FIG. 55 show the state immediately after the gate insulating film GI1 is formed. In the examined example 1, the hard mask HM2 is removed and the gate insulating film GI1 is formed in that state, while in the first embodiment the hard mask HM2 is left and the gate insulating film GI1 is formed in that state.

Figure 56:
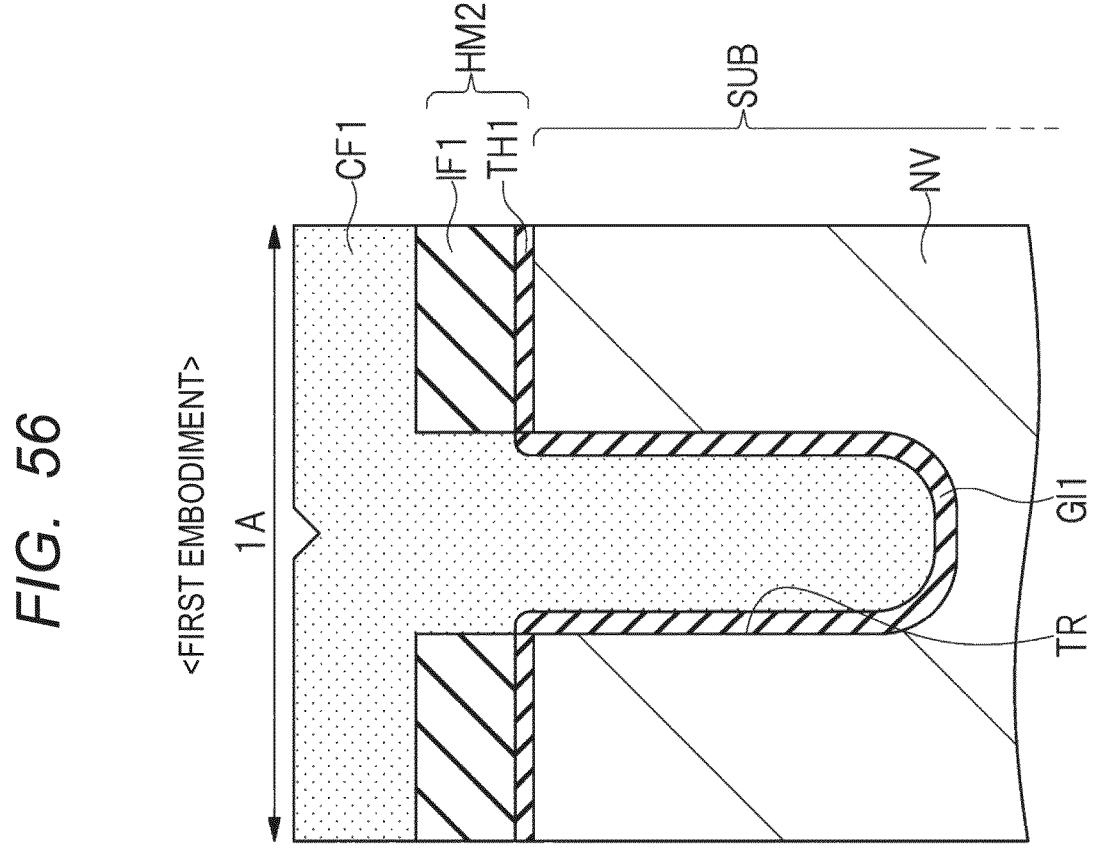
FIG. 56 is a main portion cross-sectional view showing a manufacturing process of a semiconductor device following FIG. 54.
Figure 57:
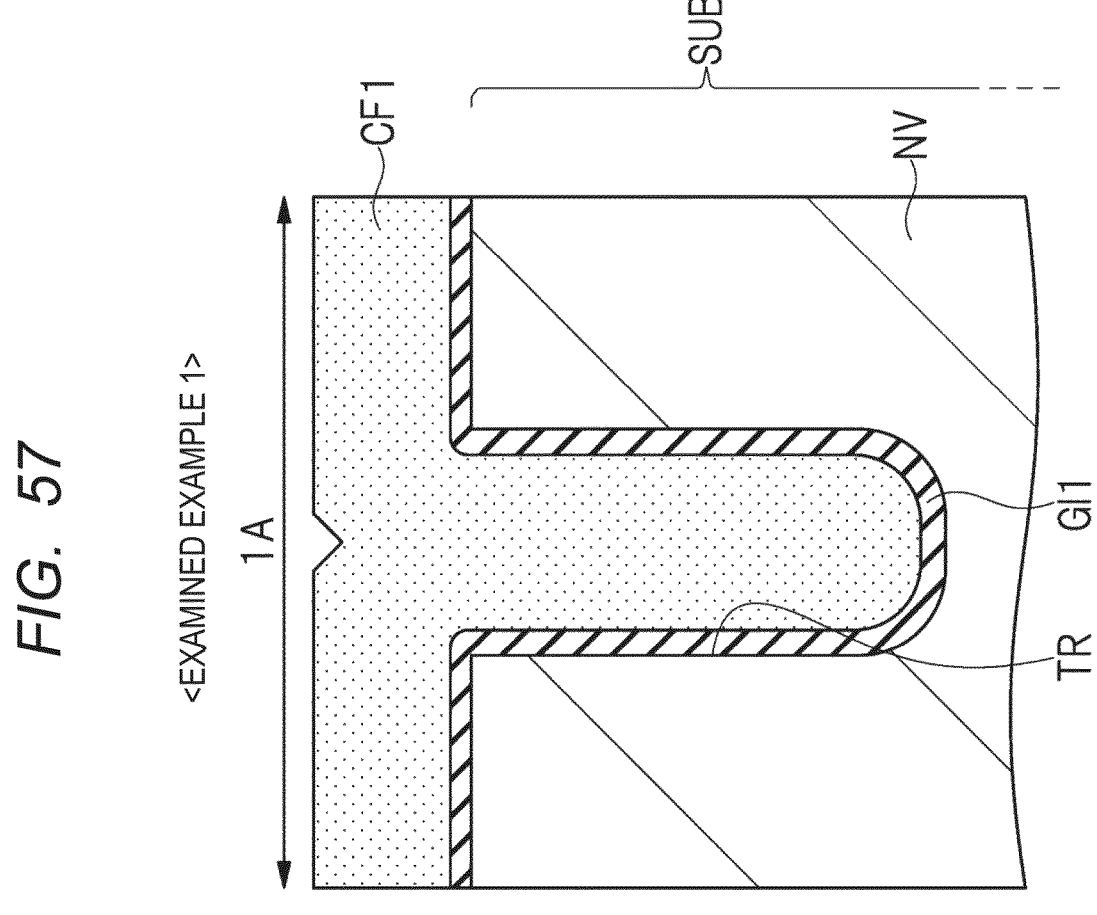
FIG. 57 is a main portion cross-sectional view showing a manufacturing process of a semiconductor device following FIG. 55.
Figure 58:
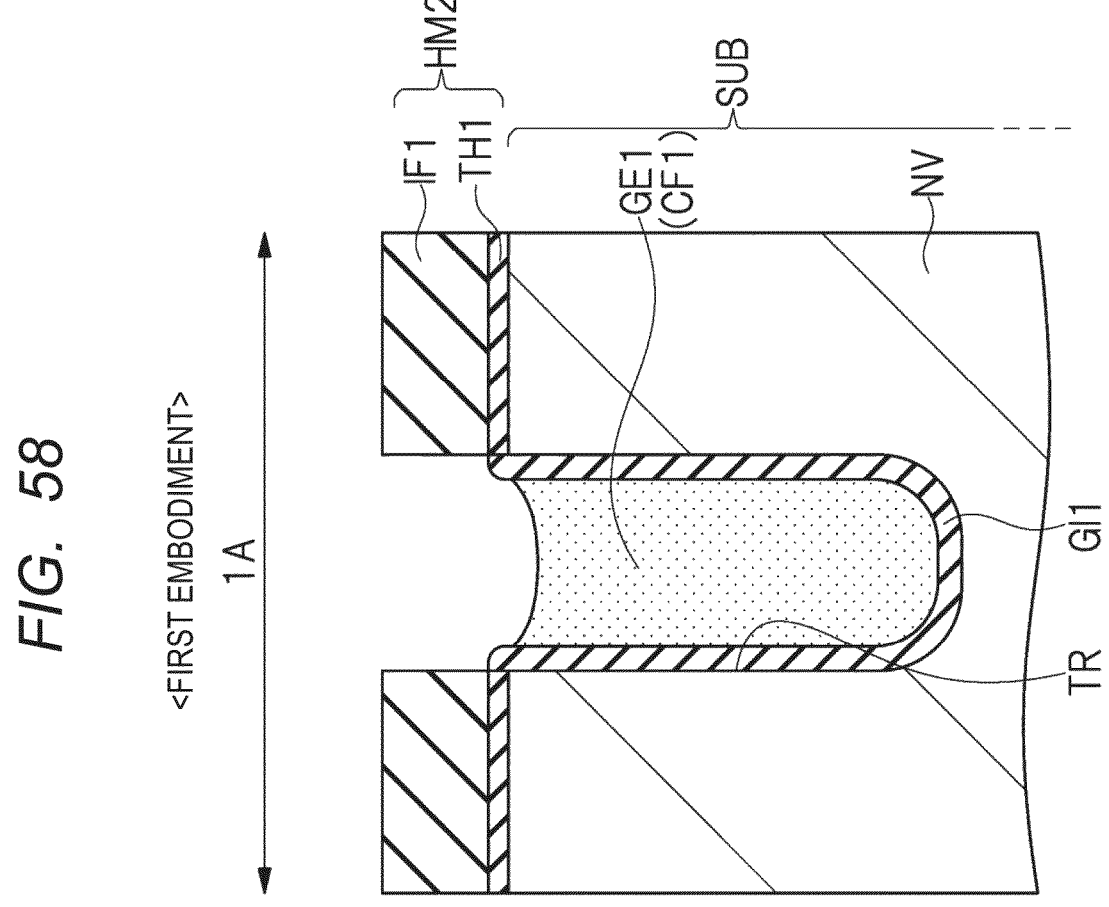
FIG. 58 is a main portion cross-sectional view showing a manufacturing process of a semiconductor device following FIG. 56.
Figure 59:
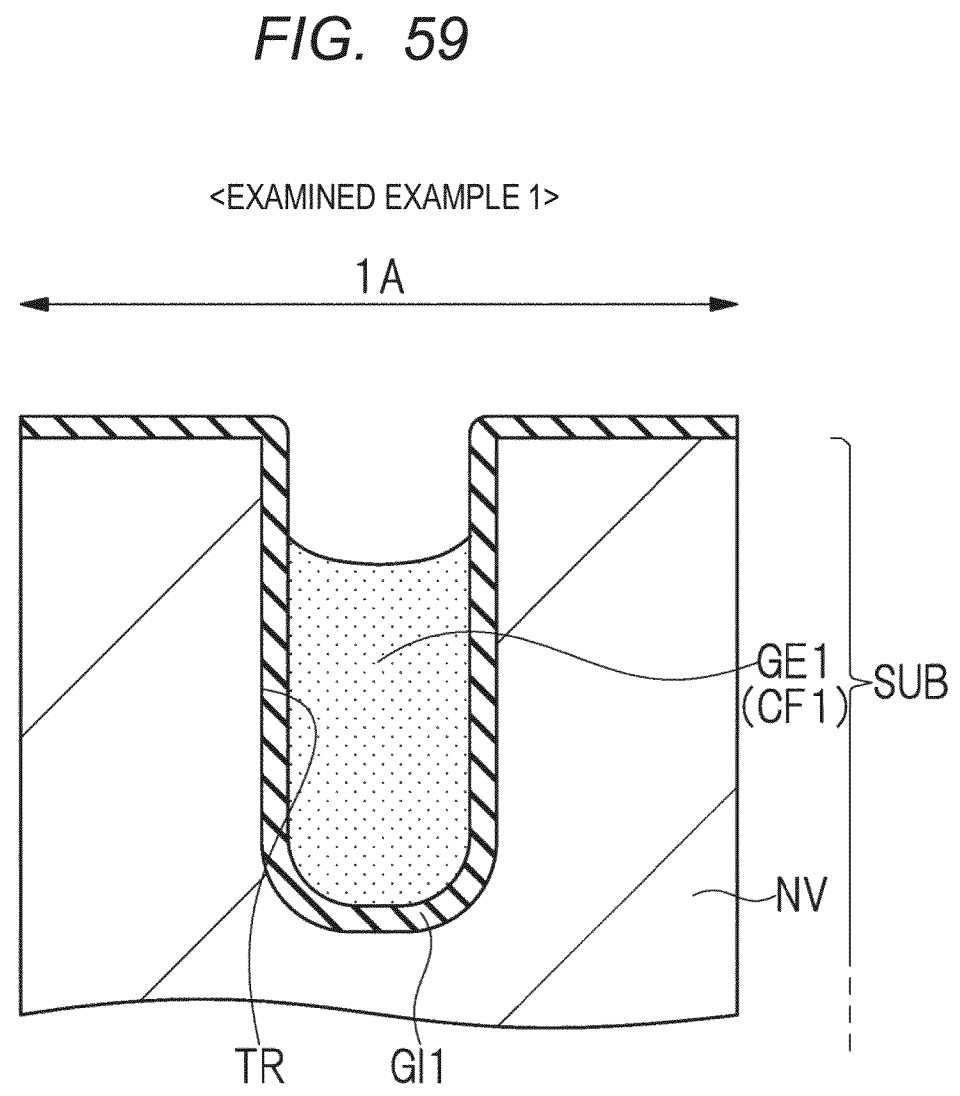

Next, as shown in FIGS. 56 and 57, a conductive film CF1 is formed so as to fill the inside of the trench TR. Next, as shown in FIGS. 58 and 59, an anisotropic etch process is performed on the conductive film CF1 to remove the conductive film CF1 outside the trench TR and to retract the conductive film CF1 inside the trench TR. The conductive film CF1 left in the trench TR becomes the gate-electrode GE1.

At this point, the position of the upper surface of the conductive film CF1 of the examined example 1 is significantly lower than the position of the upper surface of the semiconductor substrate SUB. On the other hand, the position of the upper surface of the conductive film CF1 of the first embodiment is slightly lower than the position of the upper surface of the semiconductor substrate SUB, but is closer to the upper surface of the semiconductor substrate SUB by the thickness of the hard mask HM2.

Figure 60:
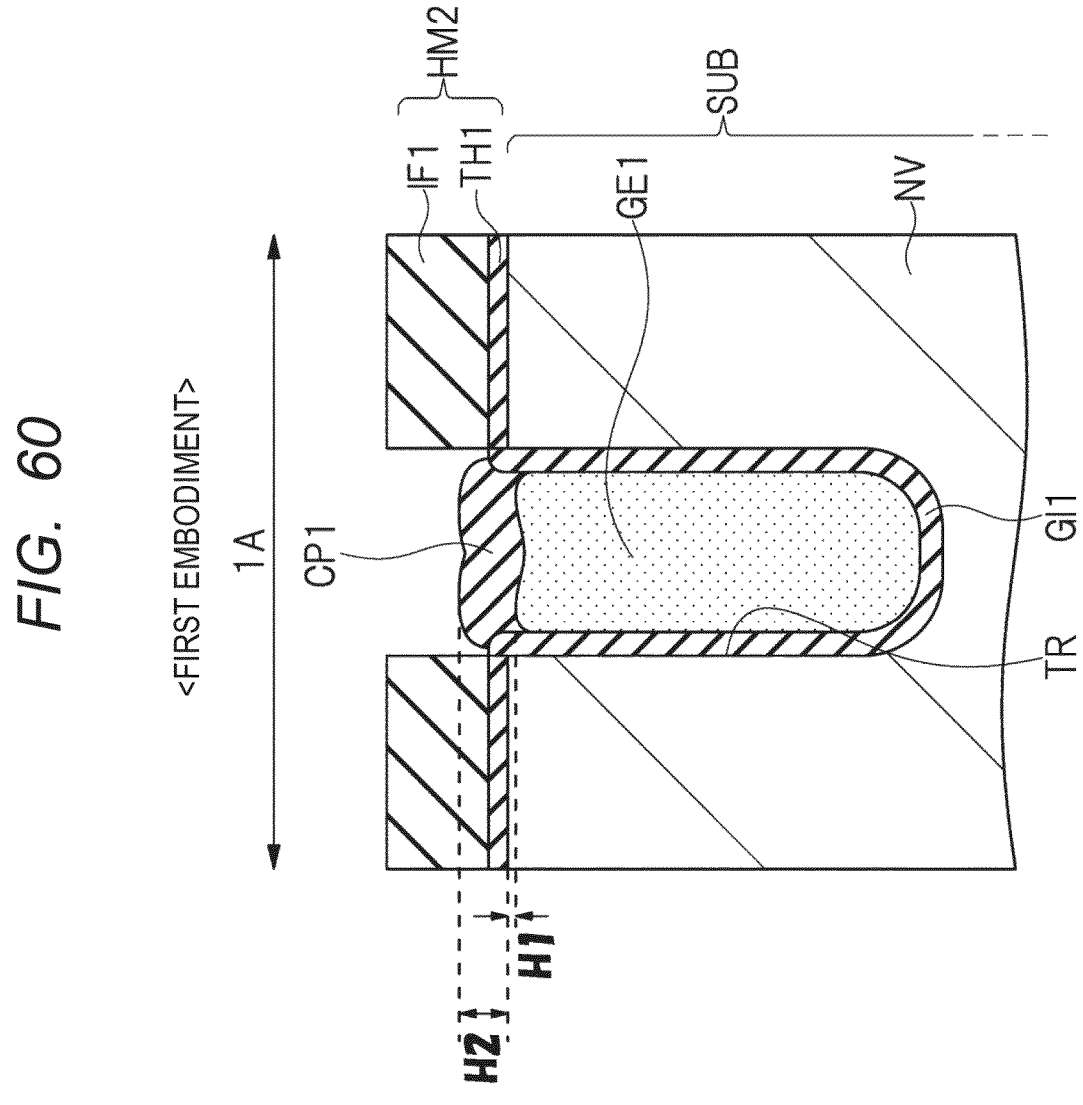
FIG. 60 is a main portion cross-sectional view showing a manufacturing process of a semiconductor device following FIG. 58.
Figure 61:
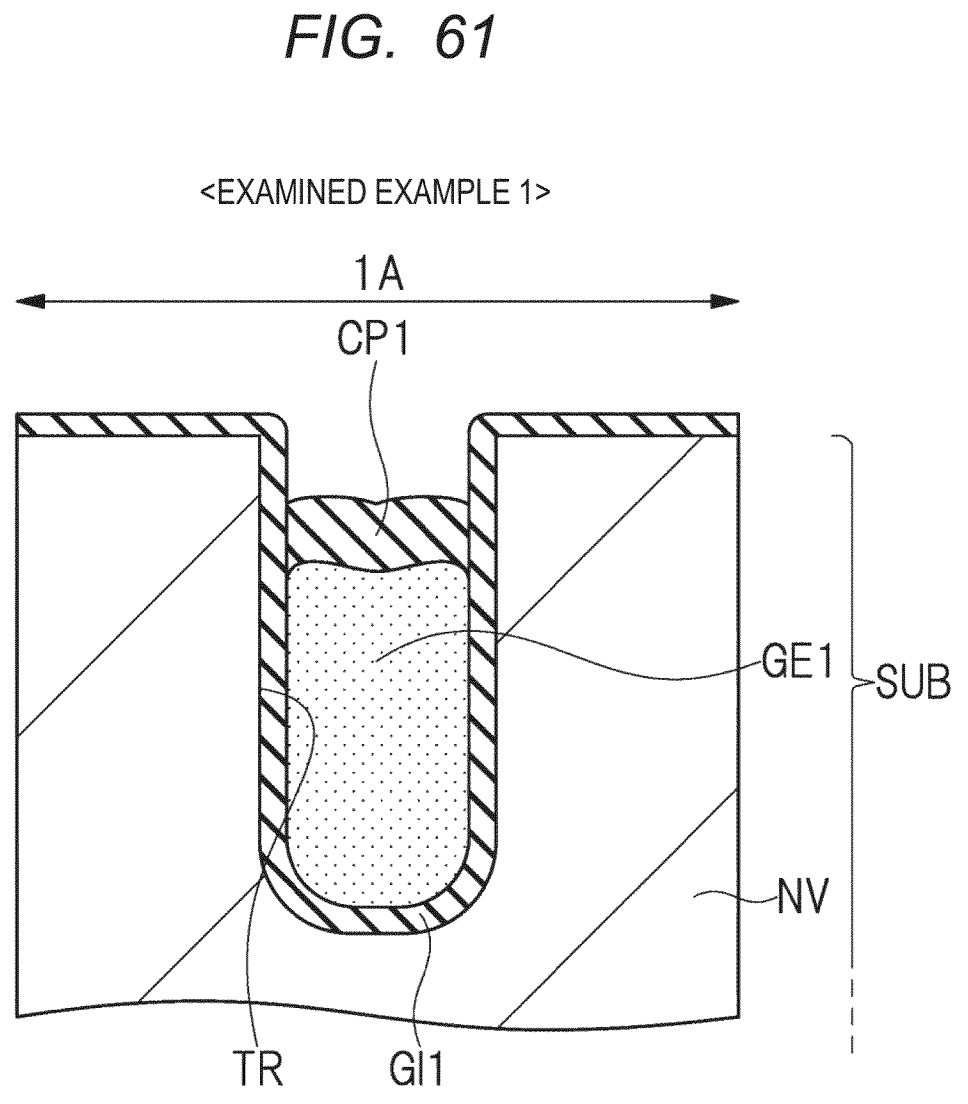

Next, as shown in FIGS. 60 and 61, a capping film CP1 is formed on the upper surface of the conductive film CF1 by thermal oxidation treatment. At this point, the position of the upper surface of the capping film CP1 of the examined example 1 is lower than the position of the upper surface of the semiconductor substrate SUB.

On the other hand, the position of upper surface of the conductive film CF1 of the first embodiment is lower than the position of the upper surface of the semiconductor substrate SUB. The difference in these positions is shown as height H1. In addition, the position of the upper surface of the capping film CP1 of the first embodiment is higher than the position of the upper surface of the semiconductor substrate SUB. The difference in these positions is shown as height H2. In other words, the upper surface of the semiconductor substrate SUB is located within the scope of the thickness of the capping film CP1. In addition, the thickness of the capping film CP1 is larger than the thickness of the gate insulating film GI1.

Figure 62:
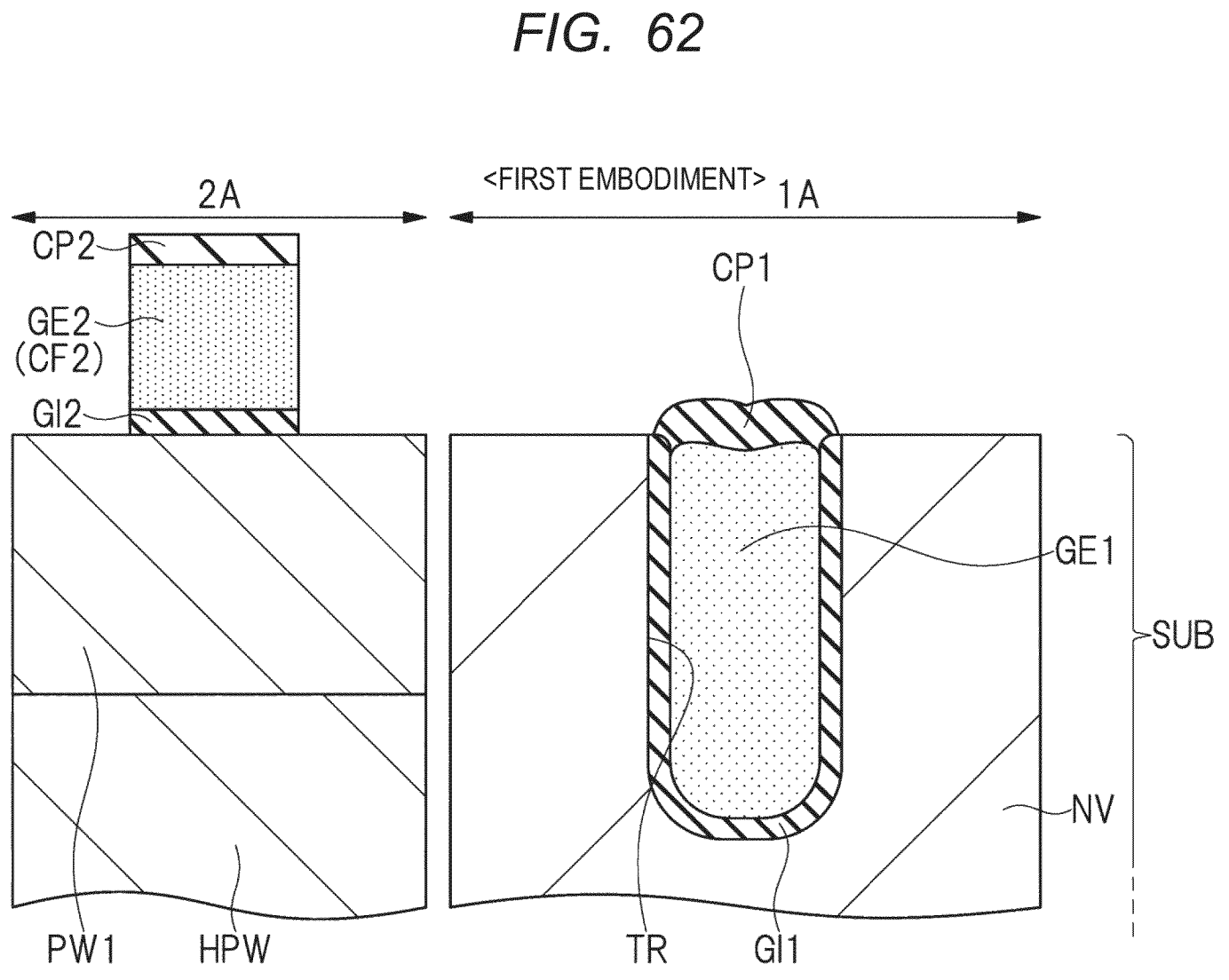
Figure 63:
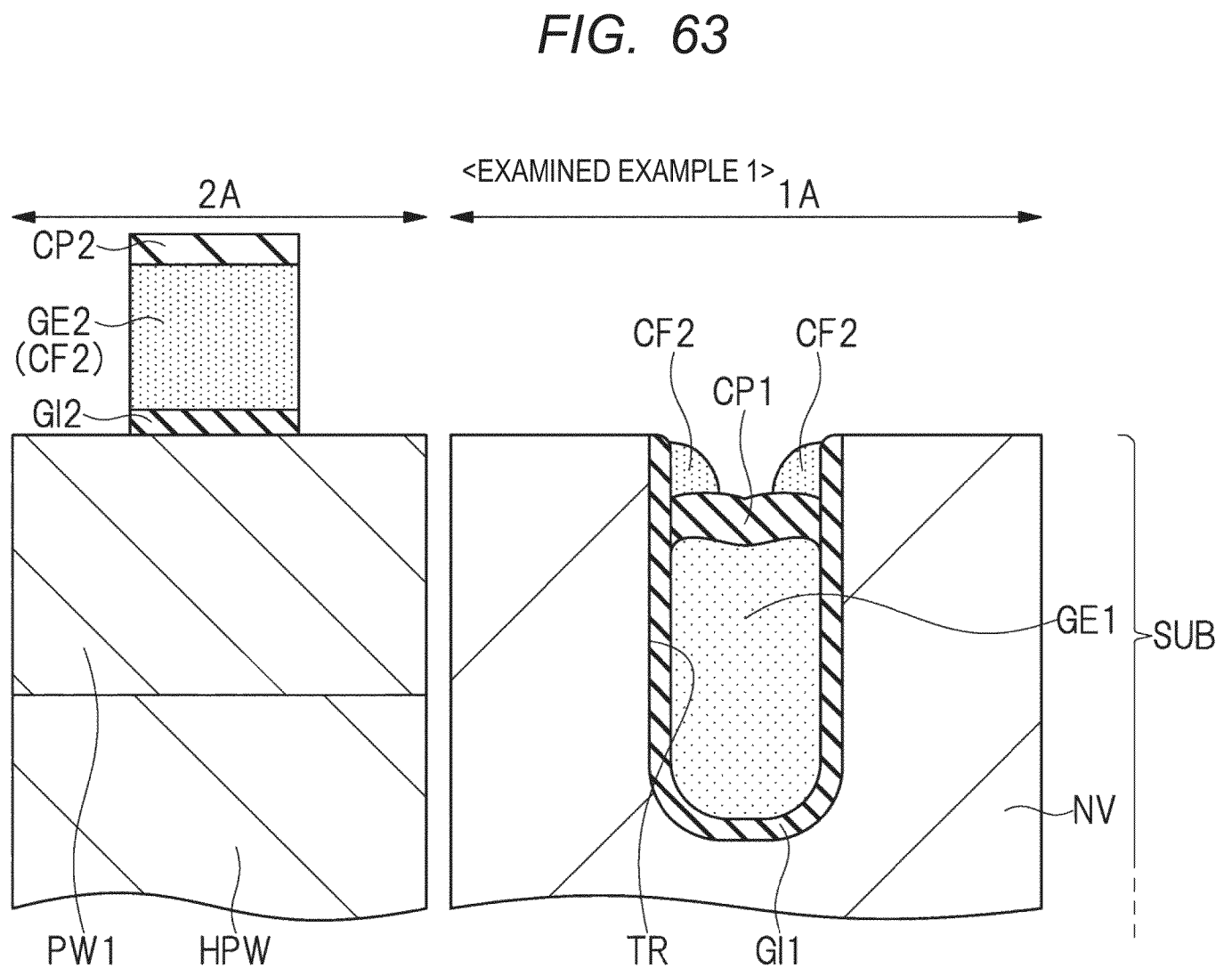

FIG. 62 and FIG. 63 show that the conductive film CF2 is patterned by removing the hard mask HM2, forming a conductive film CF2 and the like, and then performing an anisotropic etch process. Here, in the examined example 1, since the position of the upper surface of the capping film CP1 is lower, there is a problem that the conductive film CF2 is left as a sidewall-like residue inside the trench TR.

Such a residue is, for example, an obstacle in forming the hole CH2 to the gate-electrode GE1, and is a factor that the hole CH2 is not normally formed. In addition, there is a possibility that the residue is peeled off and scattered during the respective manufacturing processes, and there is a possibility that the residue is left as a foreign substance on the semiconductor substrate SUB. Therefore, the reliability of semiconductor device 100 is reduced or the yield is reduced. On the other hand, in the first embodiment, the generation of such a residue can be suppressed.

Figure 64:
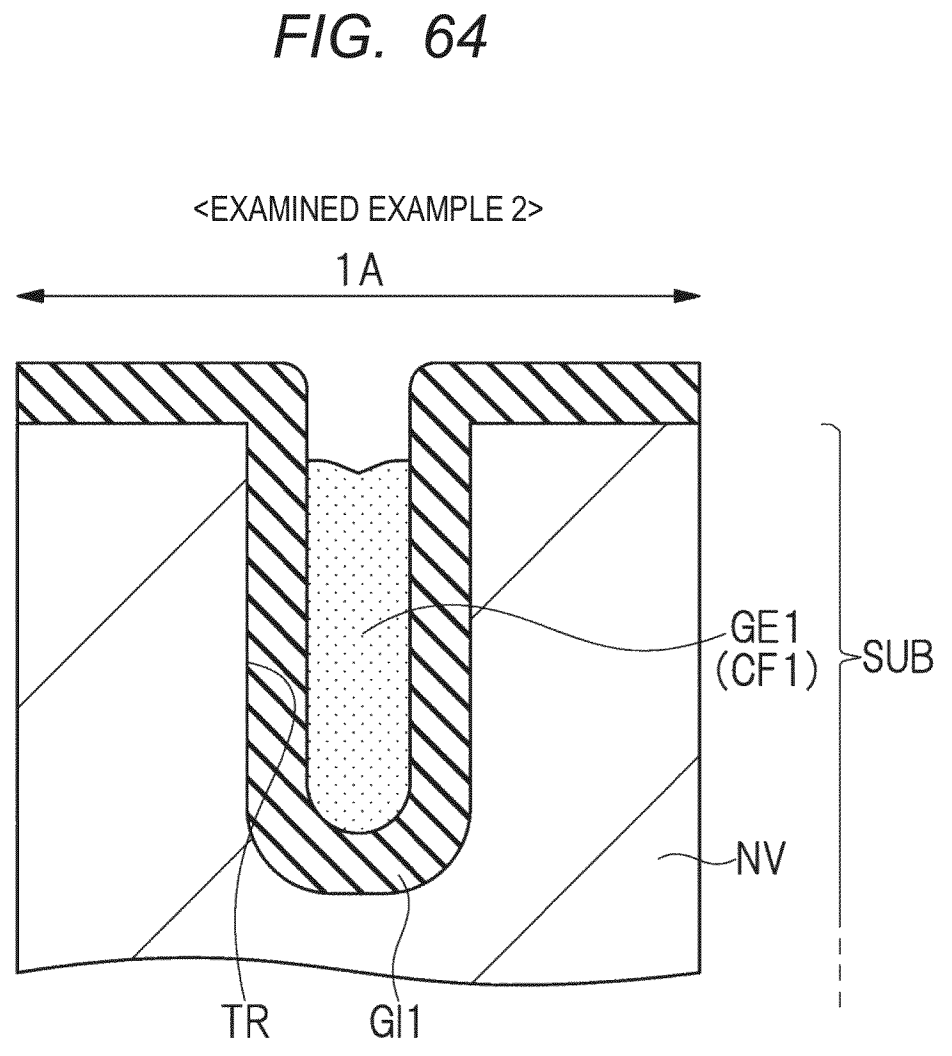
Figure 65:
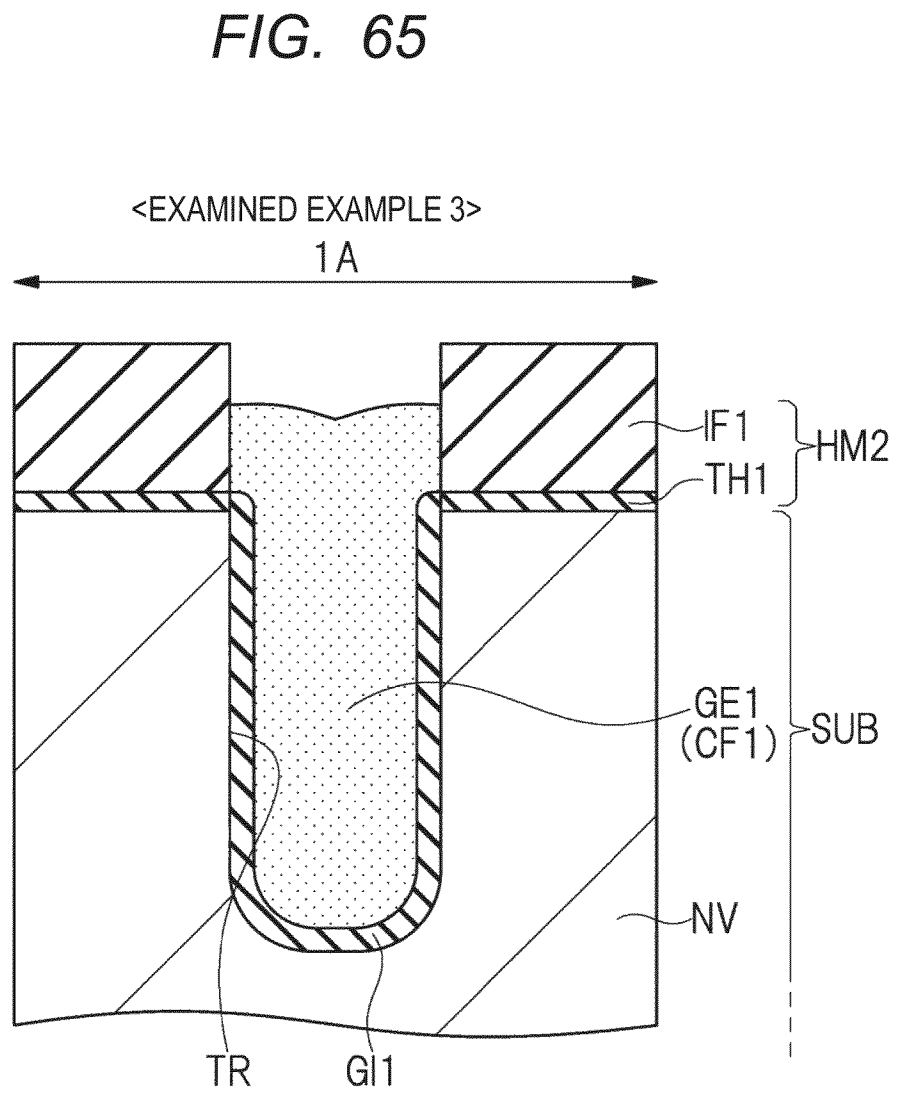

It is also conceivable to take measures such as the examined example 2 in FIG. 64 and the examined example 3 in FIG. 65 in order to suppress generation of residue.

In the examined example 2, by increasing the thickness of the gate insulating film GI1, the position of the upper surface of the gate-electrode GE1 can be made close to the upper surface of the semiconductor substrate SUB even when the receding amounts of the conductive film CF1 are the same. However, as the thickness of the gate insulating film GI1 increases, the on-state current hardly flows. That is, since the on-resistance is increased, the performance of the semiconductor device 100 is degraded.

In the examined example 3, by increasing the thickness of the hard mask HM2 (the thickness of the insulating film IF1), the position of the upper surface of the gate-electrode GEL is higher than the position of the upper surface of the semiconductor substrate SUB even when the receding amounts of the conductive film CF1 are the same. In this case, generation of a residue inside the trench TR can be suppressed.

However, if an anisotropic etch process is performed on the conductive film CF2 after the hard mask HM2 is removed, a sidewall-like conductive film CF2 is left as a residue on the side surface of the protruding gate-electrode GE1. This residue may also become a foreign matter on the semiconductor substrate SUB. If the residue remains on the side surface of the protruding gate electrode GE1, the residue may become a leak path between the gate electrode GEL and the source area NS.

The first embodiment has been devised in view of these issues occurring in the examined examples 1-3 and can suppress the generation of residues caused by the conductive film CF2. In addition, since the thickness of the gate insulating film GI1 does not need to be adjusted, the on-resistance can be suppressed from increasing. That is, according to the first embodiment, it is possible to improve the reliability of the semiconductor device 100 while securing the performance of the semiconductor device 100, and to suppress a decrease in yield.

Incidentally, as described above, when the insulating film IF1, which is a silicon nitride film, is removed from the hard mask HM2, an isotropic etch process using an aqueous solution containing phosphoric acid is used. At this time, the gate electrode GE1 is etched by phosphoric acid when the upper surface of the gate electrode GE1 is exposed. Such etching can be prevented by forming the capping film CP1 on the gate-electrode GE1.

Further, the capping film CP1 is formed by thermally oxidizing the upper surface of the gate electrode GE1 made of a polycrystalline silicon film, but as shown in FIG. 58, the upper portion of the gate electrode GEL is sharpened prior to the thermal oxidation treatment. Such a sharp position is a portion where electric field concentration is likely to occur and is likely to cause deterioration of local insulation resistance.

As shown in FIG. 60, the upper part of the gate-electrode GE1 is rounded by appropriately adjusting the duration of the thermal oxidizing treatment. Therefore, the electric field concentration in the upper portion of the gate-electrode GE1 can be suppressed. For example, by adjusting the duration of the thermal oxidation treatment so that the thickness of the capping film CP1 is equal to or greater than 40 nm and equal to or less than 60 nm, the upper portion of the gate-electrode GEL is rounded to such an extent that electric field concentration can be suppressed. In other words, the thermal oxidizing treatment is preferably performed to such an extent that the thickness of the capping film CP1 is larger than the thickness (10 nm to 20 nm) of the gate insulating film GI1.

It is also conceivable that the upper surface of the gate-electrode GE1 is oxidized when the gate insulating film GI2 is formed without forming the capping-film CP1. However, since the thickness of the gate insulating film GI2 is, for example, greater than or equal to 10 nm and less than or equal to 20 nm, the upper portion of the gate-electrode GE1 may not be sufficiently rounded. In view of such a point, it is preferable to perform the thermal oxidizing treatment to such an extent that the thickness of the capping film CP1 is larger than the thickness of the gate insulating film GI2.

Hereinafter, the manufacturing steps of FIGS. 28 and 29 will be described.

Figure 30:
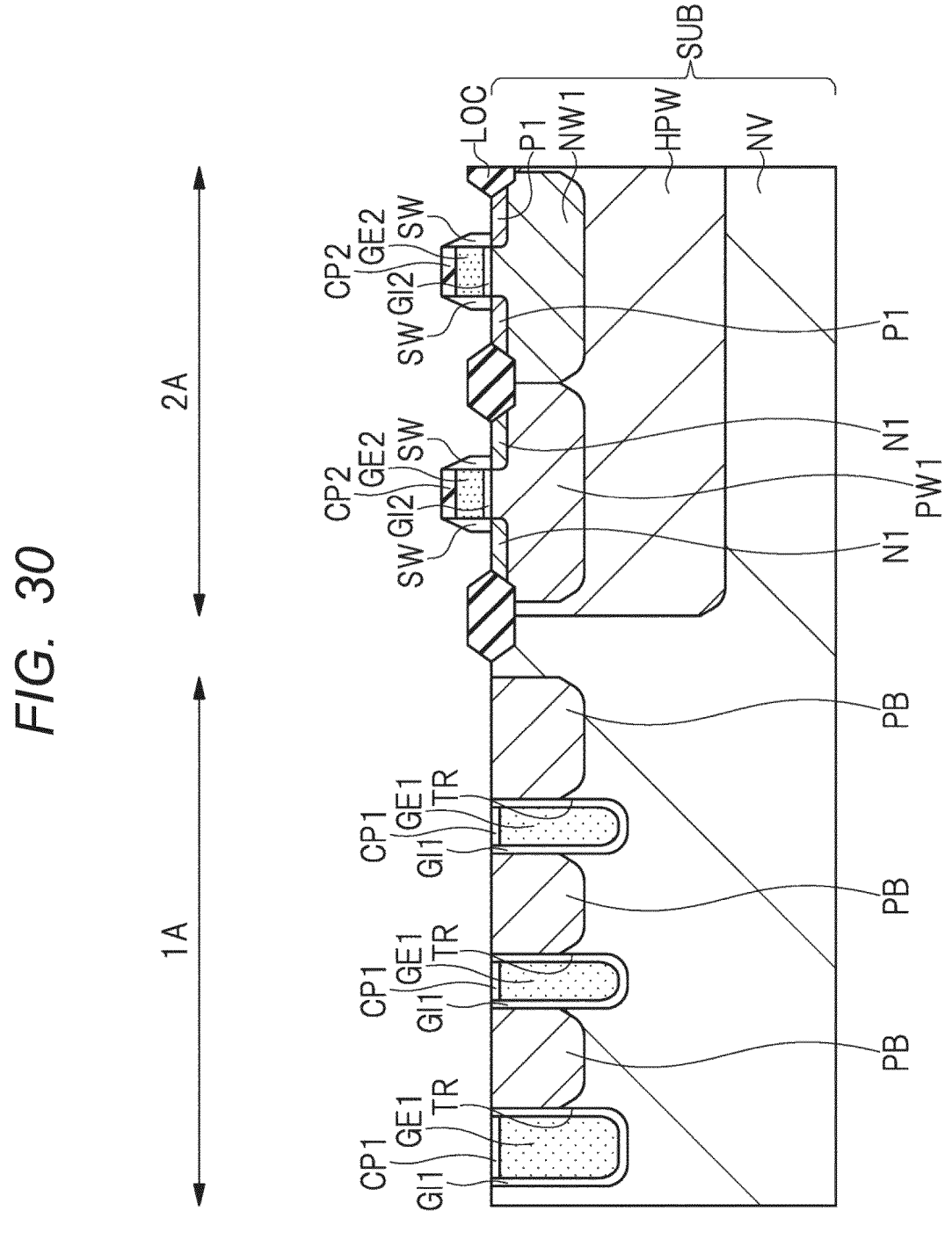
FIG. 30 is a cross-sectional view showing the manufac- turing process of a semiconductor device following FIG. 28.
Figure 31:
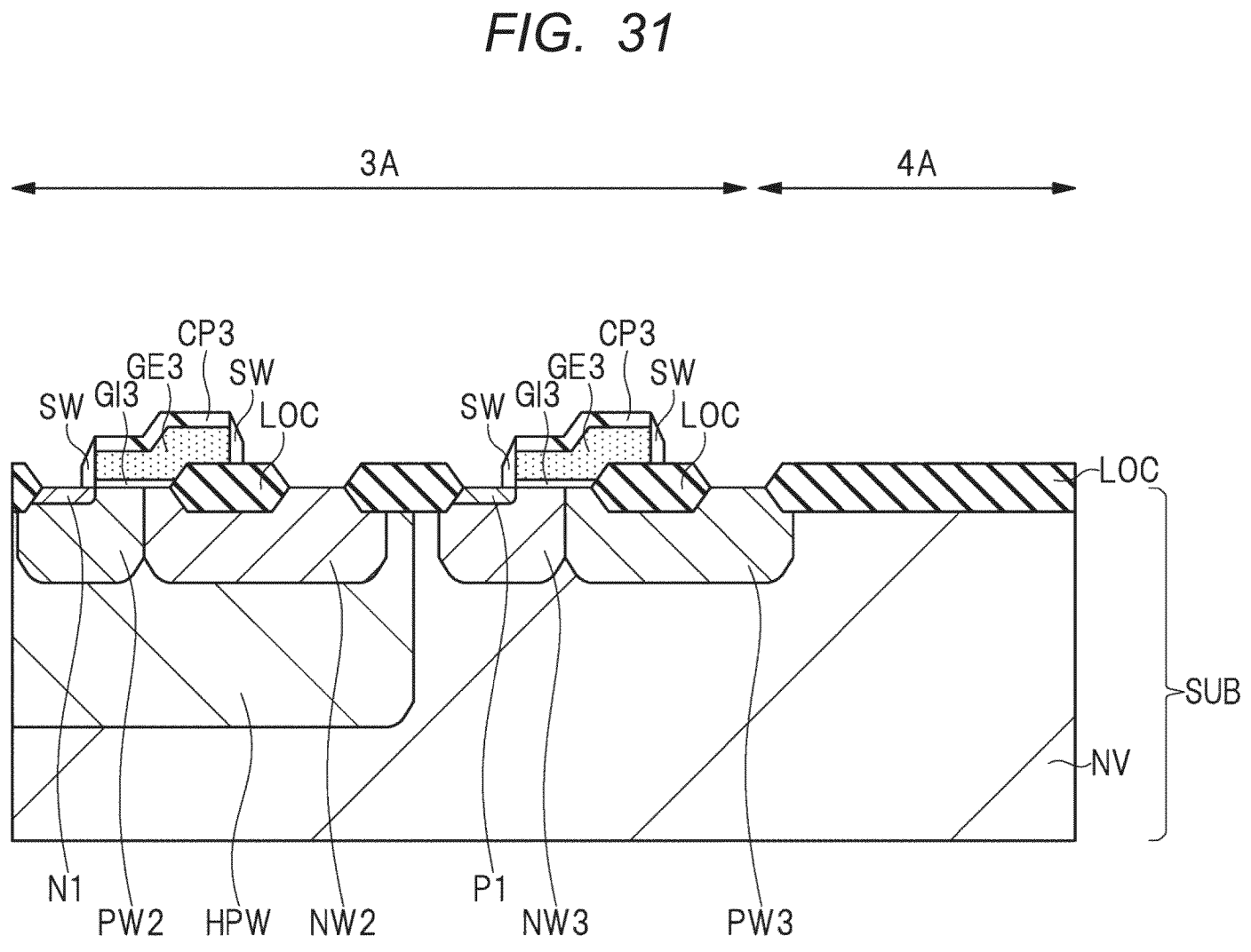

As shown in FIGS. 30 and 31, first, the respective impurity regions are selectively formed in the semiconductor substrate SUB in the regions 2A, 3A on the upper surface side of the semiconductor substrate SUB by using the photolithography technique and the ion-implantation method.

In the region 2A, an n-type impurity region N1 is formed in the well region PW1, and a p-type impurity region P1 is formed in the well region NW1. In the region 3A, an n-type impurity region N1 is formed in the well region PW2, and a p-type impurity region P1 is formed in the well region NW3.

Although not illustrated here, a through film made of a silicon-oxide film is formed on the upper surface of the semiconductor substrate SUB prior to the ion-implantation. After the ion implantation, the through film is removed by a washing step using an aqueous solution containing hydrofluoric acid.

Next, an insulating film such as a silicon oxide film is formed on the upper surface of the semiconductor substrate SUB in the regions 1A to 4A by, for example, a CVD method. Next, an anisotropic etch process is performed on the insulating film to remove the insulating film on the upper surface of the semiconductor substrate SUB, and a sidewall spacer SW is formed on each side surface of the gate-electrodes GE2, GE3.

Figure 32:
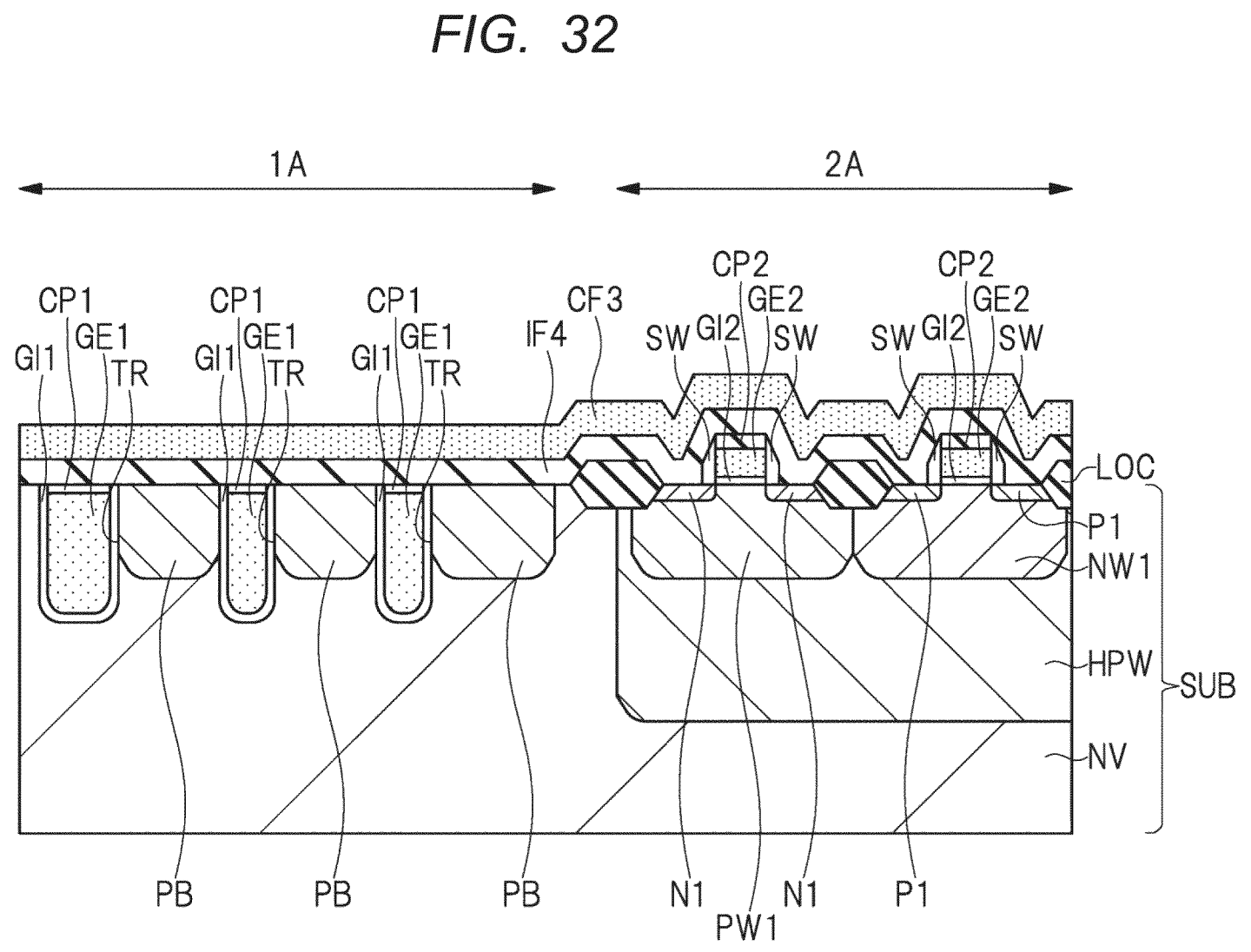
Figure 33:
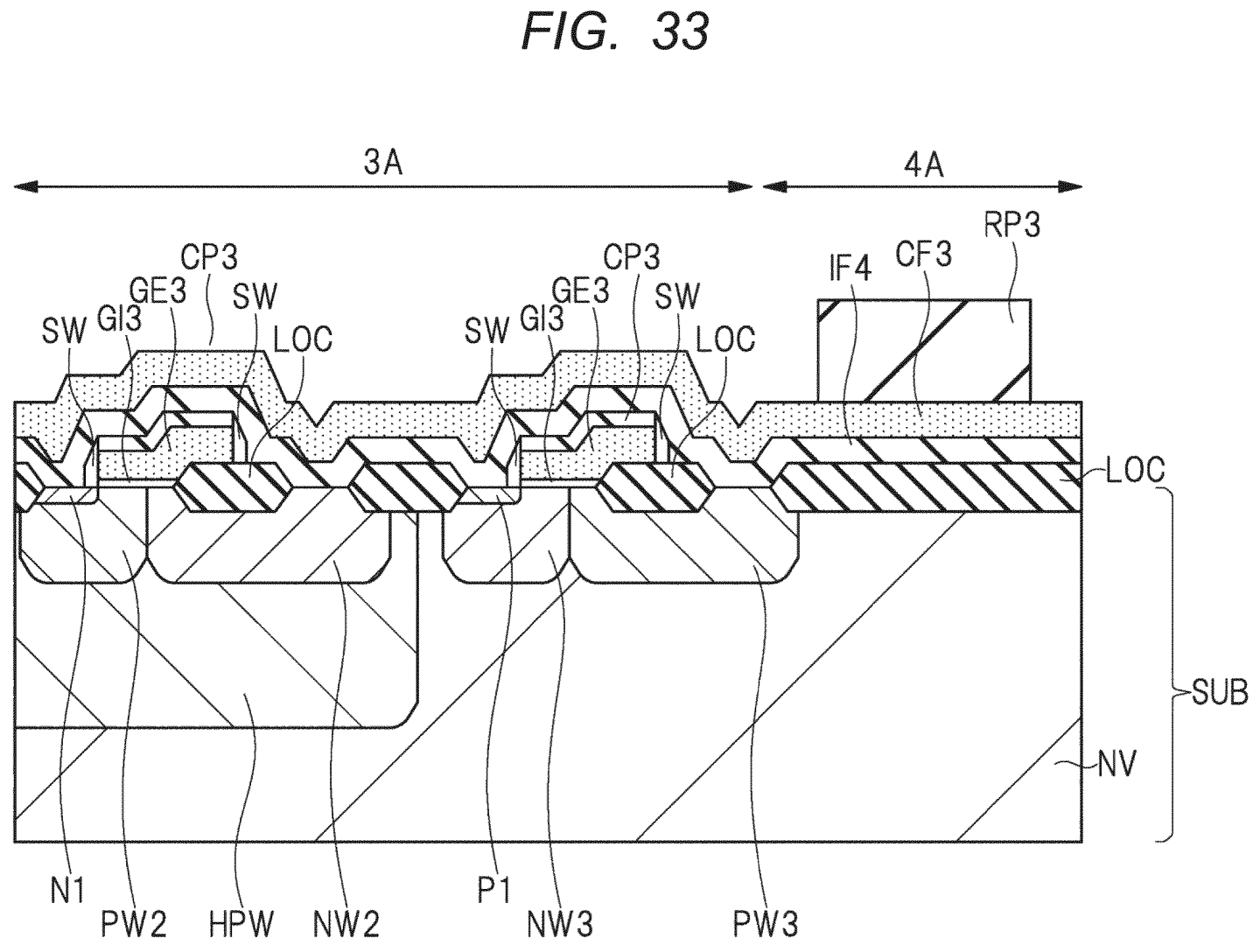

As shown in FIGS. 32 and 33, first, an insulating film IF4 made of, for example, a silicon oxide film is formed on the upper surface of the semiconductor substrate SUB by, for example, a CVD method so as to cover the gate-electrodes GE1 to GE3 and the element isolation LOC.

Next, a conductive film CF3 is formed on the insulating film IF4 by, for example, a CVD method. The material contained in the conductive film CF3 has a sheet resistance higher than the sheet resistance of the material contained in the conductive films CF1, CF2 (gate-electrodes GE1 to GE3). The conductive film CF3 is a polycrystalline silicon film. Next, an impurity such as boron (B) is ion-implanted into the conductive film CF3, thereby forming the conductive film CF3 into a p-type polycrystalline silicon film. Next, a resist pattern RP3 is formed on the conductive film CF3 so as to selectively cover a part of the region 4A.

Figure 34:
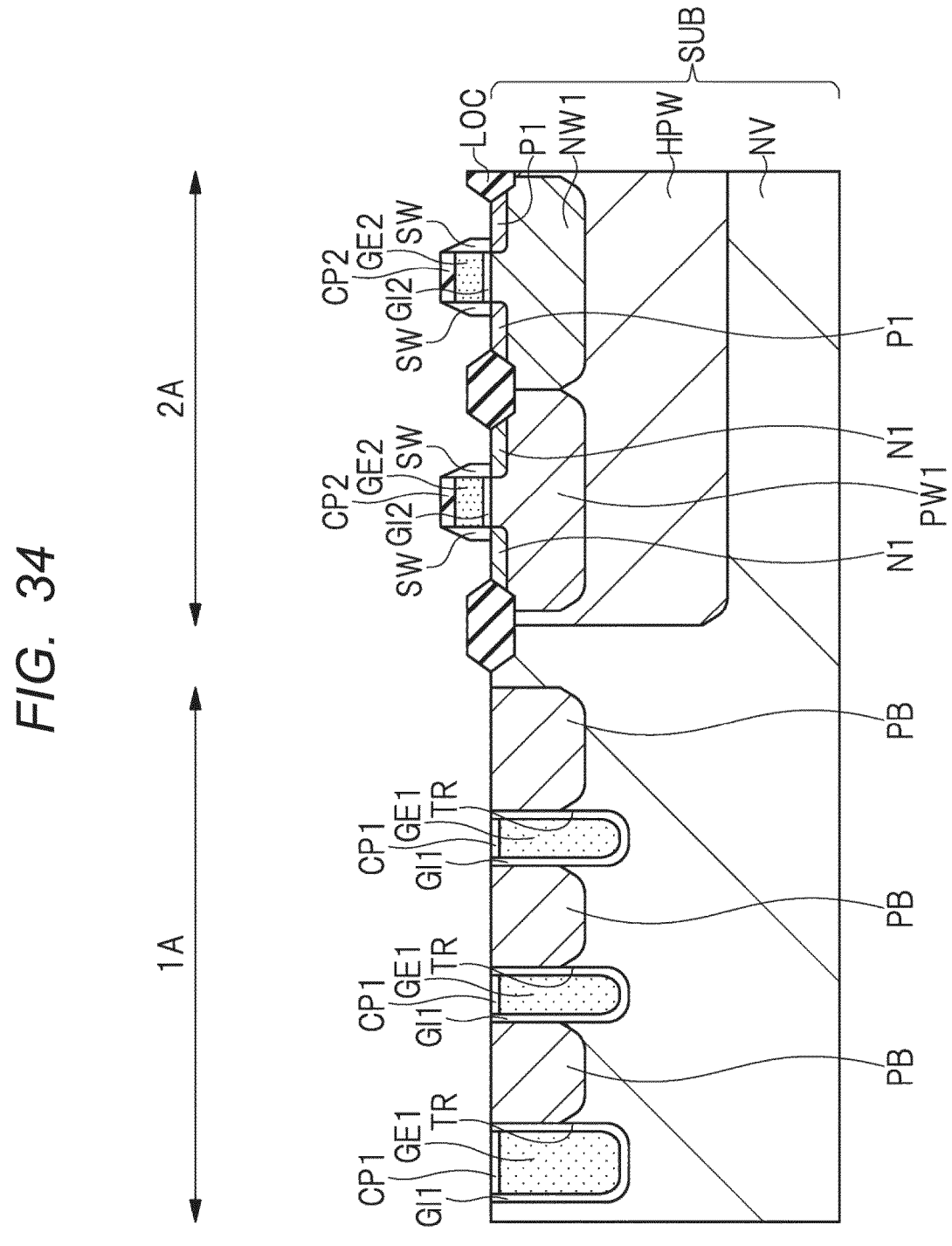
FIG. 34 is a cross-sectional view showing the manufac- turing process of a semiconductor device following FIG. 32.
Figure 35:
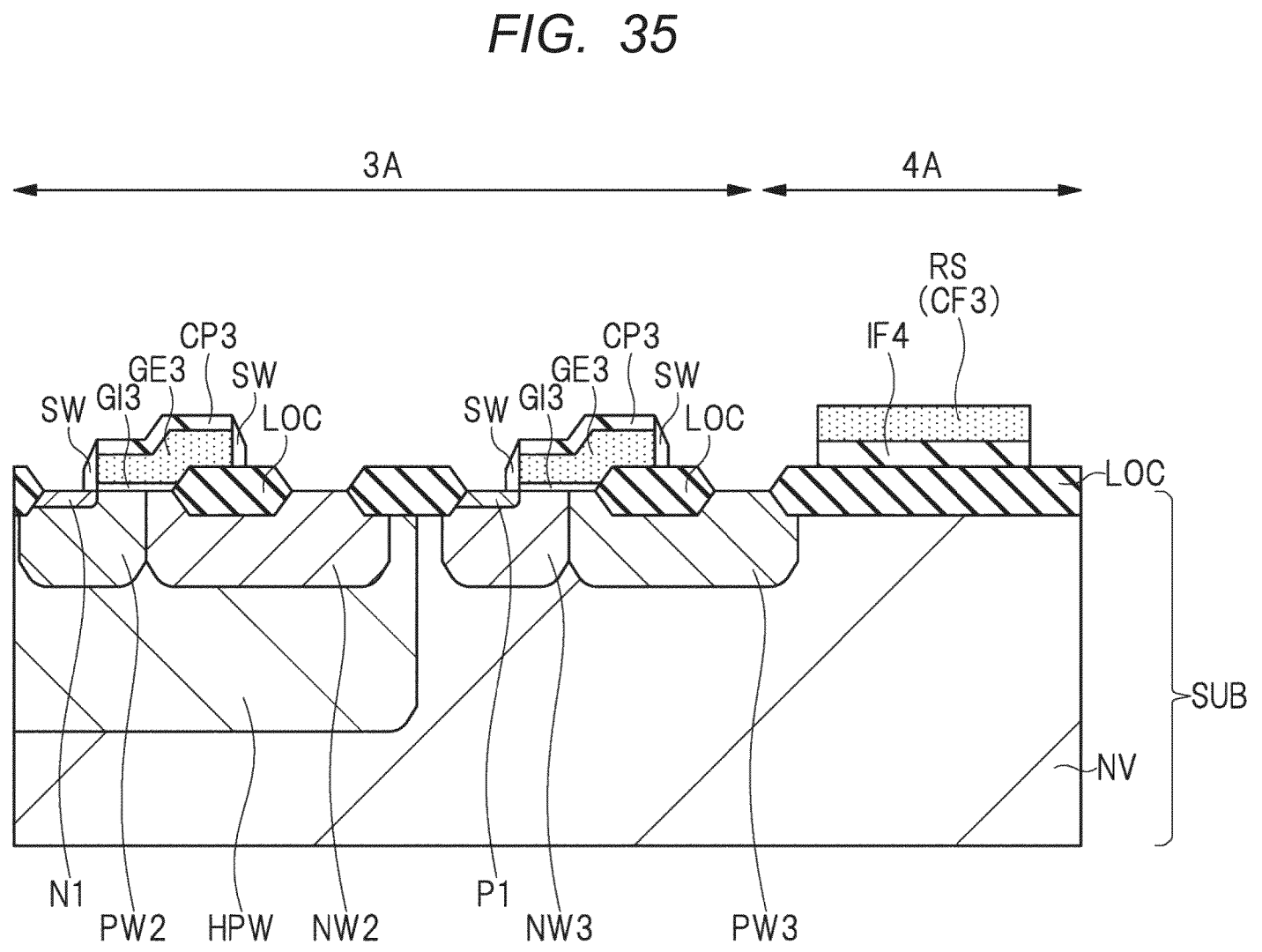

As shown in FIGS. 34 and 35, first, the conductive film CF3 is patterned by performing an anisotropic etch process using the resist pattern RP3 as a mask. As a result, the resistive element RS is formed. Next, the resist pattern RP3 is removed by ashing. Next, a cleaning step using an aqueous solution containing hydrofluoric acid is performed to remove the insulating film IF4 exposed from the resistive element RS.

Figure 36:
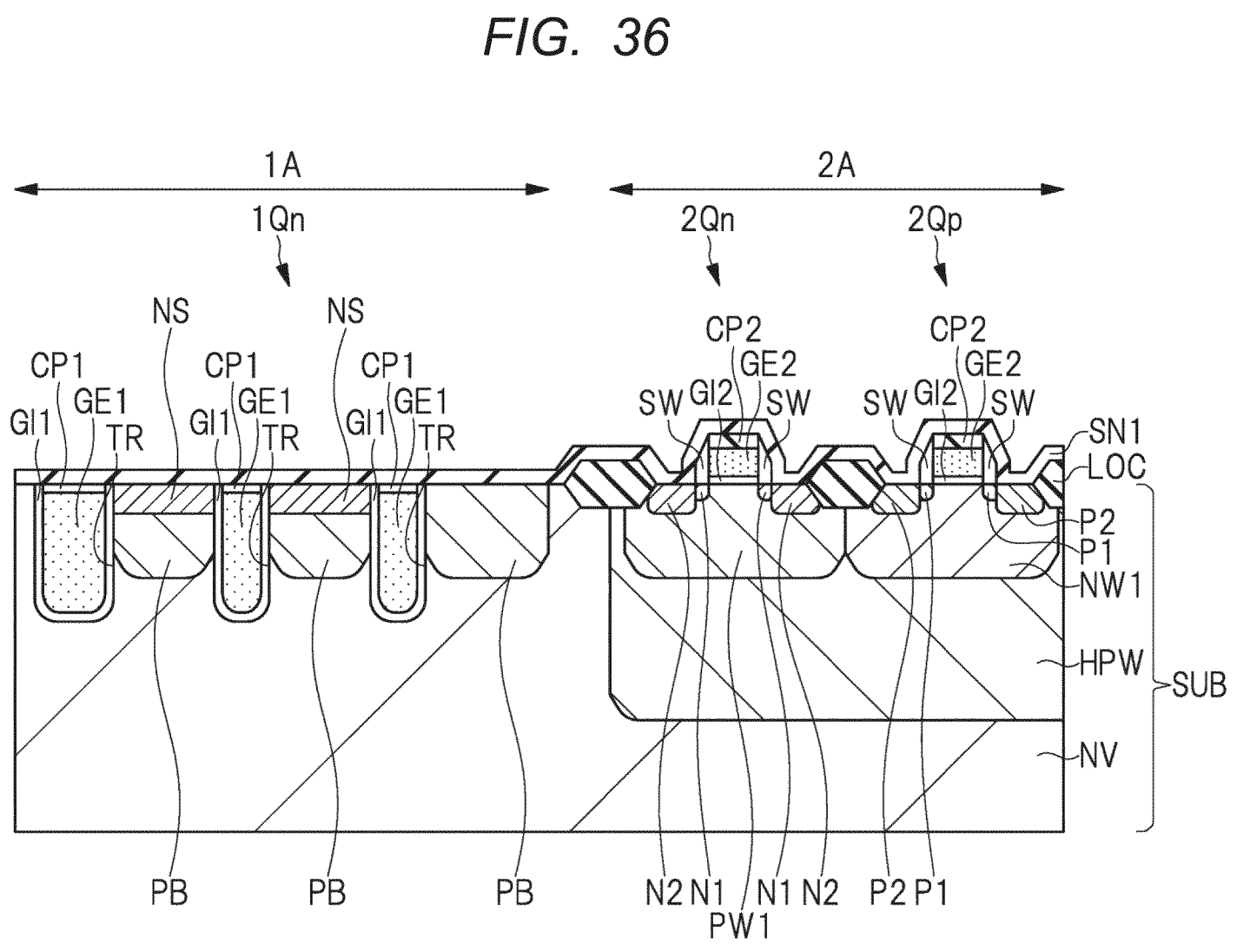
Figure 37:
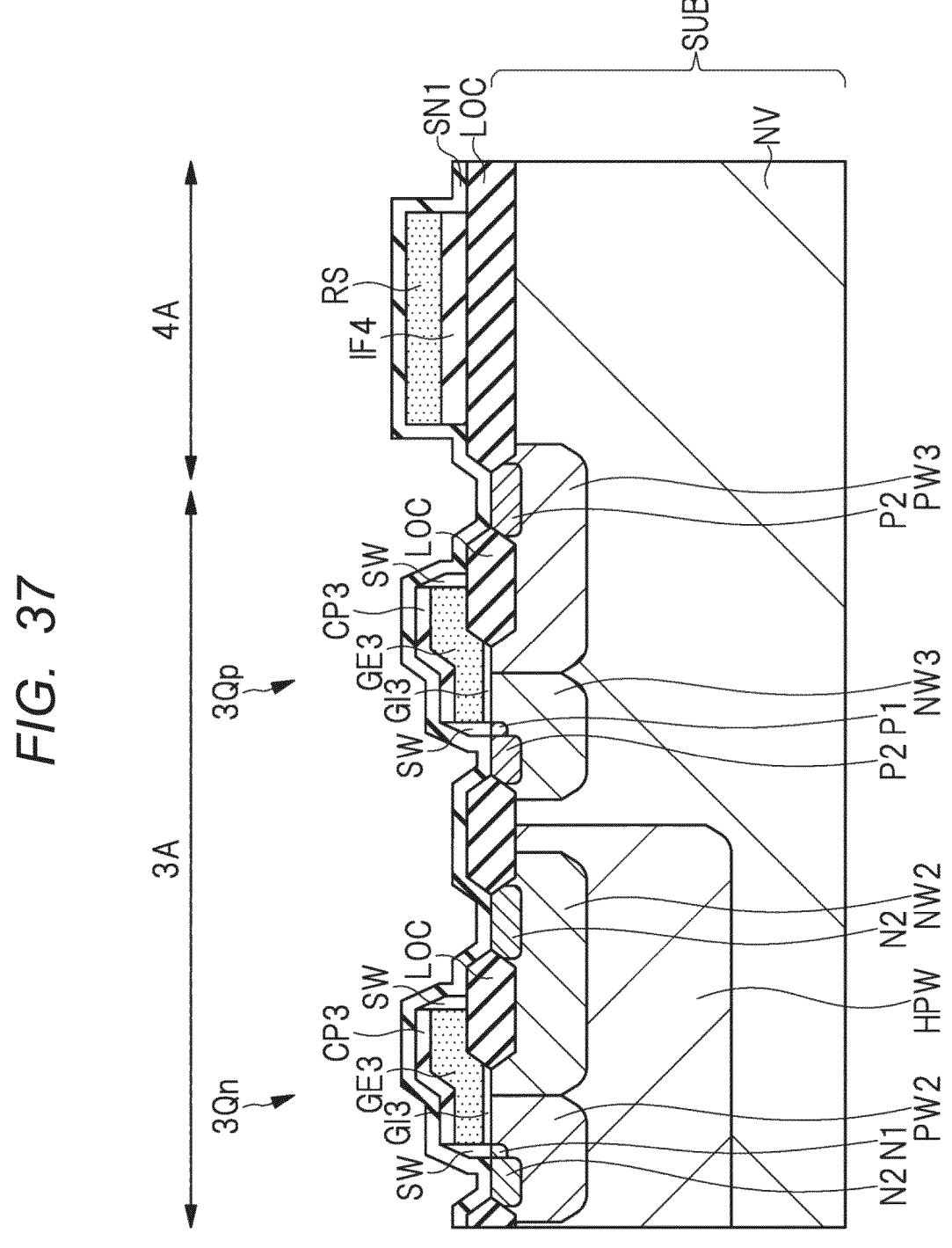
FIG. 37 is a cross-sectional view showing the manufacturing process of a semiconductor device following FIG. 35.

As shown in FIGS. 36 and 37, first, the respective impurity regions are selectively formed on the upper surface of the semiconductor substrate SUB in the semiconductor substrate SUB in the regions 1A to 3A by using the photolithography technique and the ion-implantation method.

In the region 1A, an n-type source region NS is formed in the body region PB. In the region 2A, an n-type impurity region N2 is formed in the well region PW1, and a p-type impurity region P2 is formed in the well region NW1. As described above, in the region 2A, the source region and the drain region of MOSFET2Qn including the impurity regions N1, N2 are formed, and the source region and the drain region of MOSFET2Qp including the impurity regions P1, P2 are formed.

In the region 3A, an n-type impurity region N2 is formed in the well region PW2, an n-type impurity region N2 is formed in the well region NW2, a p-type impurity region P2 is formed in the well region NW3, and a p-type impurity region P2 is formed in the well region PW3. As described above, in the region 3A, the source region of MOSFET3Qn including the impurity region N1, N2 is formed, and the drain region of MOSFET3Qn including the well region NW2 and the impurity region N2 is formed. In the region 3A, a source region of MOSFET3Qp including the impurity regions P1, P2 is formed, and a drain region of MOSFET3Qp including the well region PW3 and the impurity region P2 is formed.

Although not illustrated here, a through film made of a silicon-oxide film is formed on the upper surface of the semiconductor substrate SUB prior to the ion-implantation. After the ion implantation, the through film may be removed by a washing step using an aqueous solution containing hydrofluoric acid, but the through film may be left.

Next, the source region and the drain region of each of MOSFET1Qn, 2Qn, 2Qp, 3Qn, 3Qp are subjected to a heat treatment. The heat treatment is performed in a nitrogen atmosphere, for example, under the condition of 850 degrees Celsius, 20 minutes. By this heat treatment, the impurities contained in the source region and the drain region of each of MOSFET1Qn, 2Qn, 2Qp, 3Qn, 3Qp are activated.

The basic configuration of MOSFET1Qn, 2Qn, 2Qp, 3Qn, 3Qp can be obtained by the above-described manufacturing processes.

Next, a silicon nitride film SN1 is formed on the upper surface of the semiconductor substrate SUB of the regions 1A to 4A by, for example, a CVD method so as to cover the gate-electrodes GE1 to GE3 and the resistor RS. The thickness of the silicon nitride film SN1 is, for example, 10 nm or more and 20 nm or less.

Figure 38:
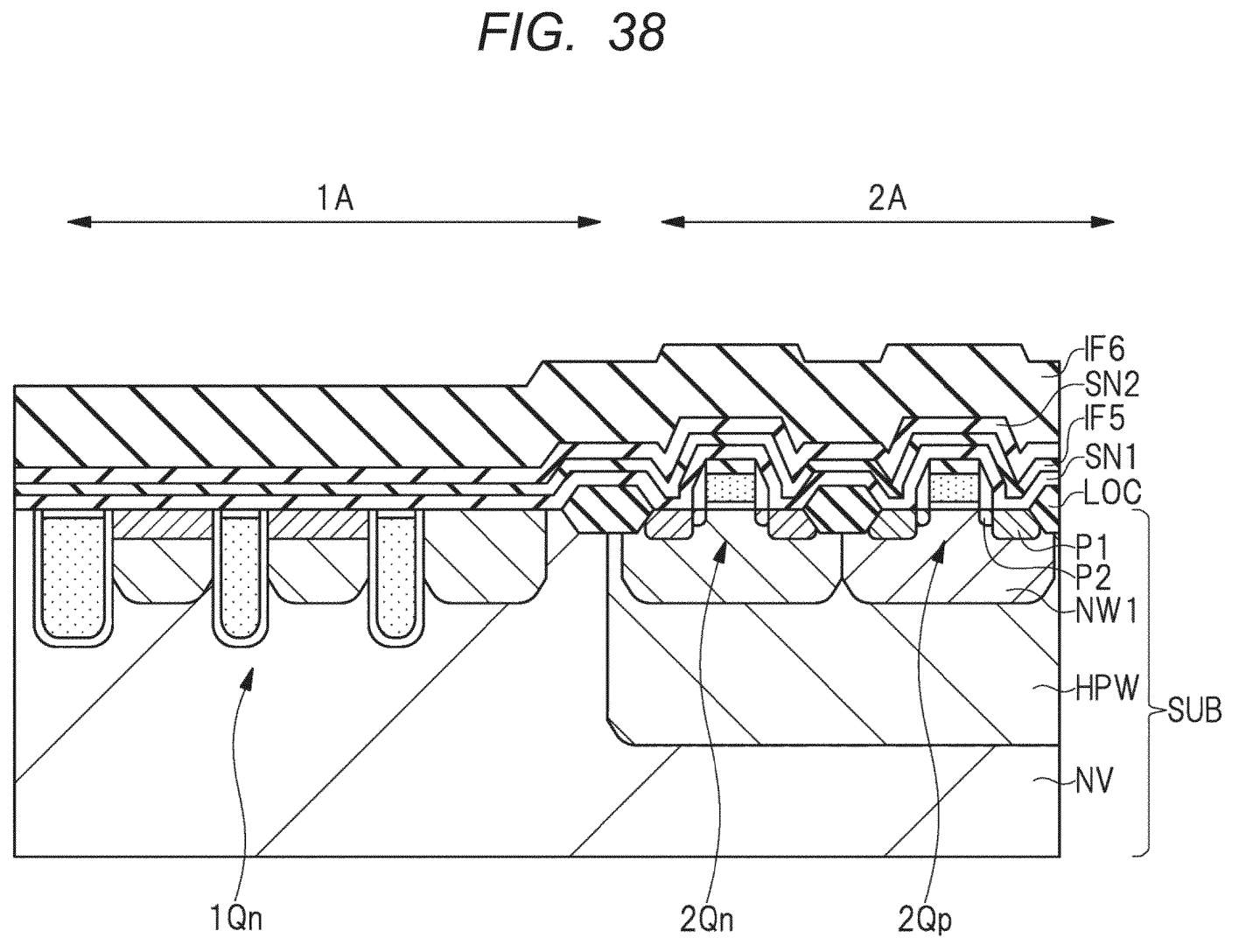
Figure 39:
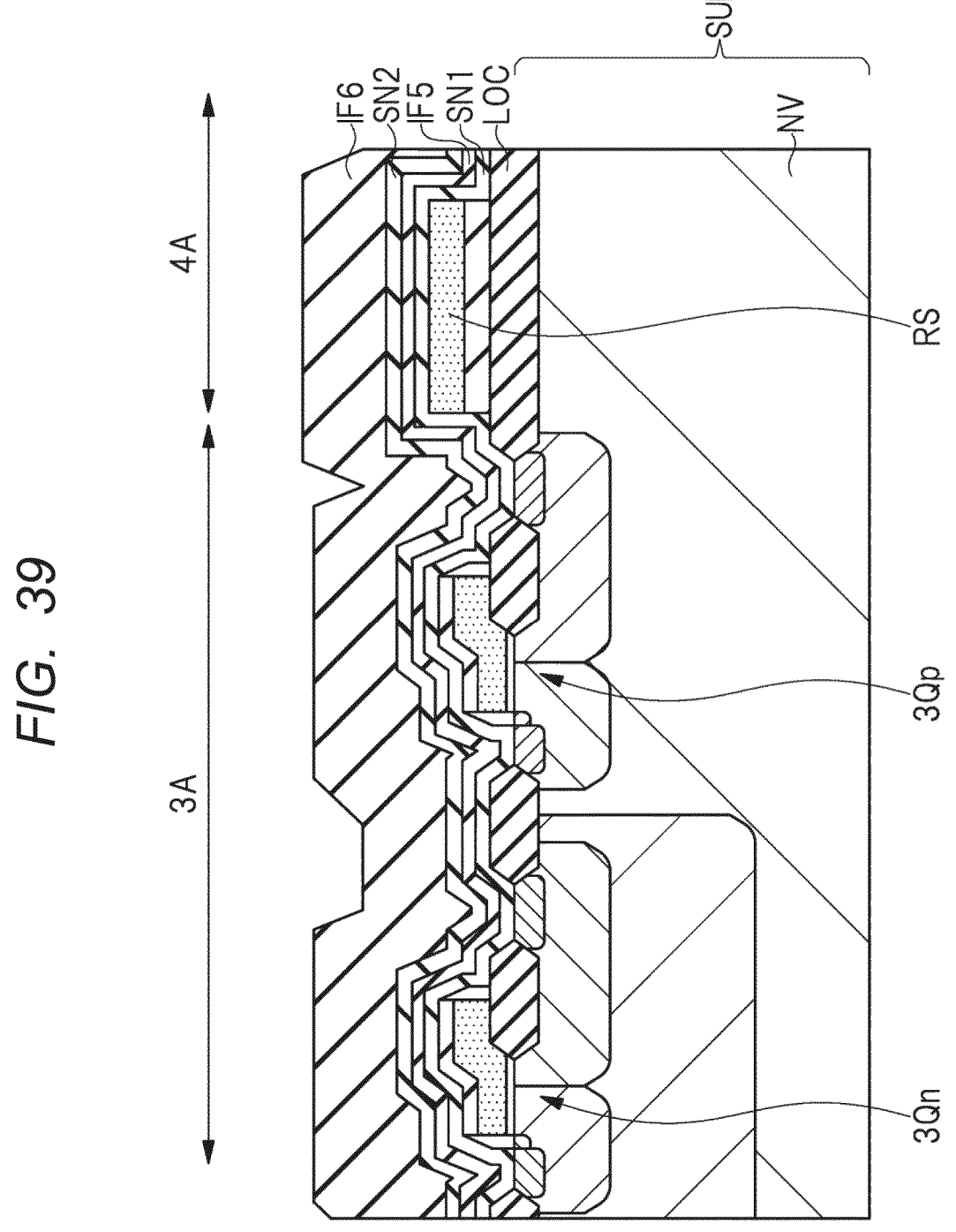
FIG. 39 is a cross-sectional view showing the manufacturing process of a semiconductor device following FIG. 37.

As shown in FIGS. 38 and 39, an insulating film IF5 made of a silicon oxide film, a silicon nitride film SN2, and an insulating film IF6 made of a silicon oxide film are sequentially formed on the silicon nitride film SN1 by, for example, a CVD method. The thickness of the insulating film IF5 is, for example, 80 nm or more and 120 nm or less. The thickness of the silicon nitride film SN2 is, for example, 120 nm or more and 160 nm or less. The thickness of the insulating film IF6 is, for example, 1000 nm or more and 1400 nm or less.

Figure 40:
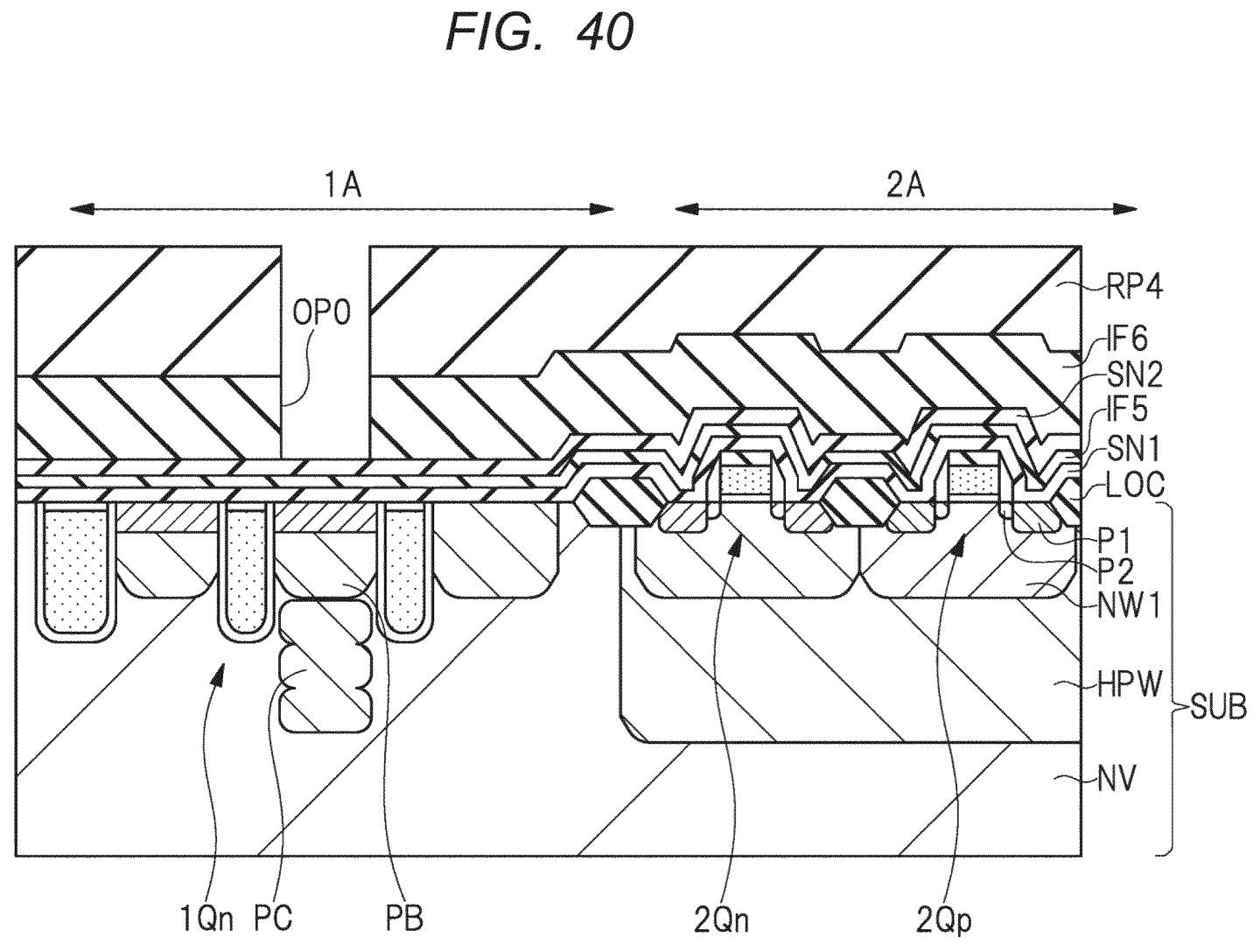
Figure 41:
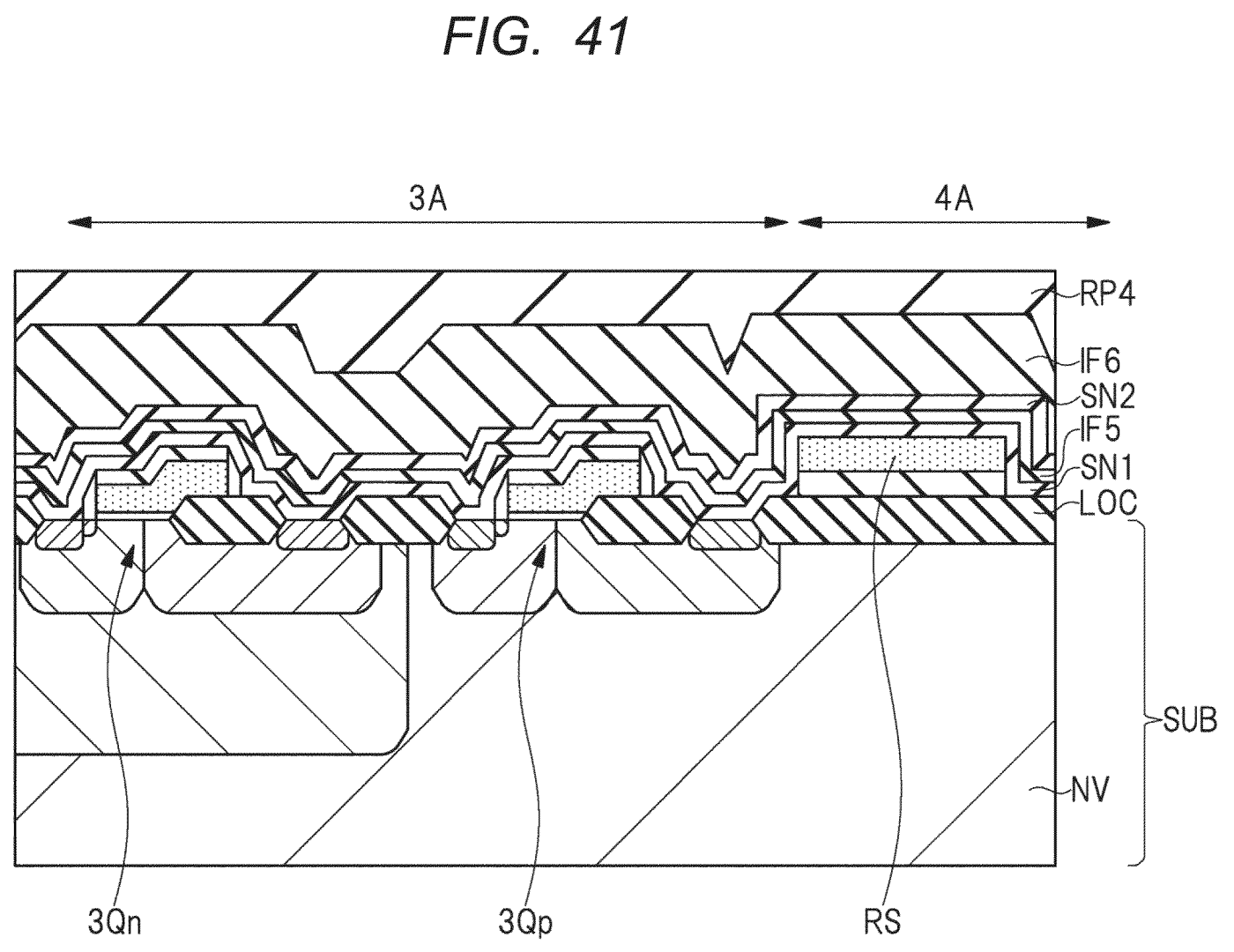

As shown in FIGS. 40 and 41, first, a resist pattern RP4 is formed on the insulating film IF6 so as to selectively open a part of the region 1A. Next, an anisotropic etch process is performed using the resist pattern RP4 as a mask to form an opening OP0 in the insulating film IF6 located on the body region PB. At this time, the silicon nitride film SN2 functions as an etching stopper.

Next, inside the opening OP0, ion-implantation is performed so as to pass through the silicon nitride film SN1, the insulating film IF5, and the silicon nitride film SN2. Accordingly, a p-type column region PC is formed in the semiconductor substrate SUB located below the body region PB. In this ion implantation, for example, boron (B) is used as an impurity, and the impurity is divided into a plurality of times while changing the implantation energy. Thereafter, the resist pattern RP4 is removed by ashing.

Here, the column region PC is preferably formed after the heat treatment for activating the impurities contained in the source region and the drain region of each of MOSFET1Qn, 2Qn, 2Qp, 3Qn, 3Qp. When the heat treatment for activation is performed after the column region PC is formed, the impurities contained in the column region PC may diffuse and the column region PC may expand. If the position of the column area PC is too wide from the designed value, the on-resistance of MOSFET1Qn may increase. Further, since it is difficult to control the diffusion position of the column region PC by the heat treatment, there is a possibility that variations in the spread of the depletion layer occur, there is a possibility that the expected breakdown voltage cannot be obtained. Therefore, in the first embodiment, the column region PC is formed after the heat treatment for activation.

Figure 42:
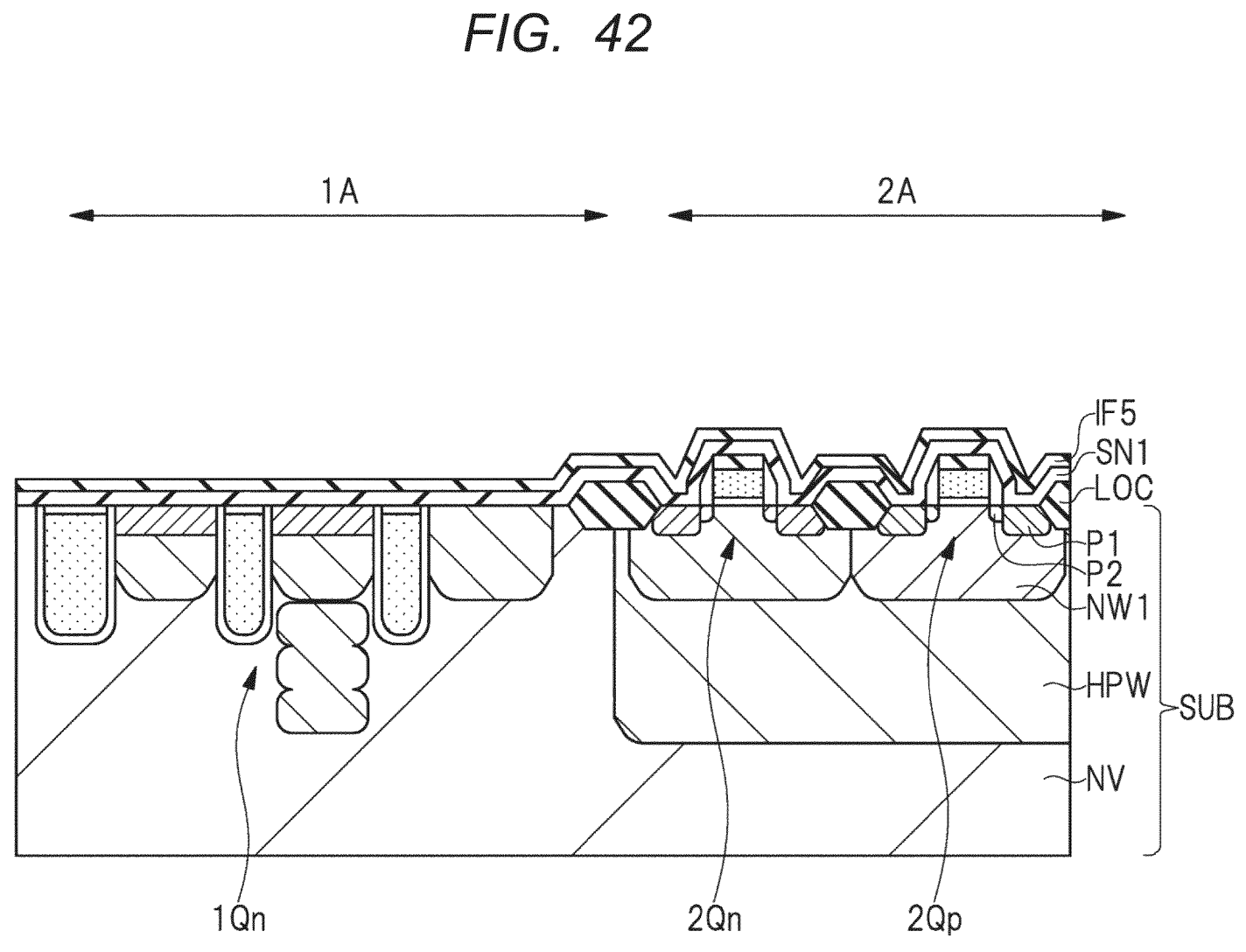
Figure 43:
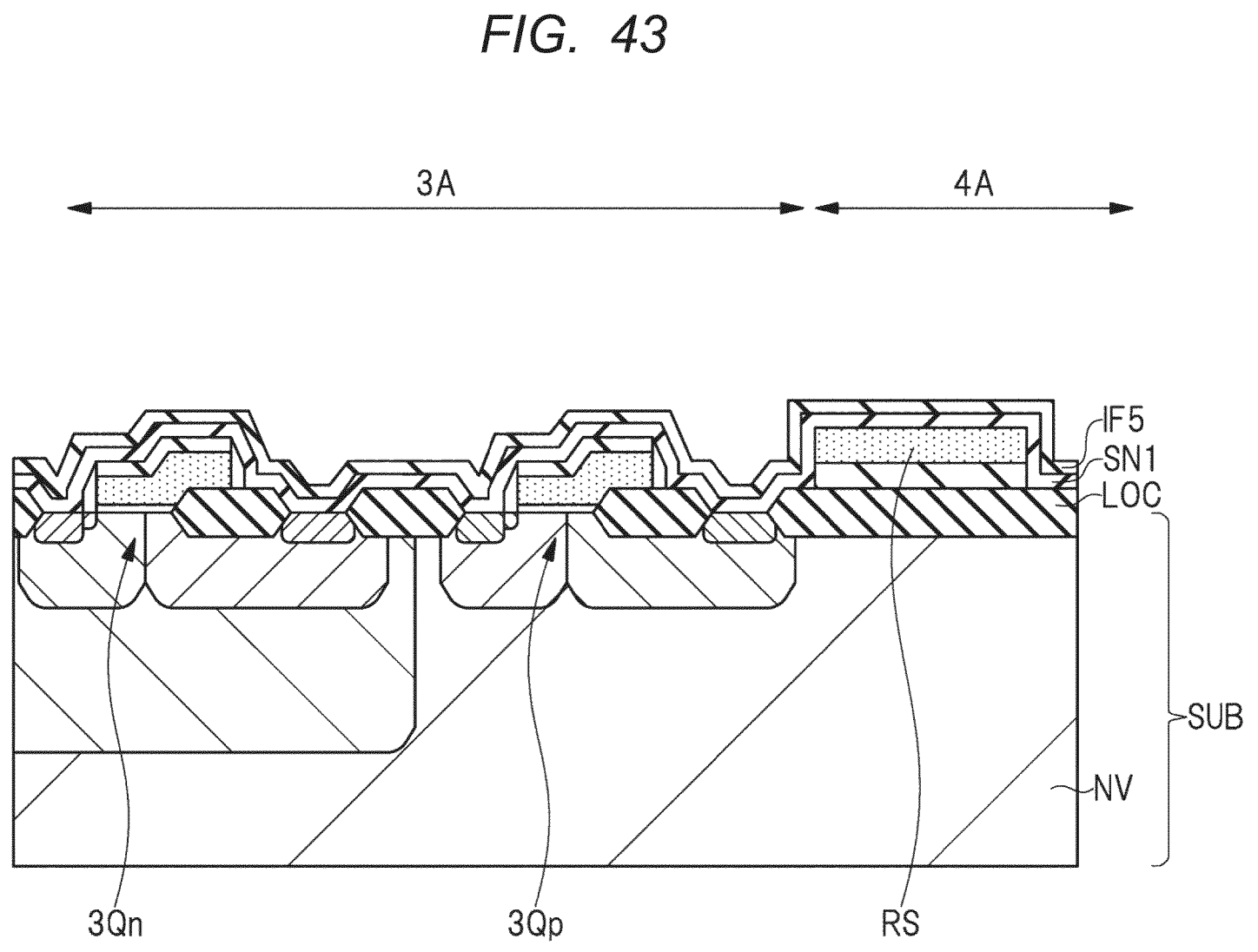

As shown in FIGS. 42 and 43, first, an isotropic etching process using an aqueous solution containing hydrofluoric acid is performed to remove the insulating film IF6 using the silicon nitride film SN2 as an etching stopper. Next, an isotropic etching process using an aqueous solution containing phosphoric acid is performed to remove the silicon nitride film SN2 using the insulating film IF5 as an etching stopper. The silicon nitride film SN1 can also be prevented from being removed when the silicon nitride film SN2 is removed because the insulating film IF5 is formed between the silicon nitride film SN1 and the silicon nitride film SN2.

Thereafter, the insulating film IF5 may be removed by an isotropic etching process using an aqueous solution containing hydrofluoric acid, or the like, but the insulating film IF5 may be left as a part of the interlayer insulating film IL1. Here, the insulating film IF5 is left as an example.

Figure 44:
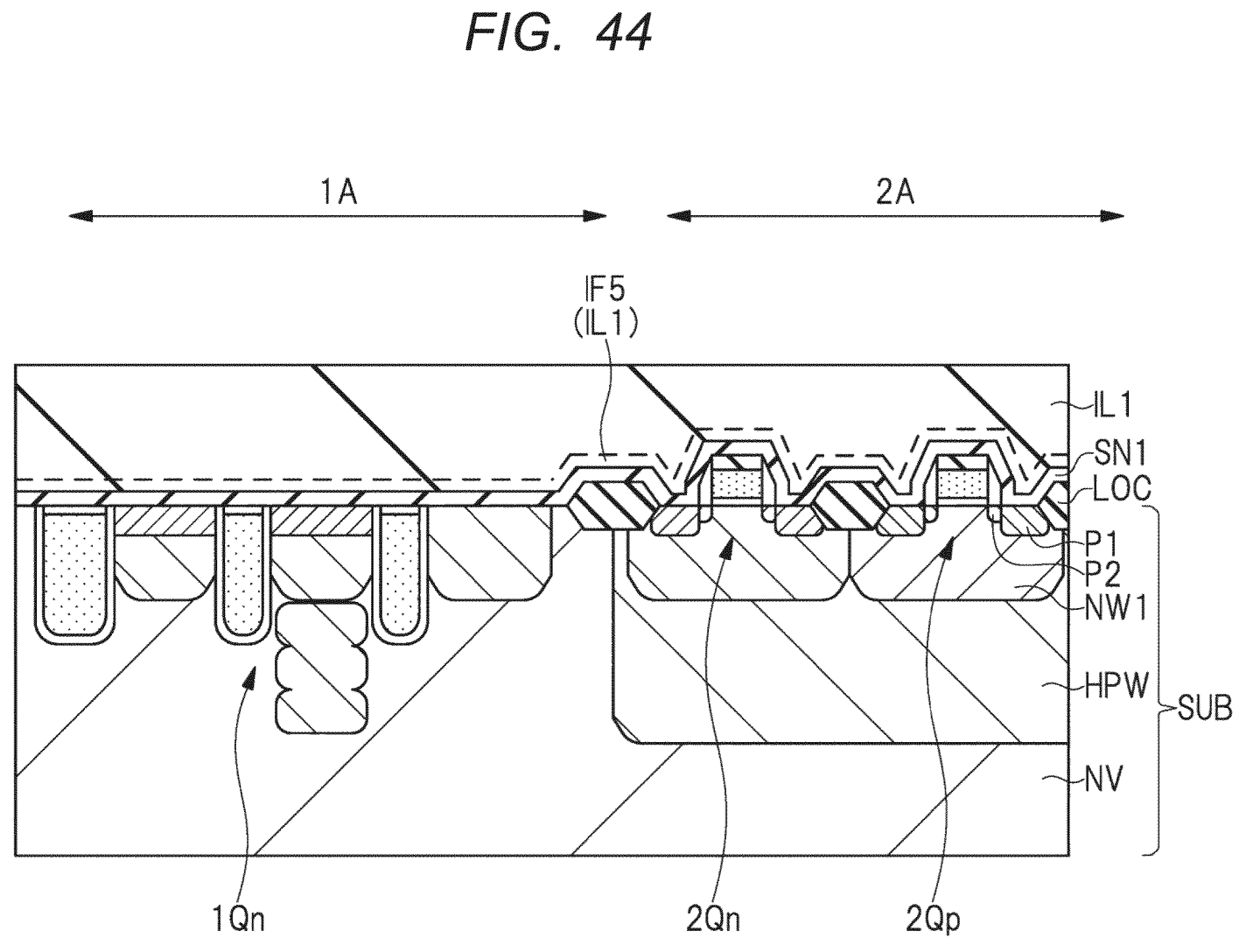
Figure 45:
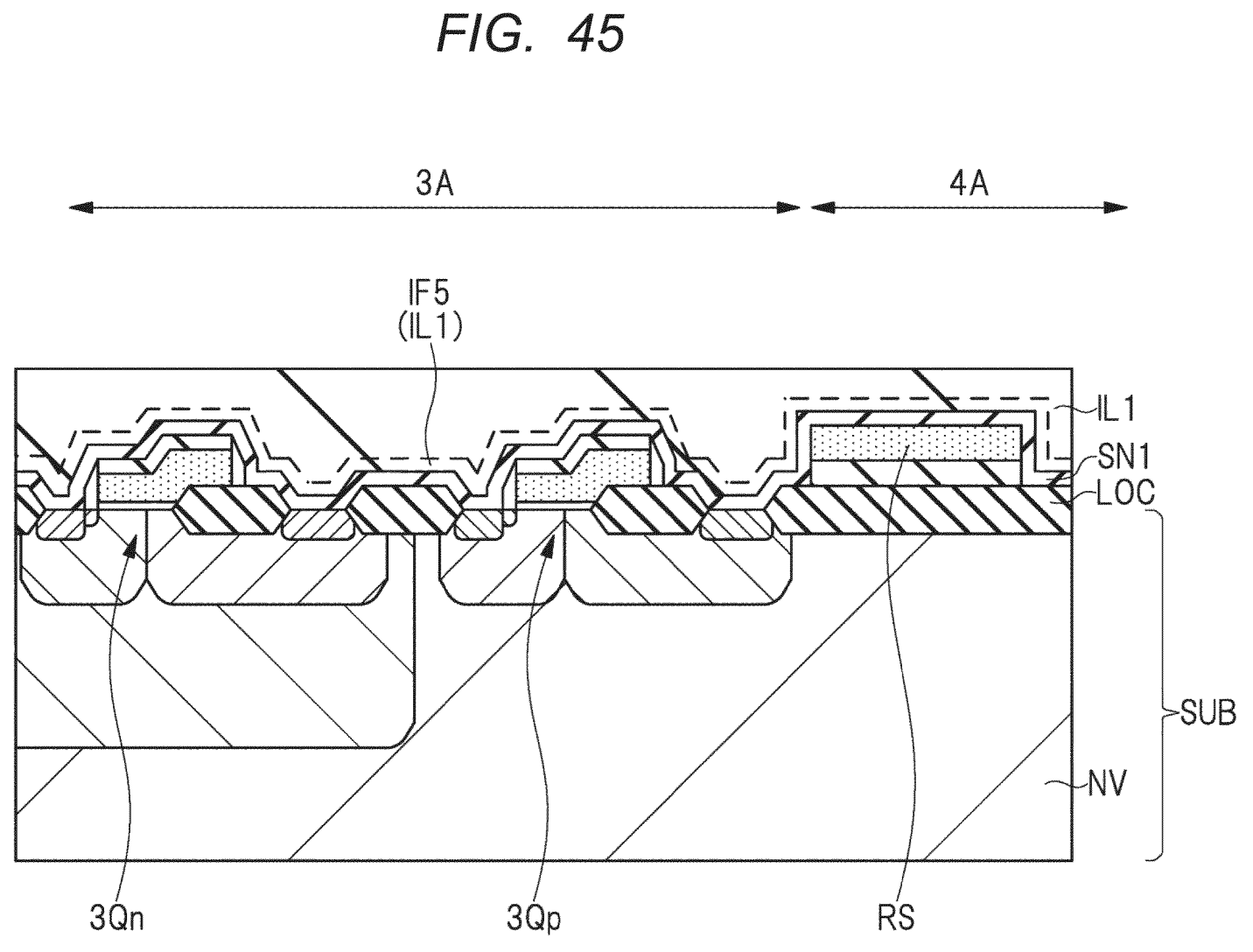

As shown in FIGS. 44 and 45, an interlayer insulating film IL1 is formed on the upper surface of the semiconductor substrate SUB in the regions 1A to 4A so as to cover the gate-electrodes GE1 to GE3 and the resistor RS.

First, a silicon oxide film is formed on the silicon nitride film SN1 by, for example, a CVD method. Next, a BPSG film is formed on the silicon-oxide film by, for example, a coating method. Next, BPSG film is subjected to a heat treatment. The heat treatment is performed in a nitrogen atmosphere, for example, under a condition of 850 degrees Celsius, 20 minutes. By this heat treatment, boron or phosphorus may diffuse from BPSG film toward the semiconductor substrate SUB, but such diffusion can be prevented by the silicon-oxide film. When the insulating film IF5 remains, the silicon-oxide film is not necessarily formed.

Next, the interlayer insulating film IL1 is polished by a polishing process using CMP (Chemical Mechanical Polishing) method. As a result, the upper surface of the interlayer insulating film IL1 is planarized.

Figure 46:
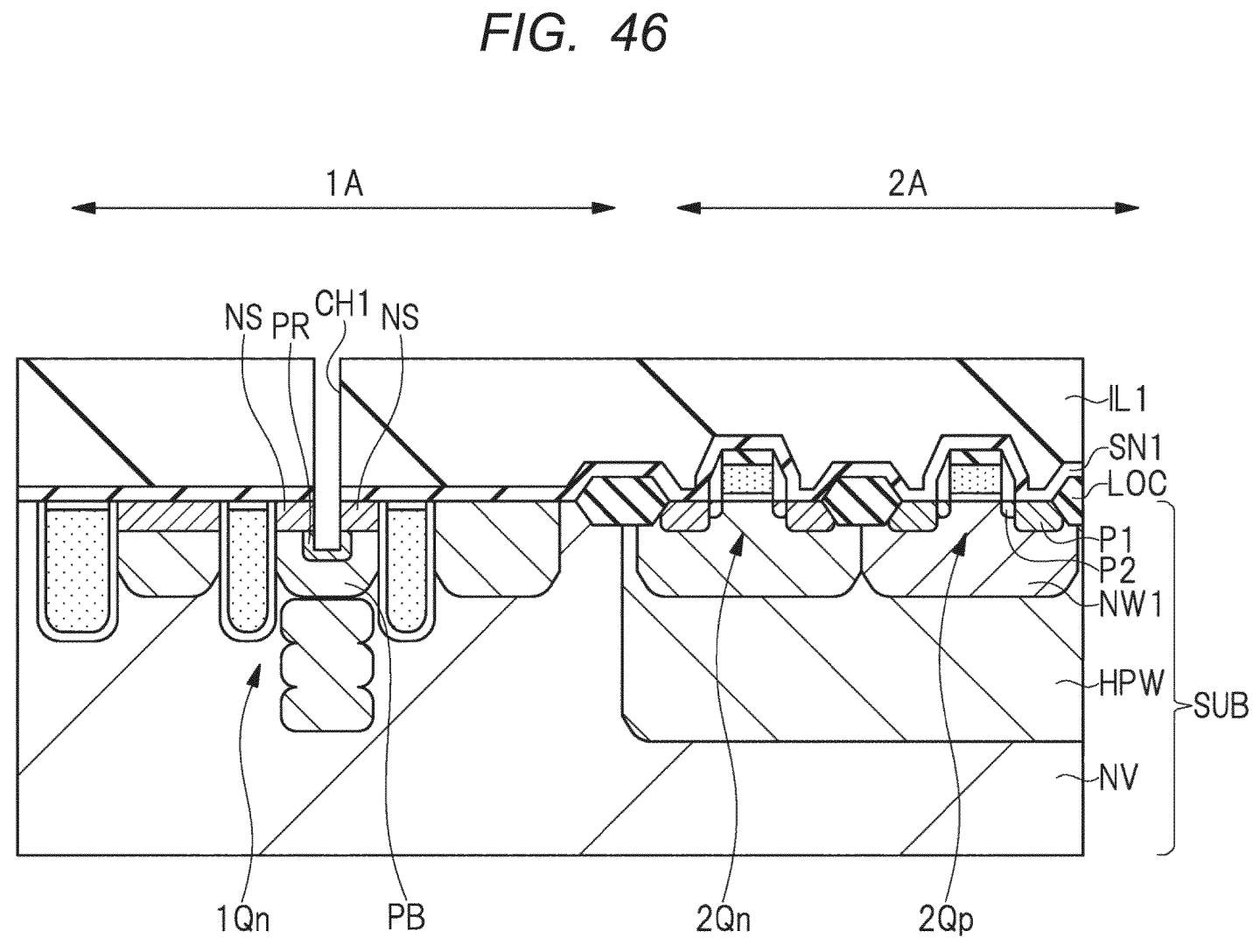
Figure 47:
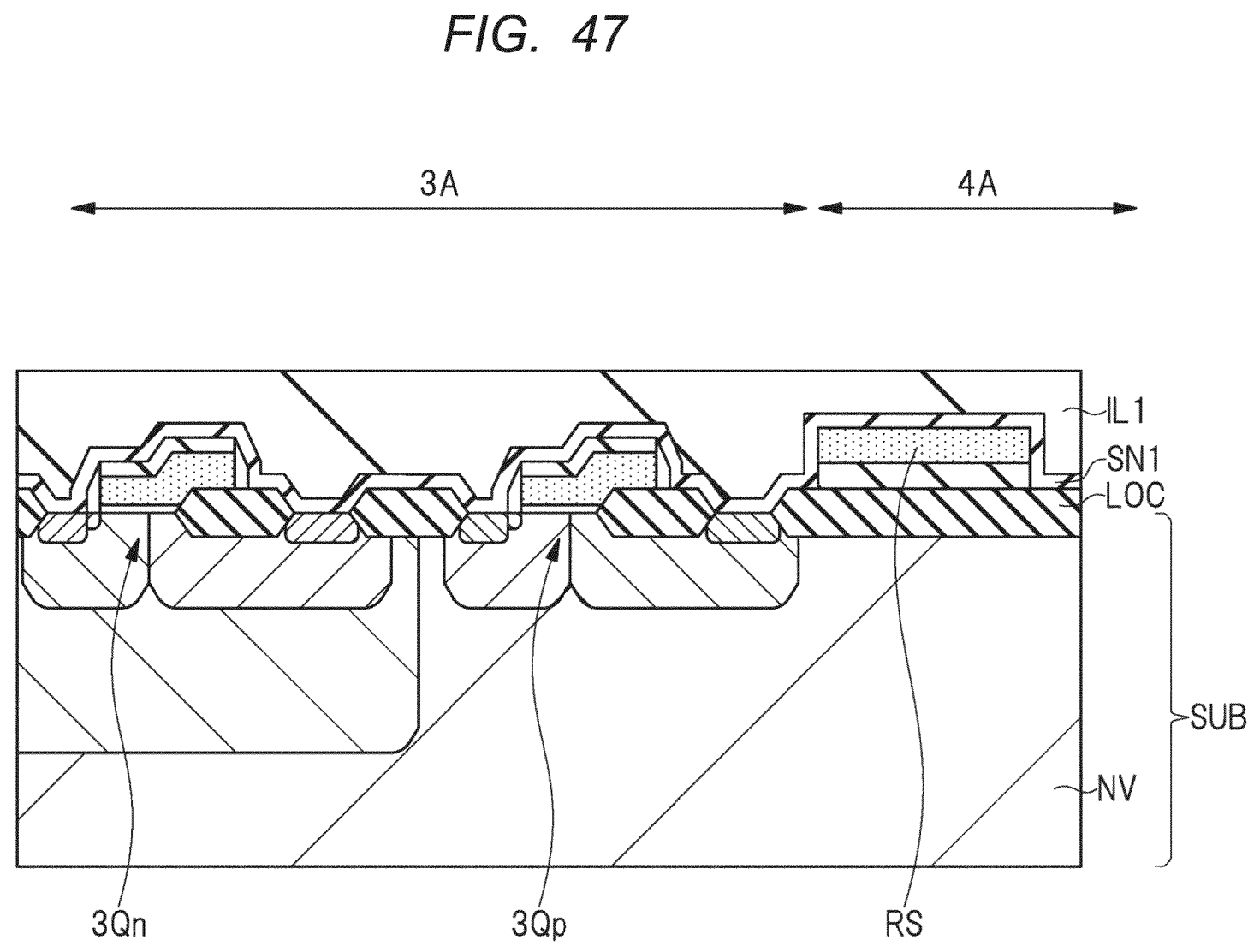

As shown in FIGS. 46 and 47, first, in the region 1A, a hole CH1 is formed in the interlayer insulating film IL1, in the silicon nitride film SN1, in the source region NS, and in the body region PB by photolithography and anisotropic etching. The bottom of the hole CH1 is located inside the body region PB.

In the etching of the interlayer insulating film IL1, the silicon nitride film SN1 functions as an etching stopper. Then, the silicon nitride film SN1 and the semiconductor substrate SUB are sequentially etched changing conditions such as gas. Since the etching process is stopped once by the silicon nitride film SN1, the depth of the plurality of holes CH1 in the wafer surface is easily made uniform.

Next, boron (B), for example, is introduced into the body region PB at the bottom of the hole CH1 by an ion-implantation method to form a p-type highly diffusion region PR.

Figure 48:
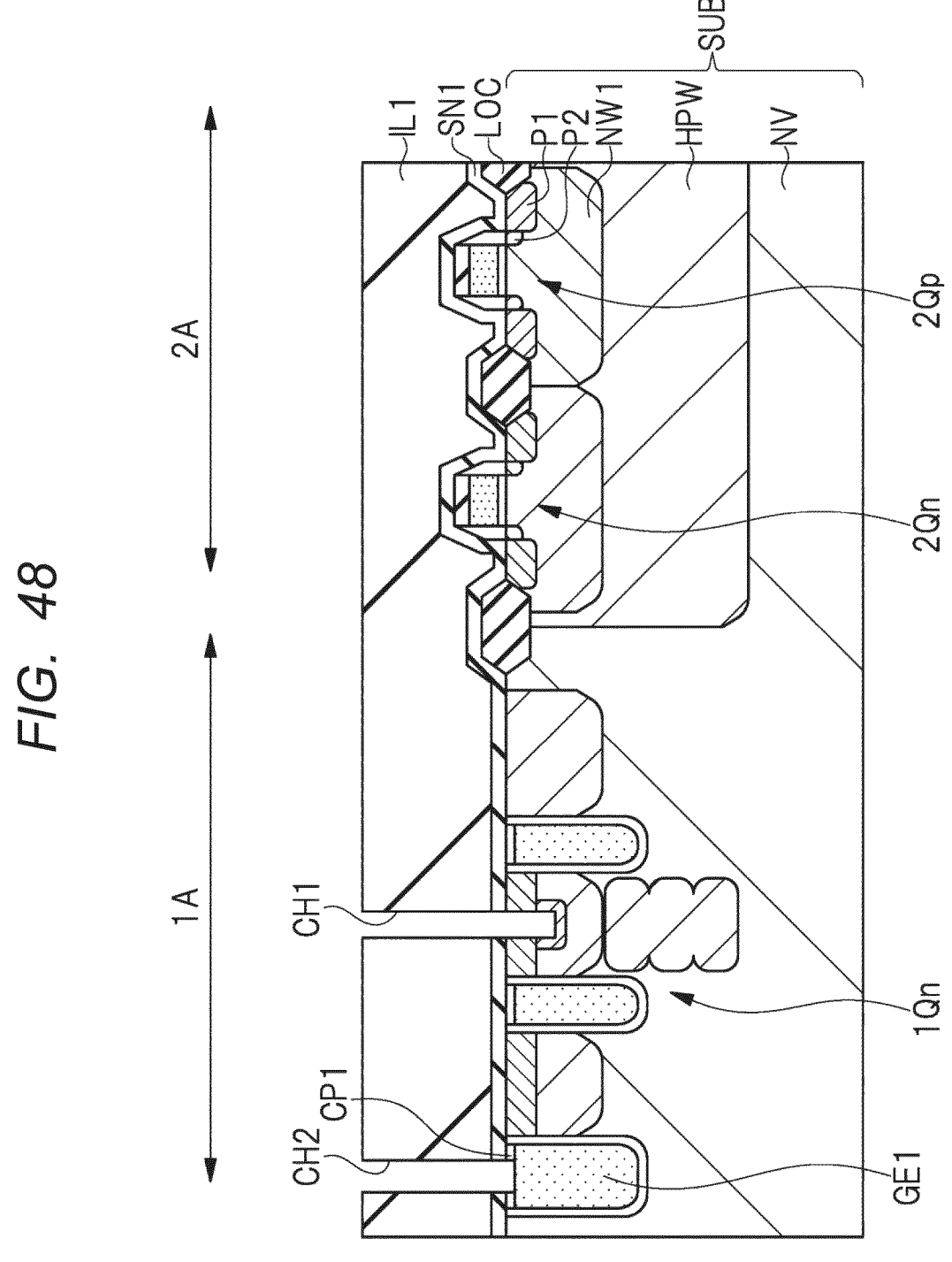
FIG. 48 is a cross-sectional view showing the manufacturing process of a semiconductor device following FIG. 46.
Figure 49:
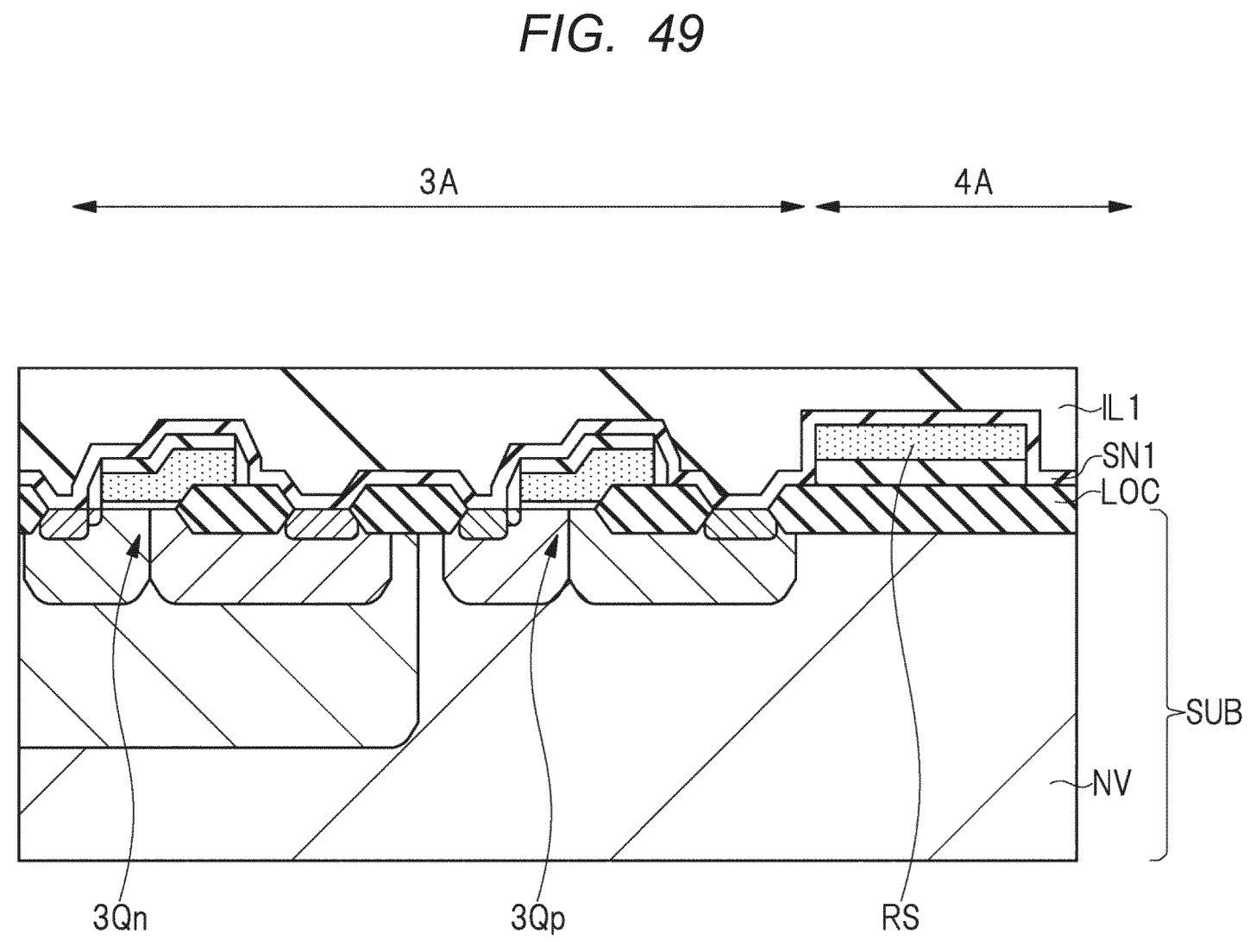

As shown in FIGS. 48 and 49, a hole CH2 is formed in the interlayer insulating film IL1, in the silicon nitride film SN1, and in the capping film CP1 in the region 1A by the photolithography technique and the anisotropic etch process. The hole CH2 reaches the gate-electrode GE1. As in the manufacturing process of the hole CH1, in the etching of the interlayer insulating film IL1, the silicon nitride film SN1 functions as an etching stopper.

Figure 50:
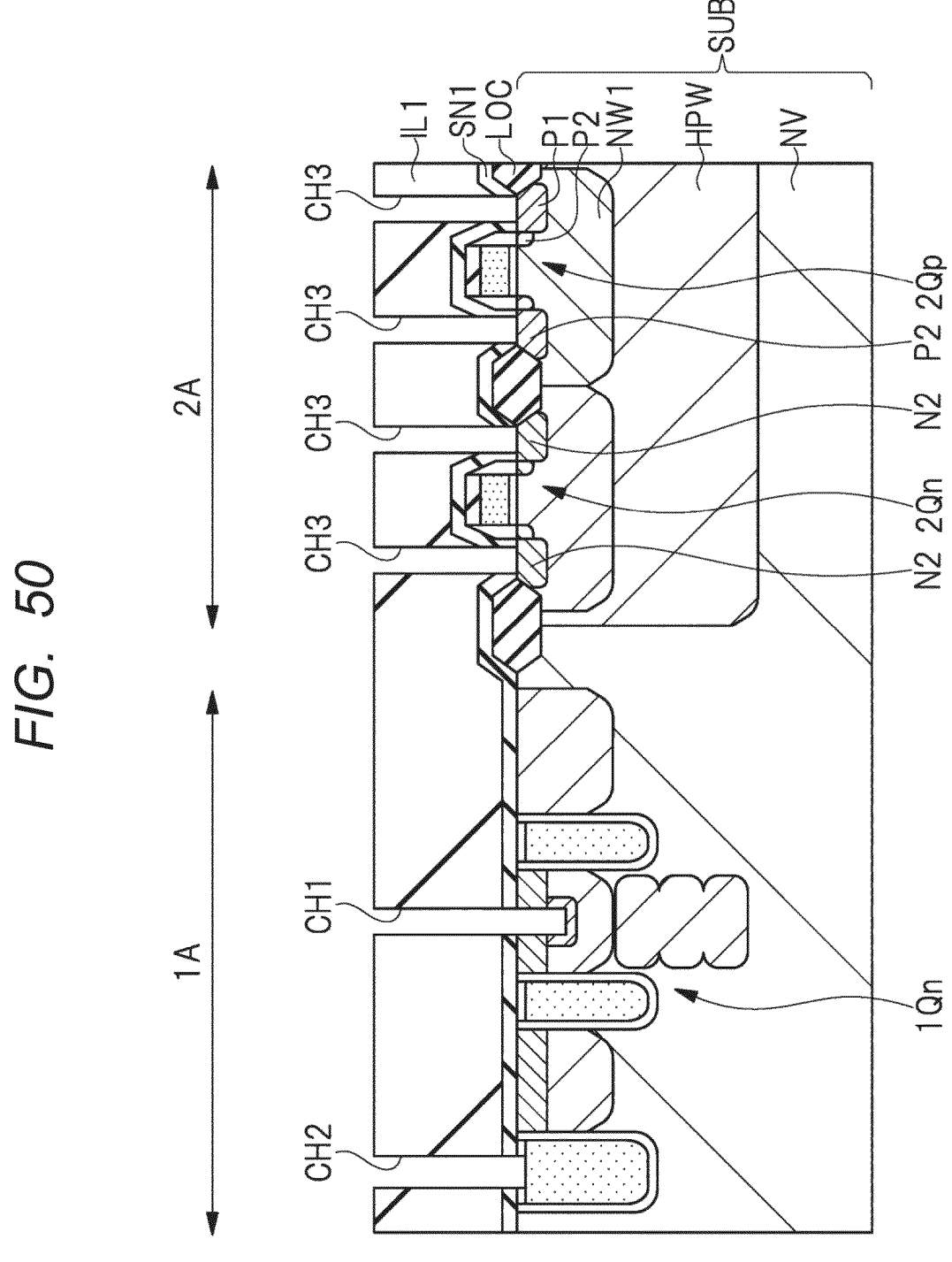
FIG. 50 is a cross-sectional view showing the manufacturing process of a semiconductor device following FIG. 48.
Figure 51:
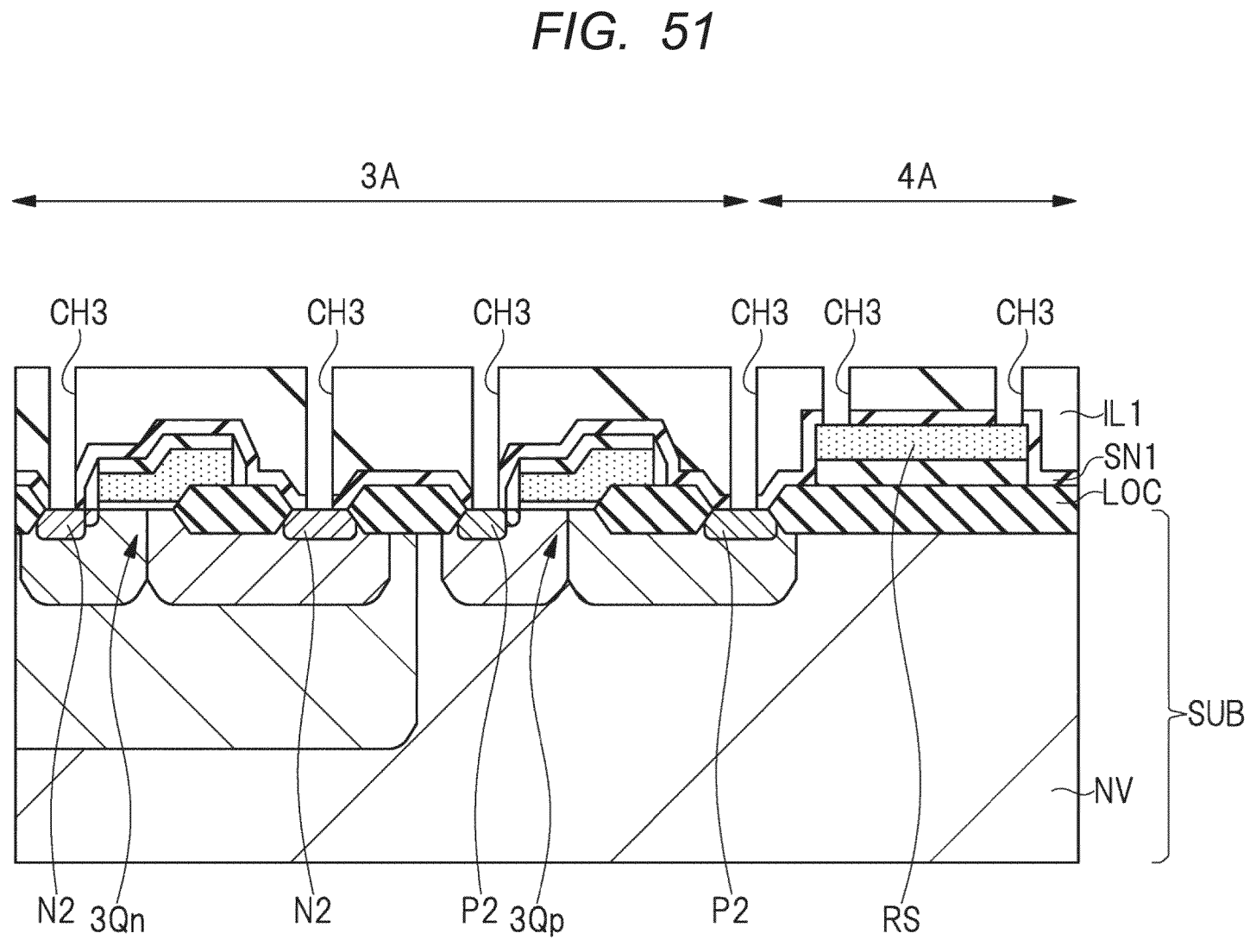

As shown in FIGS. 50 and 51, a plurality of holes CH3 is formed in the interlayer insulating film IL1 and in the silicon nitride film SN1 in the regions 2A to 4A by the photolithography technique and the anisotropic etch process. In the region 2A, the plurality of holes CH3 reaches the source region and the drain region of each of MOSFET2Qn, 2Qp. In the region 3A, the plurality of holes CH3 reaches the source region and the drain region of each of MOSFET3Qn, 3Qp. In the region 4A, the plurality of holes CH3 reaches the resistive element RS. As in the manufacturing process of the hole CH1, in the etching of the interlayer insulating film IL1, the silicon nitride film SN1 functions as an etching stopper.

Although not illustrated here, a hole CH3 reaching the gate-electrodes GE2, GE3 is also formed in the interlayer insulating film IL1 and the silicon nitride film SN1.

In the manufacturing process of the hole CH1, etching to a deeper position is required as compared with the manufacturing process of the hole CH2 and the manufacturing process of the hole CH3, and the semiconductor substrate SUB also needs to be etched. Further, there is also a process of manufacturing the high-concentration diffused-region PR after the hole CH1 is formed. Therefore, it is preferable that the manufacturing process of the hole CH1, the manufacturing process of the hole CH2, and the manufacturing process of the hole CH3 are separate processes.

In the manufacturing process of the hole CH2, since the capping film CP1 is etched, the manufacturing process of the hole CH2 and the manufacturing process of the hole CH3 are also preferably separate processes.

However, since the thickness of the capping film CP1 is relatively thin compared with the interlayer insulating film IL1 or the like, the manufacturing process of the hole CH2 and the manufacturing process of the hole CH3 may be the same process as long as the etching damage to the source region and the drain region of each of MOSFET2Qn, 2Qp, 3Qn, 3Qp is within an acceptable range. In particular, in the first embodiment, since the position of the upper surface of the gate electrode GEL is close to the position of the upper surface of the semiconductor substrate SUB, it is possible to shorten the period in which the hole CH2 reaches the gate electrode GE1. Therefore, even when the manufacturing process of the hole CH2 and the manufacturing process of the hole CH3 are the same process, the etching damage can be reduced as compared with the examined example 1 and the like.

Figure 52:
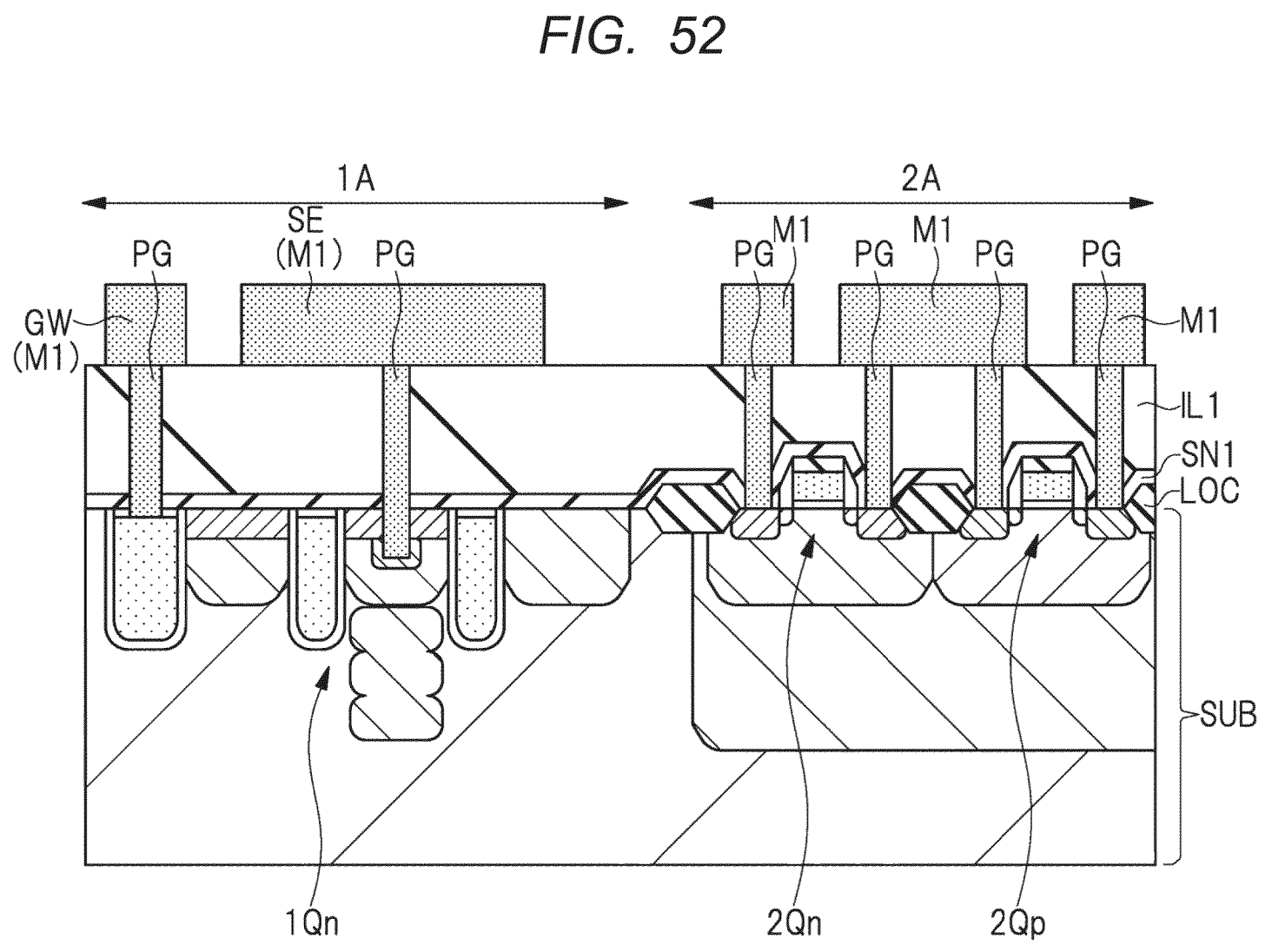
Figure 53:
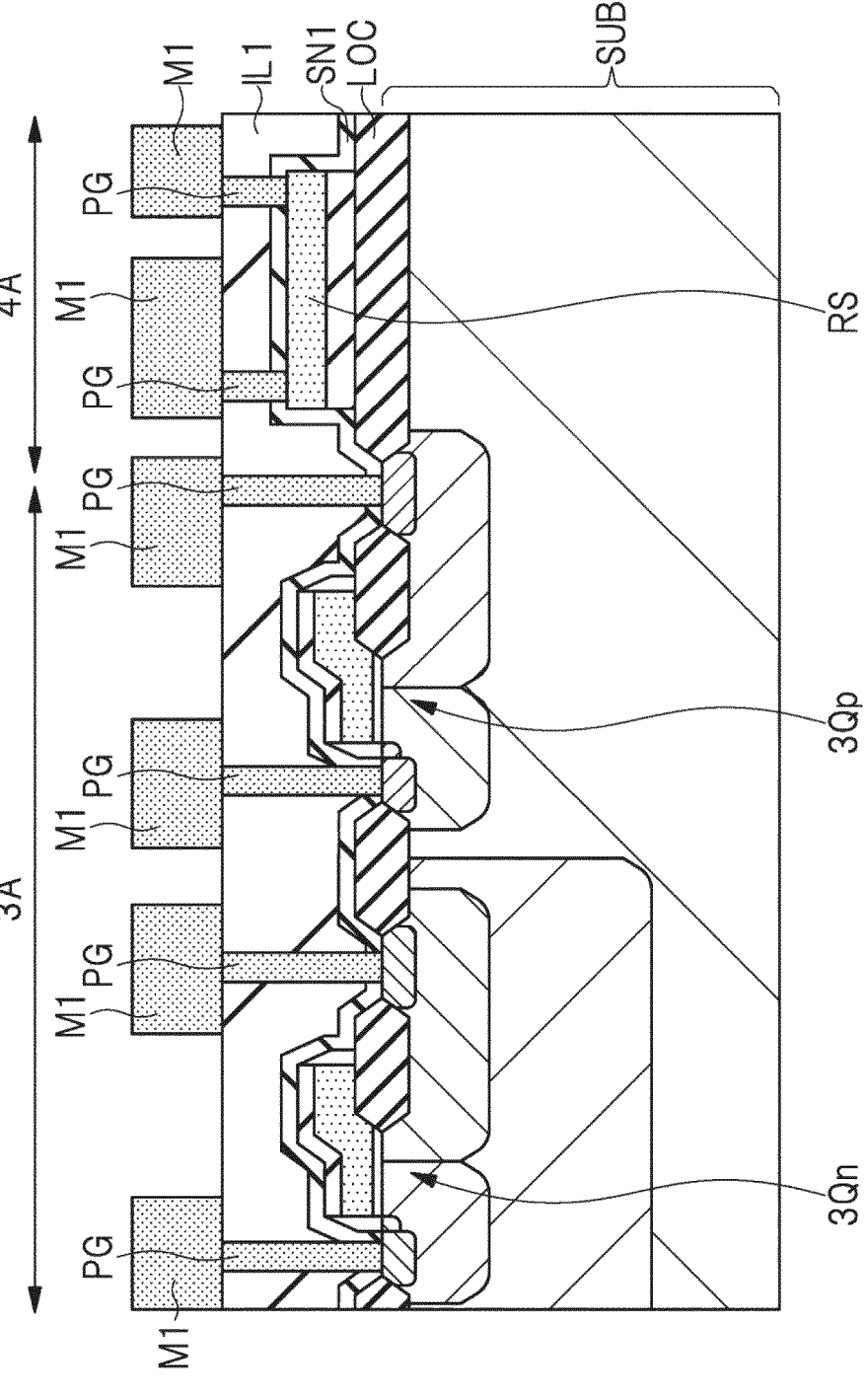
FIG. 53 is a cross-sectional view showing the manufacturing process of a semiconductor device following FIG. 51.

As shown in FIGS. 52 and 53, a plug PG is formed inside each of the holes CH1 to CH3. First, a barrier metal film is formed inside each of the holes CH1 to CH3 and on the interlayer insulating film IL1 by, for example, a sputtering method. Next, a conductive film is formed on the barrier metal film by, for example, a CVD method so as to fill the inside of each of the holes CH1 to CH3. Next, for example, an anisotropic etch process is performed to remove the barrier metal film and the conductive film formed outside each of the holes CH1 to CH3. As a result, a plug PG is formed in the interlayer insulating film IL1. The barrier metal film is, for example, a laminated film of a titanium film and a titanium nitride film. The conductive film is, for example, a tungsten film.

Next, a first barrier metal film, a conductive film, and a second barrier metal film are sequentially formed on the interlayer insulating film IL1 by, e.g., sputtering or CVD. Next, the first barrier metal film, the conductive film, and the second barrier metal film are patterned to form a wiring M1 connected to the plug PG on the interlayer insulating film IL1. The first barrier metal film is, for example, a laminated film of a titanium film and a titanium nitride film. The conductive film is, for example, an aluminum film or an aluminum alloy film to which copper or silicon is added. The second barrier metal film is, for example, a laminated film of a titanium film and a titanium nitride film.

Thereafter, the structure shown in FIGS. 4 and 5 is obtained through the following manufacturing steps.

An interlayer insulating film IL2 is formed on the interlayer insulating film IL1 so as to cover the wiring M1. In order to form the interlayer insulating film IL2, first, a first silicon-oxide film is formed on the interlayer insulating film IL1 by, for example, high-density plasma CVD (HDP-CVD: High Density Plasma CVD). Next, a second silicon oxide film is formed on the first silicon oxide film by, e.g., CVD. Next, the first silicon oxide film and the second silicon oxide film are planarized by polishing using a CMP method. As a result, an interlayer insulating film IL2 including the first silicon oxide film and the second silicon oxide film is formed. Note that a hydrogen-alloy treatment may be performed after the interlayer insulating film IL2 is formed and prior to the formation of a via V1 to be described later. The hydrogen alloy treatment is a heat treatment performed in a hydrogen atmosphere under the condition, for example, at 400 degrees Celsius for 20 minutes. By this hydrogen-alloying process, dangling bonds near the upper surface of the semiconductor substrate SUB can be terminated, and variations in the threshold-voltage of MOSFET1Qn can be improved.

Next, a via V1 is formed in the interlayer insulating film IL2 so as to be connected to the wiring M1. In order to form the via V1, first, a contact hole is formed in the interlayer insulating film IL2 by a photolithography technique and an anisotropic etch process. Next, a barrier metal film is formed on the inside of the contact hole and on the interlayer insulating film IL2 by, for example, a CVD method. Next, a conductive film is formed on the barrier metal film by, for example, a CVD method so as to fill the inside of the contact hole. Next, for example, an anisotropic etching process is performed to remove the barrier metal film and the conductive film formed outside the contact hole. As a result, a via V1 is formed in the interlayer insulating film IL2. The barrier metal film is, for example, a titanium nitride film. The conductive film is, for example, a tungsten film.

Next, a wiring M2 is formed on the interlayer insulating film IL2 so as to be connected to the via V1. Next, an interlayer insulating film IL3 is formed on the interlayer insulating film IL2 so as to cover the wiring M2. Next, a via V2 is formed in the interlayer insulating film IL3 so as to be connected to the wiring M2. The manufacturing process of the wiring M2, the interlayer insulating film IL3, and the via V2 can be performed by the same method as or a similar method to the manufacturing process of the wiring M1, the interlayer insulating film IL2, and the via V1.

After forming the interlayer insulating film IL3 and prior to forming the via V2, the hydrogen-alloy treatment may be performed under the same conditions as described above. The hydrogen-alloy treatment may be performed only after the interlayer insulating film IL2 is formed, only after the interlayer insulating film IL3 is formed, or both.

Next, a wiring M3 is formed on the interlayer insulating film IL3 so as to be connected to the via V2. In order to form the wiring M3, first, a barrier metal film and a conductive film are sequentially formed on the interlayer insulating film IL3 by, for example, a sputtering method or a CVD method. Next, the barrier metal film and the conductive film are patterned to form a wiring M3 on the interlayer insulating film IL3. The barrier metal film is, for example, a titanium tungsten f film. The conductive film is, for example, an aluminum film or an aluminum alloy film to which copper or silicon is added.

Next, a protective film PVF is formed on the interlayer insulating film IL3 by, for example, a coating method so as to cover the wiring M3. The protective film PVF is, for example, a polyimide film. Next, openings OP1, OP2 are formed in the protective film PVF on the wiring M3 so that a part of the wiring M3 is exposed (see FIGS. 67 and 70). A portion of the wiring M3 exposed in the openings OP1, OP2 constitutes a source pad PADS or a pad PAD for connecting to the external connection member BW.

Thereafter, the lower surface of the semiconductor substrate SUB is polished as needed. Next, an n-type drain-region ND is formed by introducing, for example, arsenic (As) or the like into the lower surface of the semiconductor substrate SUB by ion-implantation. Next, a drain-electrode DE is formed under the lower surface of the semiconductor substrate SUB by a sputtering method.

When the semiconductor substrate SUB is a stack of an n-type silicon substrate and an n-type semiconductor layer, the n-type silicon substrate is thinned by the above-described polishing. In this case, when the n-type silicon substrate is left, the remaining n-type silicon substrate can function as the drain region ND, so that forming of the drain region ND by the ion-implantation method is not necessary. Thus, the semiconductor device 100 is manufactured.

<Pad Structure>

The characteristics of the source pad PADs and the pad PAD in the first embodiment will be described below with reference to FIG. 66 to FIG. 70.

Figure 66:
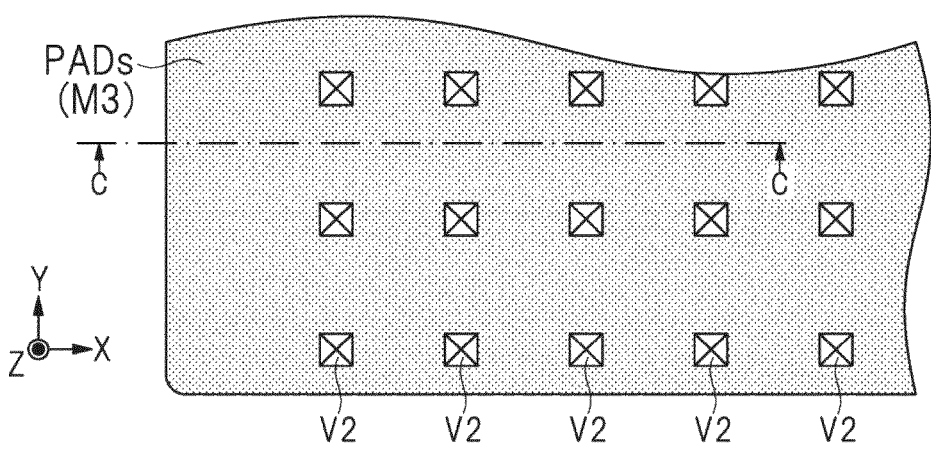
FIG. 66 is a plan view that enlarges a part of semiconductor device in first embodiment.
Figure 66:
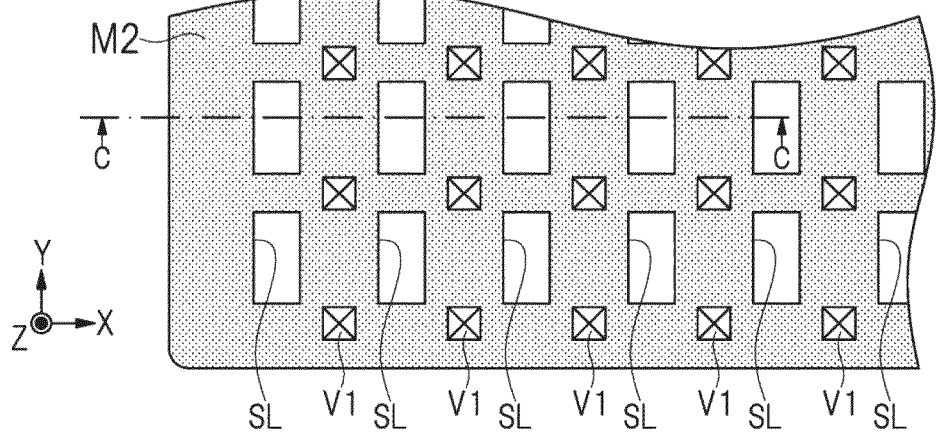
Figure 66:
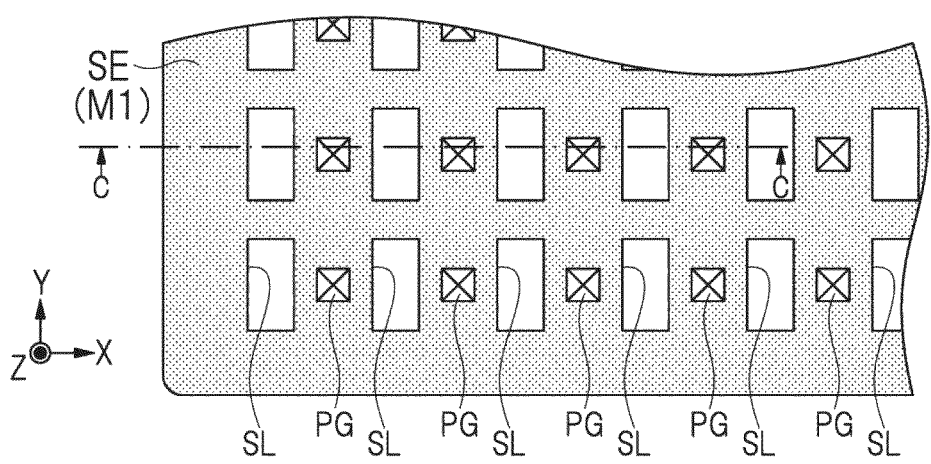

FIG. 66 is a plan view corresponding to the enlarged area 10 surrounded by a dashed line of the source pad PADs shown in FIG. 1. FIG. 67 is a cross-sectional view along C-C of FIG. 66. In FIG. 67, although the via V1 and the via V2 are not actually shown, the via V1 and the via V2 are indicated by dashed lines in order to make the vertical relationship of the respective configurations easy to understand.

As shown in FIGS. 66 and 67, at a position overlapping with the source pad PADs in plan view, the wiring M2 is provided with a plurality of slits SL penetrating the wiring M2, the wiring M1 is provided with a plurality of slits SL penetrating the wiring M1, and the semiconductor substrate SUB is provided with a plurality of MOSFET1Qn. Note that such a slit SL is not provided in the source pad PADs which is a part of the wiring M3.

In the wiring M1 and the wiring M2, the plurality of slits SL is formed to have a rectangular shape in plan view, and is provided in a matrix form such that the long direction of them is the column direction. In FIG. 66, the column direction is the Y direction and the row direction is the X direction. Further, the plurality of slits SL of the wiring M2 is provided at a position overlapping with the plurality of slits SL of the wiring M1 in plan view. Further, the plurality of plugs PG, the plurality of vias V1, and the plurality of vias V2 are provided between the respective columns of the plurality of slits SL, respectively.

According to studies conducted by the inventors of the present disclosure, it has been found that, if the wiring M2 and the wiring M1 under the source pad PADs are provided without a plurality of slits SL and when the external connection member BW is formed on the source pad PADs, the stress from the external connection member BW tends to cause cracks in the interlayer insulating film IL3. In addition, it has been found that cracks are likely to occur not only in the interlayer insulating film IL3 but also in the interlayer insulating films IL2, IL1 below the interlayer insulating film IL3.

As in the first embodiment, the plurality of slit SL are provided in the wiring M2 and the wiring M1, so that the stresses are easily released downward through the plurality of slits SL. Therefore, since the generation of cracks can be suppressed, the reliability of semiconductor device 100 can be improved.

As described above, in the first embodiment, the hydrogen-alloy treatment is performed at least one of (i) after the interlayer insulating film IL2 is formed, and before the via V1 is formed, and (ii) after the interlayer insulating film IL3 is formed, and before the via V2 is formed. By this hydrogen-alloying process, dangling bonds near the upper surface of the semiconductor substrate SUB can be terminated, and variations in the threshold-voltage of MOSFET1Qn can be improved.

However, according to studies conducted by the inventors of the present disclosure, it was found that the hydrogen alloy treatment tends to be easily absorbed by the barrier metal films (titanium film and titanium nitride film) contained in the wiring M1 and the wiring M2. As shown in the first embodiment, by providing a plurality of slits SL in the wiring M1 and the wiring M2, hydrogen can be easily passed downward through a plurality of slits SL, and hydrogen can reach the vicinity of the upper surface of the semiconductor substrate SUB.

Figure 68:
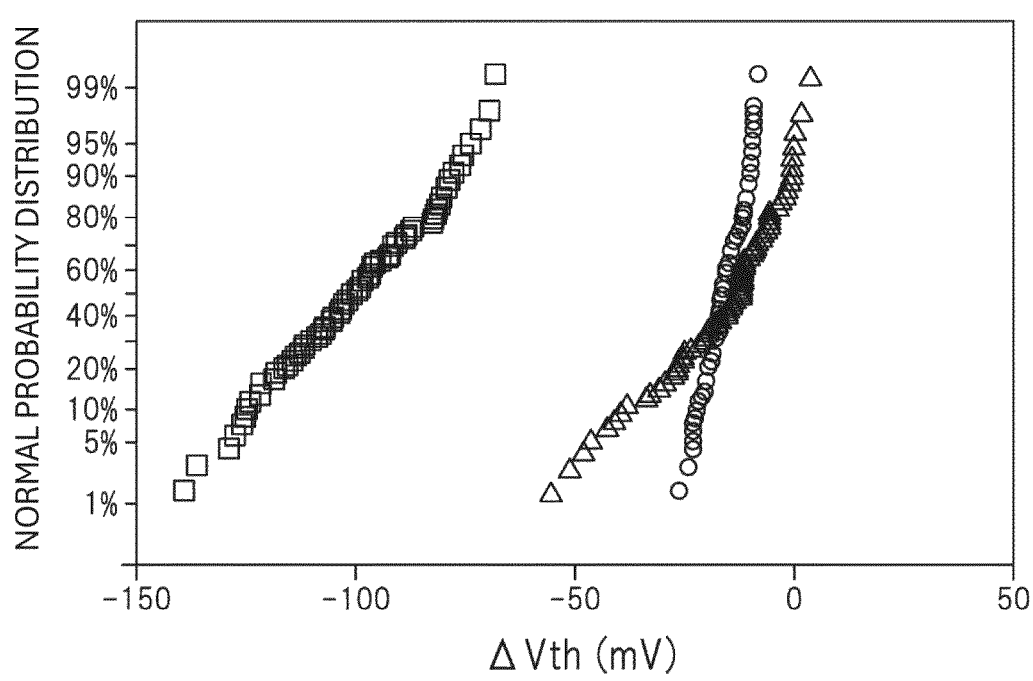
FIG. 68 is a graph showing a data of experiments conducted by the present inventors.

FIG. 68 is a graph showing the results of experiments conducted by the inventors of the present disclosure. In FIG. 68, the vertical axis represents the normal probability distribution, and the horizontal axis represents the variation ((triangle) Vth (delta Vth)) of the threshold voltage of MOSFET1Qn.

As shown in FIG. 68, in the case where the hydrogen-alloy treatment is not performed (square, triangle), the slope of the graph is gentle regardless of the presence or absence of the slit SL. This means that there are much variations in (triangle) Vth (delta Vth) in the plurality of MOSFET1Qn in the wafer plane.

On the other hand, it can be seen that in the case (circle) where the hydrogen-alloy treatment is performed and the slit SL is provided, the slope of the graph is steep, and the variation in (triangle) Vth (delta Vth) is improved.

Figure 69:
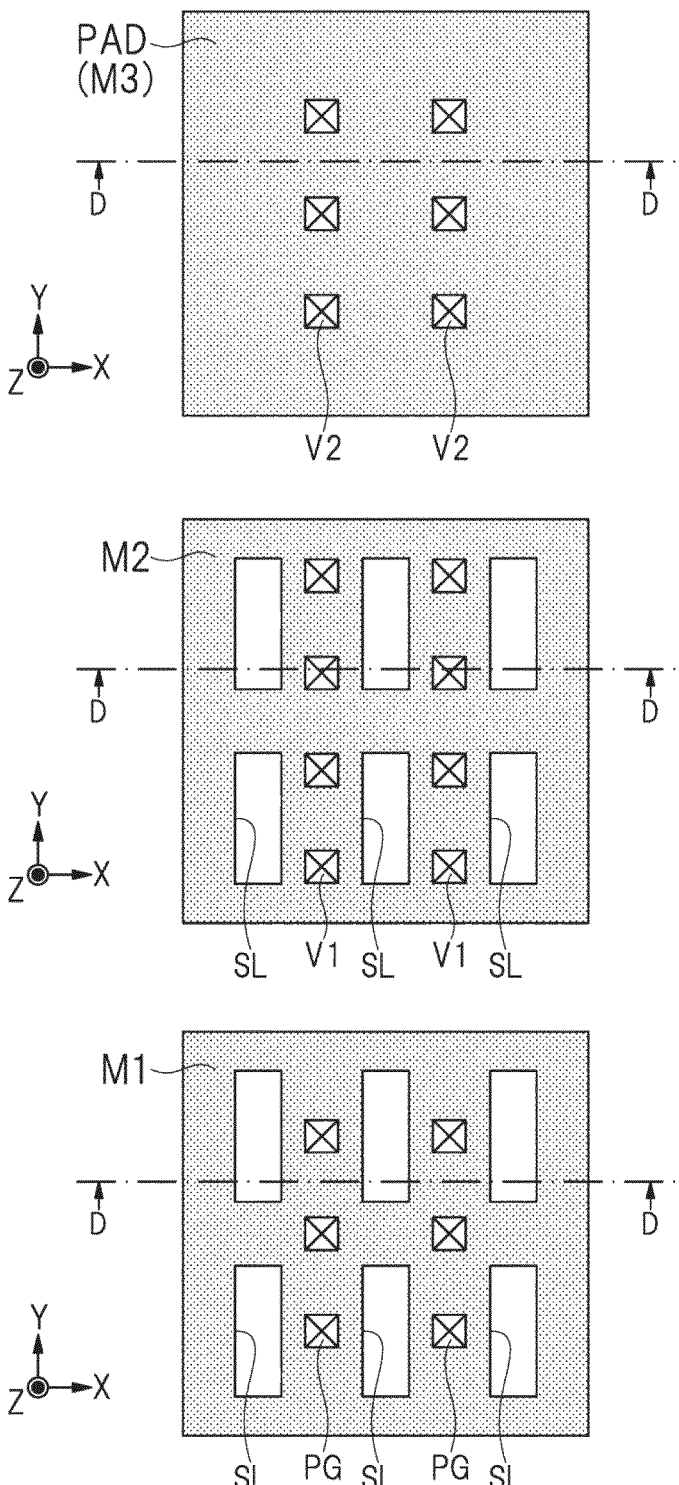
FIG. 69 is a plan view that enlarges a part of semiconductor device in first embodiment.

FIG. 69 is a plan view corresponding to the respective pads PAD shown in FIG. 1. FIG. 70 is a cross-sectional view along D-D of FIG. 69. Note that, in FIG. 70, the plug PG and the via V2 are not actually shown, but the plug PG and the via V2 are indicated by dashed lines in order to make the vertical relationship of the respective configurations easy to understand.

As shown in FIGS. 69 and 70, at a position overlapping with the pad PAD in plan view, a plurality of slits SL going through the wiring M2 are provided in the wiring M2, and a plurality of slits SL going through the wiring M1 are provided in the wiring M1. Note that such a slit SL is not provided in the pad PAD which is a part of the wiring M3.

In addition, MOSFET2Qn, 2Qp, 3Qn, 3Qp and the resistor RS are not provided in the semiconductor substrate SUB at a position overlapping with the pad PAD in plan view. MOSFET2Qn, 2Qp, 3Qn, 3Qp and the resistor RS are electrically connected to the pad PAD via another wirings M1 to M3.

In a position overlapping with the pad PAD in plan view, the device isolation LOC is provided in the semiconductor substrate SUB. A conductive film PL is provided on the device isolation LOC. The conductive film PL is connected to the wiring M1 via a plug PG. Note that the conductive film PL is a film of the same layer as the conductive film CF2 or the conductive film CF3, and is formed in the same step as the step of forming them.

In addition, a p-type well region HPW0 and a p-type well region PW0 are formed in the semiconductor substrate SUB located below the conductive film PL (below the element isolation LOC) so as to surround the conductive film PL and the element isolation LOC in plan view. The well region PW0 is formed in the well region HPW0. The state region HPW0 and the well region PW0 are not electrically connected to the respective MOSFET and wirings M1 to M3, and are electrically floating. The well region HPW0 is formed in the same step as the well region HPW, and the well region PW0 is formed in the same step as the well regions PW1 to PW3.

Also under the pad PAD, in the wiring M1 and the wiring M2, the plurality of slits SL is formed to have a rectangular shape in plan view, and is provided in a matrix form such that the long direction of them is the column direction. Further, the plurality of slits SL of the wiring M2 is provided at a position overlapping with the plurality of slits SL of the wiring M1 in plan view. Further, the plurality of plugs PG, the plurality of vias V1, and the plurality of vias V2 are provided between the respective columns of the plurality of slits SL, respectively. Since the wiring M2 and the wiring M1 are provided with the plurality of slits SL, stress from the external connection member BW can easily escape downward through the plurality of slits SL when the external connection member BW is formed on the pad PAD. Therefore, the generation of cracks can be suppressed even under the pad PAD, so that the reliability of semiconductor device 100 can be improved.

Second Embodiment

The semiconductor device 100 and its manufacturing method in the second embodiment will be described below with reference to FIG. 71 to FIG. 76. Note that, in the following description, differences from the first embodiment will be mainly described, and the description of overlapping points with the first embodiment will be omitted.

In the first embodiment, a silicon nitride film SN1 is provided between the semiconductor substrate SUB and the interlayer insulating film IL1 in the regions 1A to 4A. In the second embodiment, the silicon nitride film SN1 in the regions 2A to 4A is left, but the silicon nitride film SN1 in the region 1A is removed.

Figure 71:
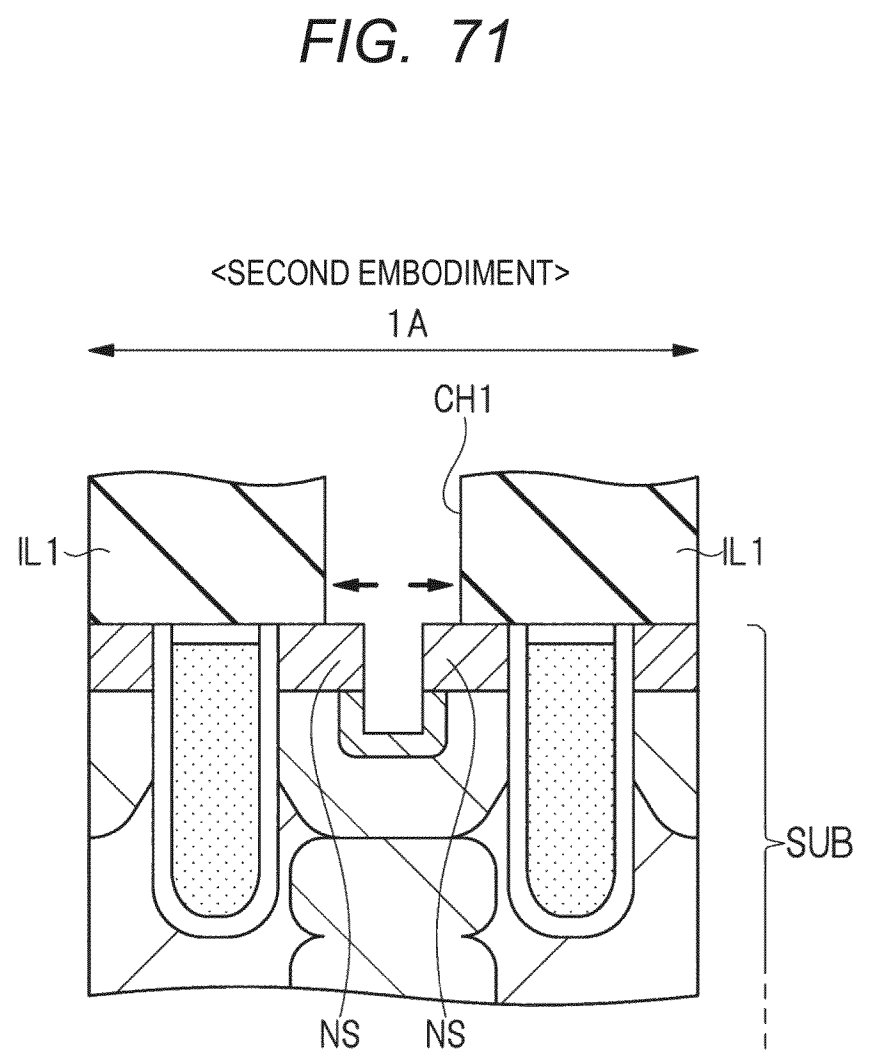

FIG. 71 shows the manufacturing process after the hole CH1 of FIG. 46 is formed. As shown in FIG. 71, in the second embodiment, the interlayer insulating film IL1 retreats by performing an isotropic etch process on the interlayer insulating film IL1. For this isotropic etching treatment, for example, an aqueous solution containing hydrofluoric acid is used. As a result, the opening width of the hole CH1 located on the upper surface of the semiconductor substrate SUB is wider than the opening width of the hole CH1 in the semiconductor substrate SUB. The amount of recession of the interlayer insulating film IL1 caused by the isotropic etch process is, for example, not less than 20 nm and not more than 40 nm.

Increasing the aperture width of the hole CH1 improves the aspect ratio when forming the plug PG of FIG. 52. Therefore, the plug PG is easily embedded well inside the hole CH1. And, since the interlayer insulating film IL1 retracted, the upper surface of the source region NS is exposed. Therefore, the plug PG not only contacts the side surface of the source region NS but also contacts the upper surface of the source region NS inside the hole CH1. Thus, it is possible to reduce the contact-resistance between the plug PG and the source region NS.

Figure 72:
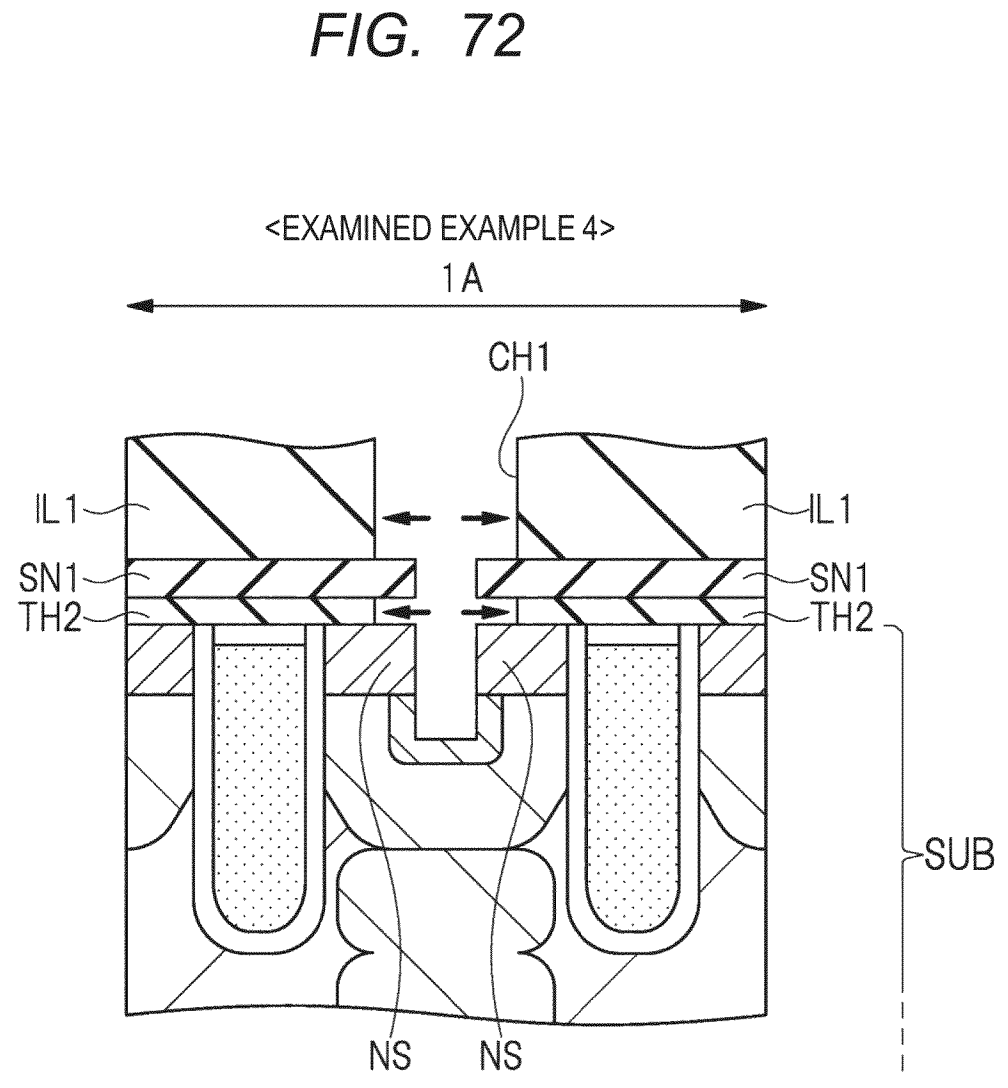

FIG. 72 shows a manufacturing process of a semiconductor device in the examined example 4. Note that the examined example 4 is not a conventional technique, but is a new knowledge obtained by the inventors of the present disclosure through studies.

First, in order to obtain the hole CH1 as shown in FIG. 71, the silicon nitride film SN1 in the region 1A needs to be removed. However, if a silicon oxide film is formed between the semiconductor substrate SUB and the silicon nitride film SN1 as in the examined example 4, not only the interlayer insulating film IL1 but also the silicon oxide film retreat by the isotropic etch process. Such the silicon oxide film can utilize, for example, a through film used for forming a source region NS or the like by ion-implantation in FIG. 36. Here, the silicon-oxide film used in the ion-implantation of FIG. 36 is shown as a through-film TH2.

When the through-film TH2 also retreats together with the interlayer insulating film IL1, the upper surface of the source-region NS is exposed. However, since the silicon nitride film SN1 is left in an eaves shape, when the barrier metal film of the plug PG is formed, a portion where the barrier metal film is difficult to be deposited appears inside the hole CH1. For example, it is difficult to uniformly deposit the barrier metal film in a space between the eaves-shaped silicon nitride film SN1 and the upper surface of the semiconductor substrate SUB. Therefore, a portion where the barrier metal film is broken easily occurs inside the hole CH1, and such a portion causes a defect. In view of this problem, when the opening width of the hole CH1 is increased, it is preferable that the silicon nitride film SN1 in the region 1A is removed.

FIG. 73 to FIG. 76 show the manufacturing process performed between the manufacturing and the process of FIG. 36 manufacturing process of FIG. 38, and show the process of selectively removing the silicon nitride film SN1 in the region 1A. Note that the region 3A and the region 4A are substantially the same description as the region 2A, and thus are not illustrated. In addition, in FIG. 73, the above-described through film TH2 may be left or removed. Here, the above-described through-film TH2 is removed as an example.

Figure 73:
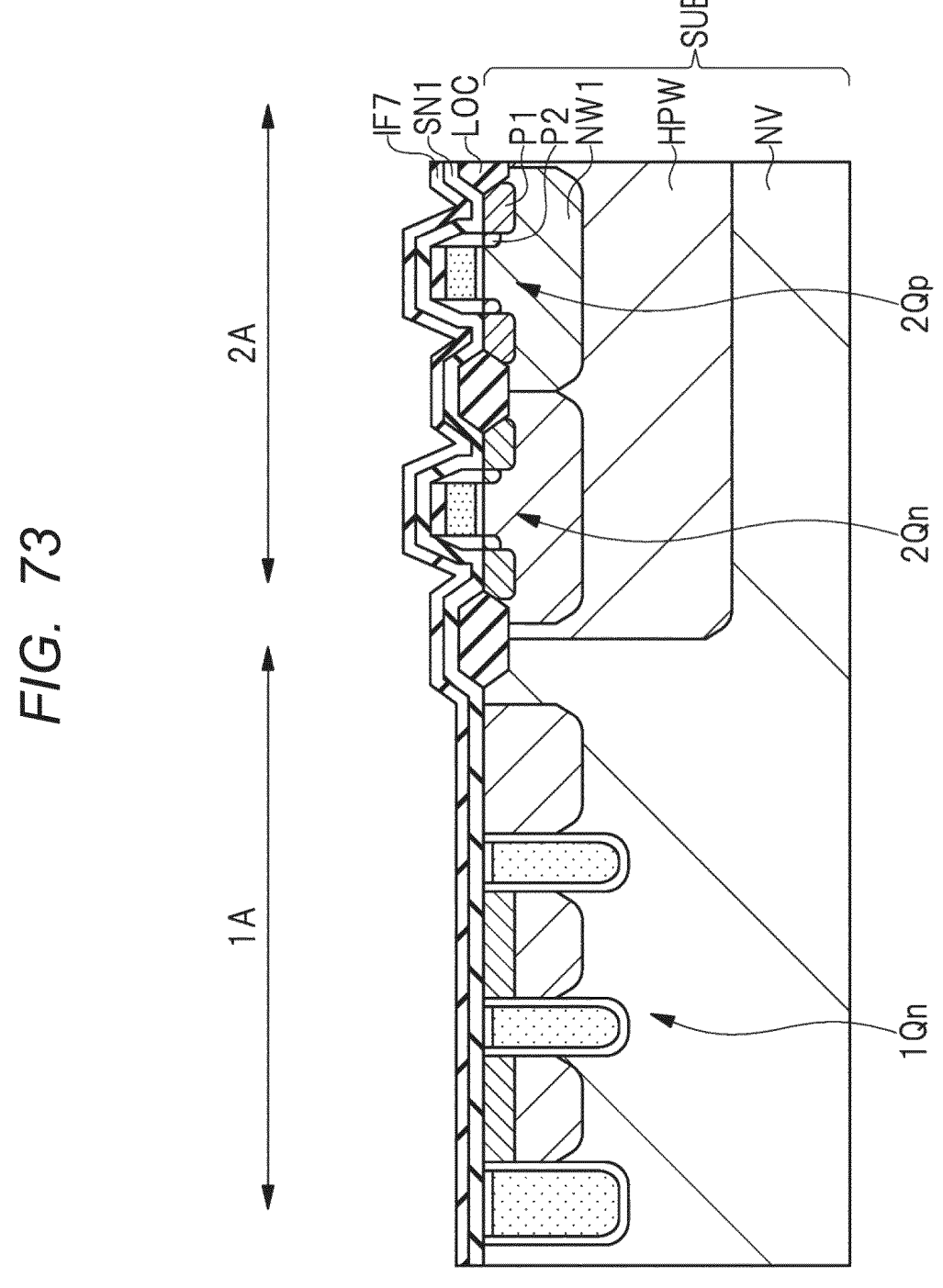
FIG. 73 is a cross-sectional view showing the manufacturing process of a semiconductor device in second embodiment.

As shown in FIG. 73, after the silicon nitride film SN1 is formed in FIG. 36, an insulating film IF7 made of a silicon oxide film is formed on the silicon nitride film SN1 by, for example, a CVD method. The thickness of the insulating film IF7 is, for example, 10 nm or more and 30 nm or less.

Figure 74:
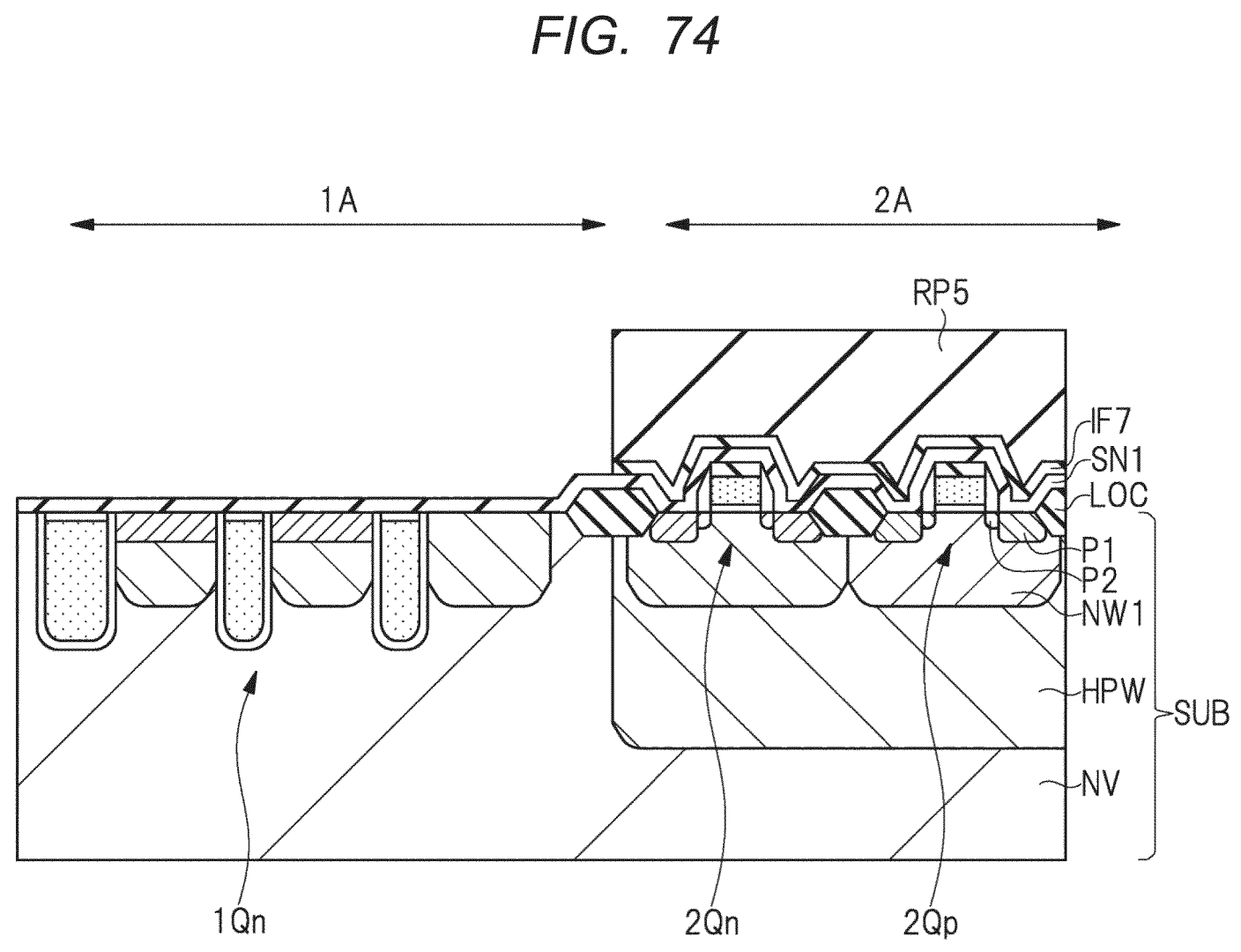

As shown in FIG. 74, first, a resist pattern RP5 is formed on the insulating film IF7 so as to open the region 1A and cover the regions 2A to 4A. Next, an anisotropic etch process is performed using the resist pattern RP5 as a mask to remove the insulating film IF7 on the region 1A. Next, the resist pattern RP5 is removed by ashing.

Figure 75:
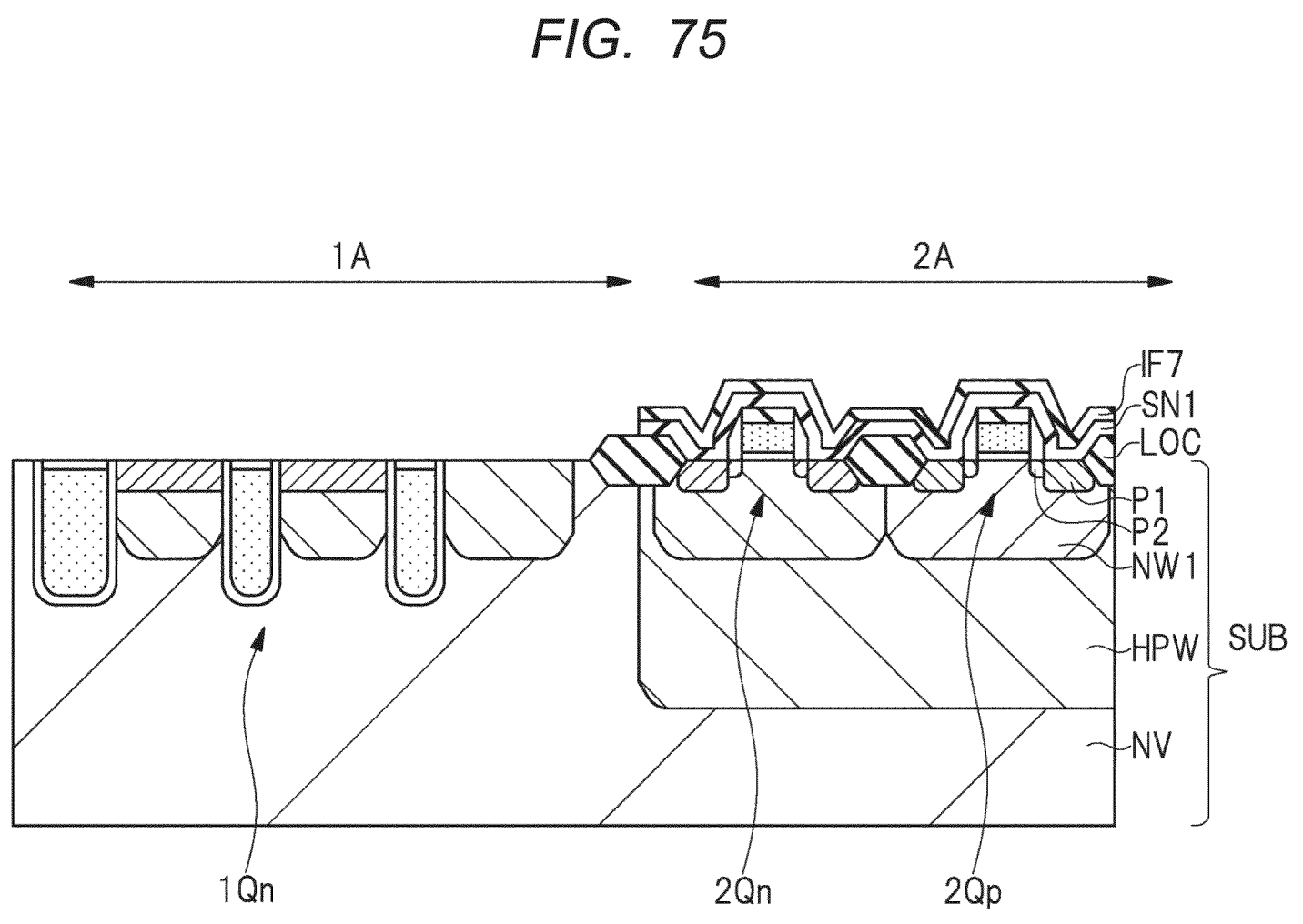

As shown in FIG. 75, the silicon nitride film SN1 in the region 1A is removed by performing an isotropic etch process using an aqueous solution containing phosphoric acid using the insulating film IF7 in the regions 2A to 4A as a mask. Thereafter, the insulating film IF7 may be removed by performing an isotropic etching process using an aqueous solution containing hydrofluoric acid, but the insulating film IF7 may be left on the regions 2A to 4A. When the insulating film IF7 is left, the insulating film IF7 constitutes a part of the interlayer insulating film IL1 similarly to the insulating film IF5.

Figure 76:
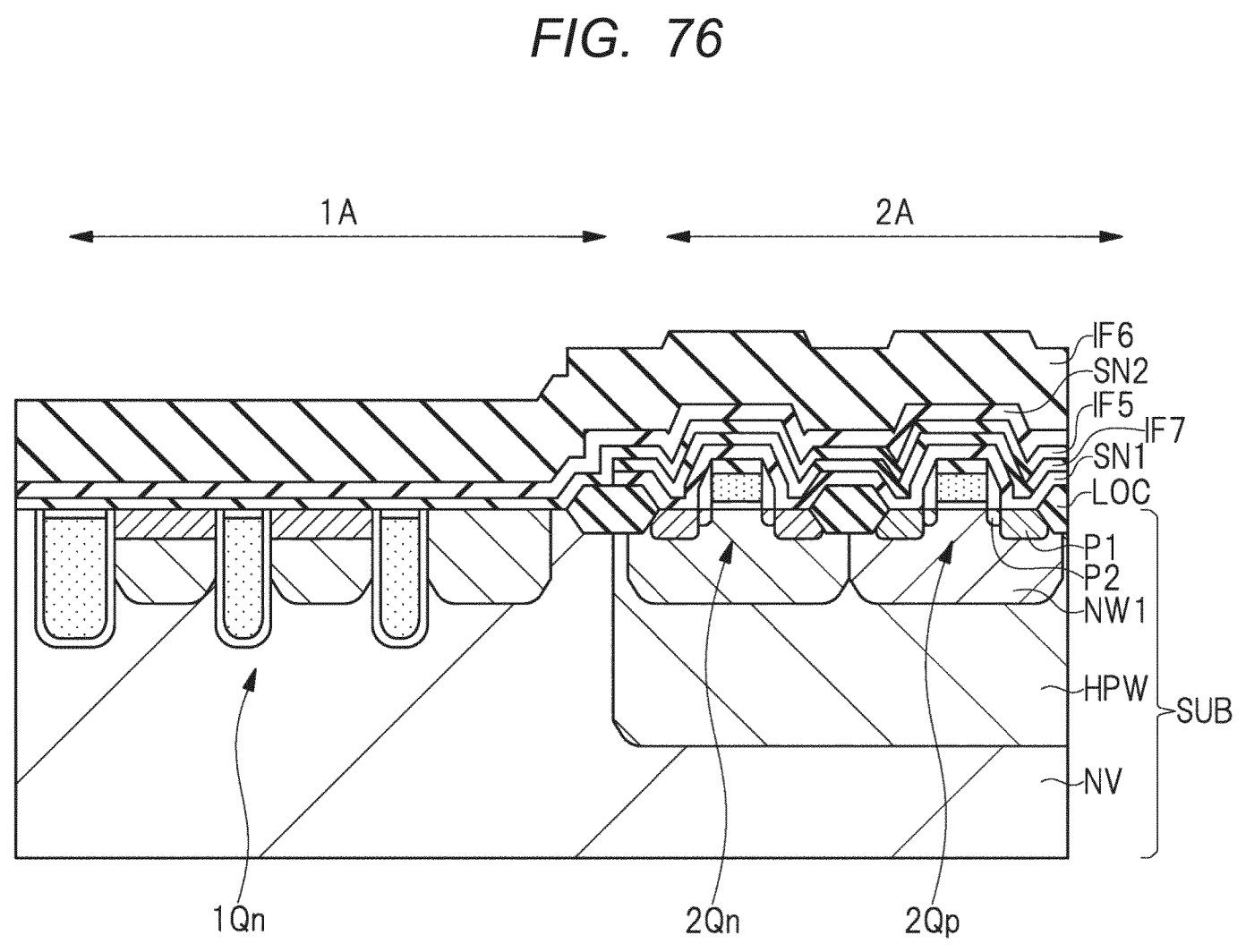

After the manufacturing process of FIG. 75, the same manufacturing process as that of the first embodiment is performed. FIG. 76 shows a state in which the insulating film IF5, the silicon nitride film SN2, and the insulating film IF6 made of a silicon oxide film are sequentially formed as described with reference to FIG. 38.

Although the present invention has been described in detail based on the above-described embodiments, the present invention is not limited to the above-described embodiments, and can be variously modified without departing from the gist thereof.

What is claimed is:

1. A method of manufacturing a semiconductor device having a first region in which a first MOSFET is formed and a second region in which a second MOSFET and a third MOSFET are formed, the method comprising:

(a) preparing a semiconductor substrate of a first conductivity type having an upper surface;

(b) in the first region, forming a trench having a depth on the upper surface of the semiconductor substrate;

(c) forming a first gate insulating film inside the trench;

(d) forming a first gate electrode so as to fill the inside of the trench via the first gate insulating film;

(e) in the first region, forming a body region of a second conductivity type opposite to the first conductivity type in the semiconductor substrate close to the upper surface so as to be shallower than the depth of the trench;

(f) in the second region, forming a second well region of the second conductivity type in the semiconductor substrate close to the upper surface;

(g) in the second region, forming a third well region of the first conductivity type in the semiconductor substrate close to the upper surface;

(h) forming a second gate insulating film on the second well region and forming a third gate insulating film on the third well region;

(i) forming a second gate electrode on the second gate insulating film and forming a third gate electrode on the third gate insulating film;

(j) in the body region, forming a first source region of the first conductivity type;

(k) in the second well region, forming a second source region of the first conductivity type and a second drain region of the first conductivity type;

(l) in the third well region, forming a third source region of the second conductivity type and a third drain region of the second conductivity type;

(m) after the steps of (j), (k) and (l), forming an interlayer insulating film on the upper surface of the semiconductor substrate of the first region and the second region so as to cover the first gate electrode, the second gate electrode and the third gate electrode;

(n) after the step (m), forming a first hole in the interlayer insulating film, in the first source region and in the body region so that a bottom portion of the first hole is located inside the body region;

(o) after the step of (m), forming a plurality of third holes in the interlayer insulating film so as to reach the second source region, the second drain region, the third source region and the third drain region; and (p) after the steps of (n) and (o), forming plugs inside of each of the first hole and the plurality of third holes, wherein the first MOSFET includes the first gate insulating film, the first gate electrode, the body region and the first source region;

wherein the second MOSFET includes the second gate insulating film, the second gate electrode, the second source region and the second drain region;

wherein the third MOSFET includes the third gate insulating film, the third gate electrode, the third source region and the third drain region; and wherein the steps of (n) and (o) are performed separately.

2. The method of manufacturing a semiconductor device according to claim 1, further comprising:

(q) between the steps of (m) and (p), forming a second hole in the interlayer insulating film so as to reach the first gate electrode, wherein the steps of (n), (o) and (q) are performed separately, and in the step of (p), the plug is formed also inside the second hole.

3. The method of manufacturing a semiconductor device according to claim 1, further comprising:

(r) after the steps of (j), (k) and (l) and before the step of (m), forming a first silicon nitride film on the upper surface of the semiconductor substrate of the first region and the second region so as to cover the first gate electrode, the second gate electrode and the third gate electrode;

wherein, in the step of (m), the interlayer insulating film is formed on the first silicon nitride film;

wherein, in the step of (n), the first hole is formed also in the first silicon nitride film; and wherein, in the step of (o), the plurality of third holes is formed also in the first silicon nitride film.

4. The method of manufacturing a semiconductor device according to claim 3, further comprising:

(s) between the steps of (r) and (m), sequentially forming a first silicon oxide film, a second silicon nitride film and a second silicon oxide film on the first silicon nitride film;

(t) between the steps of (s) and (m), forming an opening in the second silicon oxide film located on the body region;

(u) between the steps of (t) and (m), forming a column region of the second conductivity type in the semiconductor substrate located under the body region by performing ion implantation so as to pass through the first silicon nitride film, the first silicon oxide film and the second silicon nitride film inside the opening;

(v) between the steps of (u) and (m), removing the second silicon oxide film using the second silicon nitride film as an etching stopper; and (w) between the steps of (v) and (m), removing the second silicon nitride film using the first silicon oxide film as an etching stopper.

5. The method of manufacturing a semiconductor device according to claim 1, further comprising:

(r) after the steps of (j), (k) and (l) and before the step of (m), forming a first silicon nitride film on the upper surface of the semiconductor substrate of the first region and the second region so as to cover the first gate electrode, the second gate electrode and the third gate electrode; and (x) between the steps of (r) and (m), selectively removing the first silicon nitride film of the first region so that the first silicon nitride film of the second region is left, wherein, in the step of (m), the interlayer insulating film of the second region is formed on the first silicon nitride film, and wherein, in the step of (o), the plurality of third holes is formed also in the first silicon nitride film.

6. The method of manufacturing a semiconductor device according to claim 5, further comprising:

(y) after the first hole is formed in the step of (n), expanding an opening width of the first hole in the interlayer insulating film such that a part of an upper surface of the first source region is exposed by performing an isotropic etching process on the interlayer insulating film of the first region.

7. The method of manufacturing a semiconductor device according to claim 5, further comprising:

(s) between the steps of (x) and (m), sequentially forming a first silicon oxide film, a second silicon nitride film, and a second n oxide film on the upper surface of the semiconductor substrate of the first region and on the first silicon nitride film of the second region;

(t) between the steps of (s) and (m), forming an opening in the second silicon oxide film located on the body region;

(u) between the steps of (t) and (m), forming a column region of the second conductivity type in the semiconductor substrate located under the body region by performing ion implantation so as to pass through the first silicon oxide film and the second silicon nitride film inside the opening;

(v) between the steps of (u) and (m), removing the second silicon oxide film using the second silicon nitride film as an etching stopper; and (w) between the steps of (v) and (m), removing the second silicon nitride film using the first silicon oxide film as an etching stopper.

8. A semiconductor device comprising:

a semiconductor substrate of a first conductivity type, having an upper surface;

a first interlayer insulating film formed on the upper surface of the semiconductor substrate;

a plurality of first plugs formed in the first interlayer insulating film, the plurality of first plugs being connected to a part of the semiconductor substrate;

a first wiring formed on the first interlayer insulating film, the first wiring being connected to the plurality of first plugs;

a second interlayer insulating film formed on the first interlayer insulating film so as to cover the first wiring;

a plurality of first vias formed in the second interlayer insulating film, the plurality of first vias being connected to the first wiring;

a second wiring formed on the second interlayer insulating film, the second wiring being connected to the plurality of first vias;

a third interlayer insulating film formed on the second interlayer insulating film so as to cover the second wiring;

a plurality of second vias formed in the third interlayer insulating film, the plurality of second vias being connected to the second wiring;

a third wiring formed on the third interlayer insulating film, the third wiring being connected to the plurality of second vias;

a protective film formed on the third interlayer insulating film so as to cover the third wiring; and a first opening formed in the protective film on the third wiring so as to expose a part of the third wiring, wherein a part of the third wiring exposed in the first opening composes a first pad for connecting to a first external connection member;

wherein, at a position overlapping with the first pad in plan view, a plurality of first slits going through the first wiring is provided in the first wiring; and wherein, at a position overlapping with the first pad in plan view, a plurality of second slits going through the second wiring is provided in the second wiring.

9. The semiconductor device according to claim 8, further comprising:

a plurality of first MOSFETS, wherein each of the plurality of first MOSFETs comprises:

a trench having a depth formed on the upper surface of the semiconductor substrate;

a first gate insulating film formed inside the trench;

a first gate electrode formed inside the trench such that the first gate electrode fills the inside of the trench via the first gate insulating film;

a body region of a second conductivity type opposite to the first conductivity type formed in the semiconductor substrate, on the upper surface side of the semiconductor substrate, so as to be shallower than the depth of the trench; and a first source region of the first conductivity type formed in the body region, wherein the plurality of first MOSFETs is formed at a position overlapping with the first pad in plan view; and wherein the first source regions and the body regions of the plurality of first MOSFETs are, as parts of the semiconductor substrate, connected to the plurality of first plugs.

10. The semiconductor device according to claim 9, wherein:

the plurality of first slits and the plurality of second slits have a rectangular shape in plan view, and are provided in a matrix form such that a long direction of them is a column direction; and the plurality of first plugs, the plurality of first vias and the plurality of second vias are provided between the respective columns of the plurality of first slits and the plurality of second slits.

11. The semiconductor device according to claim 9, further comprising:

an element isolation formed on the upper surface of the semiconductor substrate;

a conductive film formed on the element isolation;

a plurality of second plugs formed in the first interlayer insulating film, the plurality of second plugs being connected to the conductive film;

a fourth wiring formed on the first interlayer insulating film, the fourth wiring being connected to the plurality of second plugs;

a plurality of third vias formed in the second interlayer insulating film, the plurality of third vias being connected to the fourth wiring;

a fifth wiring formed on the second interlayer insulating film, the fifth wiring being connected to the plurality of third vias;

a plurality of fourth vias formed in the third interlayer insulating film, the plurality of fourth vias being connected to the fifth wiring; and a sixth wiring formed on the third interlayer insulating film, the sixth wiring being connected to the plurality of fourth vias, wherein the first interlayer insulating film covers the element isolation and the conductive film;

wherein the second interlayer insulating film covers the fourth wiring;

wherein the third interlayer insulating film covers the fifth wiring;

wherein the protective film covers the sixth wiring;

wherein a second opening is formed in the protective film on the sixth wiring so as to expose a part of the sixth wiring, wherein a part of the sixth wiring exposed in the second opening composes a second pad for connecting to a second external connection member;

wherein, at a position overlapping with the second pad in plan view, a plurality of third slits going through the fourth wiring is provided in the fourth wiring; and wherein, at a position overlapping with the second pad in plan view, a plurality of fourth slits going through the fifth wiring is provided in the fifth wiring.

12. The semiconductor device according to claim 11, further comprising:

a second MOSFET, wherein the second MOSFET comprises:

a second gate insulating film formed on the upper surface of the semiconductor substrate;

a second gate electrode formed on the second gate insulating film; and a second source region and a second drain region formed in the semiconductor substrate, wherein the second pad is electrically connected to the second gate electrode, the second source region or the second drain region, and is formed at a position which does not overlap with the second MOSFET.

13. The semiconductor device according to claim 12, wherein:

the plurality of third slits and the plurality of fourth slits have a rectangular shape in plan view, and are provided in a matrix form such that a long direction of them is a column direction; and the plurality of second plugs, the plurality of third vias and the plurality of fourth vias are provided between the respective columns of the plurality of third slits and the plurality of fourth slits.

14. The semiconductor device according to claim 11, further comprising:

a well region formed in the semiconductor substrate located below the element isolation and provided so as to surround the element isolation and the conductive film in plan view, wherein the well region is in an electrically floating status.

15. A method of manufacturing a semiconductor device comprising:

(a) preparing a semiconductor substrate of a first conductivity type, having an upper surface;

(b) forming a first interlayer insulating film on the upper surface of the semiconductor substrate;

(c) forming a plurality of first plugs in the first interlayer insulating film so as to connect to a part of the semiconductor substrate;

(d) forming a first wiring on the first interlayer insulating film so as to connect to the plurality of first plugs;

(e) forming a second interlayer insulating film on the first interlayer insulating film so as to cover the first wiring;

(f) forming a plurality of first vias in the second interlayer insulating film so as to connect to the first wiring;

(g) forming a second wiring on the second interlayer insulating film so as to connect to the plurality of first vias;

(h) forming a third interlayer insulating film on the second interlayer insulating film so as to cover the second wiring;

(i) forming a plurality of second vias in the third interlayer insulating film so as to connect to the second wiring;

(j) forming a third wiring on the third interlayer insulating film so as to connect to the plurality of second vias;

(k) forming a protective film on the third interlayer insulating film so as to cover the third wiring; and (l) forming a first opening in the protective film on the third wiring so as to expose a part of the third wiring, wherein a part of the third wiring exposed in the first opening composes a first pad for connecting to a first external connection member;

wherein, at a position overlapping with the first pad in plan view, a plurality of first slits going through the first wiring is provided in the first wiring; and wherein, at a position overlapping with the first pad in plan view, a plurality of second slits going through the second wiring is provided in the second wiring.

16. The method of manufacturing a semiconductor device according to claim 15, further comprising:

(m) between the steps of (a) and (b), forming a first MOSFET in the semiconductor substrate; and (n) at least one of between the steps of (e) and (f) or between the steps of (h) and (i), performing a heat treatment in a hydrogen-atmosphere.

17. The method of manufacturing a semiconductor device according to claim 16, wherein (m) comprises:

(m1) on the upper surface side of the semiconductor substrate, forming a trench having a depth in the semiconductor substrate;

(m2) forming a first gate insulating film inside the trench;

(m3) forming a first gate electrode inside the trench so as to fill the inside of the trench via the first gate insulating film;

(m4) on the upper surface side of the semiconductor substrate, forming a body region of a second conductivity type opposite to the first conductivity type in the semiconductor substrate so as to be shallower than the depth of the trench; and (m5) forming a first source region of the first conductivity type in the body region, wherein the first MOSFET includes the first gate insulating film, the first gate electrode, the body region and the first source region;

wherein the first MOSFET is formed at a position overlapping with the first pad in plan view; and wherein the first source region and the body region are, as a part of the semiconductor substrate, connected to the plurality of first plugs.

18. The method of manufacturing a semiconductor device according to claim 17, wherein:

the plurality of first slits and the plurality of second slits have a rectangular shape in plan view, respectively, and are provided in a matrix form such that a long direction of them is a column direction; and the plurality of first plugs, the plurality of first vias and the plurality of second vias are provided, respectively, between the respective columns of the plurality of first slits and the plurality of second slits.

19. The method of manufacturing a semiconductor device according to claim 17, further comprising:

(o) between the steps of (a) and (b), forming an element isolation on the upper surface of the semiconductor substrate; and (p) between the steps of (m3) and (m4), forming a conductive film on the element isolation, wherein, in the step of (c), a plurality of second plugs is formed in the first interlayer insulating film so as to connect to the conductive film;

wherein, in the step of (d), a fourth wiring is formed on the first interlayer insulating film so as to connect to the plurality of second plugs;

wherein, in the step of (e), also the fourth wiring is covered by the second interlayer insulating film;

wherein, in the step of (f), a plurality of third vias is formed in the second interlayer insulating film so as to connect to the fourth wiring;

wherein, in the step of (g), a fifth wiring is formed on the second interlayer insulating film so as to connect to the plurality of third vias;

wherein, in the step of (h), also the fifth wiring is covered by the third interlayer insulating film, wherein, in the step of (i), a plurality of fourth vias is formed in the third interlayer insulating film so as to connect to the fifth wiring;

wherein, in the step of (j), a sixth wiring is formed on the third interlayer insulating film so as to connect to the plurality of fourth vias;

wherein, in the step of (k), also the sixth wiring is covered by the protective film;

wherein, in the step of (l), a second opening is formed in the protective film on the sixth wiring so as to expose a part of the sixth wiring, wherein a part of the sixth wiring exposed in the second opening composes a second pad for connecting to a second external connection member;

wherein, at a position overlapping with the second pad in plan view, a plurality of third slits going through the fourth wiring is provided in the fourth wiring; and wherein, at a position overlapping with the second pad in plan view, a plurality of fourth slits going through the fifth wiring is provided in the fifth wiring.

20. The method of manufacturing a semiconductor device according to claim 19, further comprising:

(q) between the steps of (a) and (b), forming a second MOSFET comprising:

a second gate insulating film formed on the upper surface of the semiconductor substrate;

a second gate electrode formed on the second gate insulating film; and a second source region and a second drain region formed in the semiconductor substrate, wherein the second pad is electrically connected to the second gate electrode, the second source region or the second drain region, and is formed at a position which does not overlap with the second MOSFET.

* * * * *